US009508750B2

(12) United States Patent
Hiwatashi et al.

(10) Patent No.: US 9,508,750 B2
(45) Date of Patent: Nov. 29, 2016

(54) THIN FILM TRANSISTOR SUBSTRATE AND METHOD FOR MANUFACTURING THE SAME

(71) Applicant: Mitsubishi Electric Corporation, Tokyo (JP)

(72) Inventors: Kyosuke Hiwatashi, Kumamoto (JP); Kazunori Inoue, Kumamoto (JP); Kouji Oda, Kumamoto (JP); Nobuaki Ishiga, Kumamoto (JP); Kensuke Nagayama, Kumamoto (JP); Naoki Tsumura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/552,860

(22) Filed: Nov. 25, 2014

(65) Prior Publication Data

US 2015/0162351 A1    Jun. 11, 2015

(30) Foreign Application Priority Data

Dec. 5, 2013  (JP) ................................. 2013-251616

(51) Int. Cl.
*H01L 27/12* (2006.01)
*H01L 29/66* (2006.01)
*H01L 21/47* (2006.01)

(52) U.S. Cl.
CPC ............ *H01L 27/124* (2013.01); *H01L 21/47* (2013.01); *H01L 27/1225* (2013.01); *H01L 27/1288* (2013.01); *H01L 29/66969* (2013.01)

(58) Field of Classification Search
None
See application file for complete search history.

(56) References Cited

U.S. PATENT DOCUMENTS 3,798,508 A * 3/1974 Kohashi ................. H01L 21/00
                                                             257/312
7,061,014 B2    6/2006 Hosono et al.
(Continued)

FOREIGN PATENT DOCUMENTS

JP    2004-103957 A    4/2004
JP    2007-281409 A    10/2007
(Continued)

OTHER PUBLICATIONS

Kenji Nomura et al.; "Room-temperature fabrication of transparent flexible thin-film transistors using amorphous oxide semiconductors"; Nature; vol. 432 (2004); p. 488-492.

*Primary Examiner* — Matthew Reames
*Assistant Examiner* — Steven B Gauthier
(74) *Attorney, Agent, or Firm* — Studebaker & Brackett PC

(57) ABSTRACT

A gate wiring, a source electrode, a source-electrode connecting wiring, a pixel electrode, a gate-terminal extraction electrode, and a source-terminal extraction electrode are formed in the same layer on a planarization insulating film. The gate wiring is connected to a gate electrode through a gate-electrode-portion contact hole. The source electrode is connected to a semiconductor film through a source-electrode-portion contact hole. The source-electrode connecting wiring is connected to the semiconductor film and a source wiring through the source-electrode-portion contact hole and a source-wiring-portion contact hole, respectively. The pixel electrode is connected to the semiconductor film through a drain (pixel)-electrode-portion contact hole.

11 Claims, 61 Drawing Sheets

(56) References Cited

U.S. PATENT DOCUMENTS

| | | |
|---|---|---|
| 8,023,088 B2 | 9/2011 | Nakao |
| 2009/0147165 A1* | 6/2009 | Kim .................... H01L 27/124 349/39 |
| 2009/0189153 A1 | 7/2009 | Iwasaki et al. |
| 2013/0032827 A1* | 2/2013 | Moon .............. G02F 1/136286 257/88 |
| 2014/0070211 A1 | 3/2014 | Iwasaki et al. |

FOREIGN PATENT DOCUMENTS

| | | |
|---|---|---|
| JP | 2009-128397 A | 6/2009 |
| JP | 2009-133954 A | 6/2009 |
| JP | 2009-151285 A | 7/2009 |

* cited by examiner

F I G. 5 2
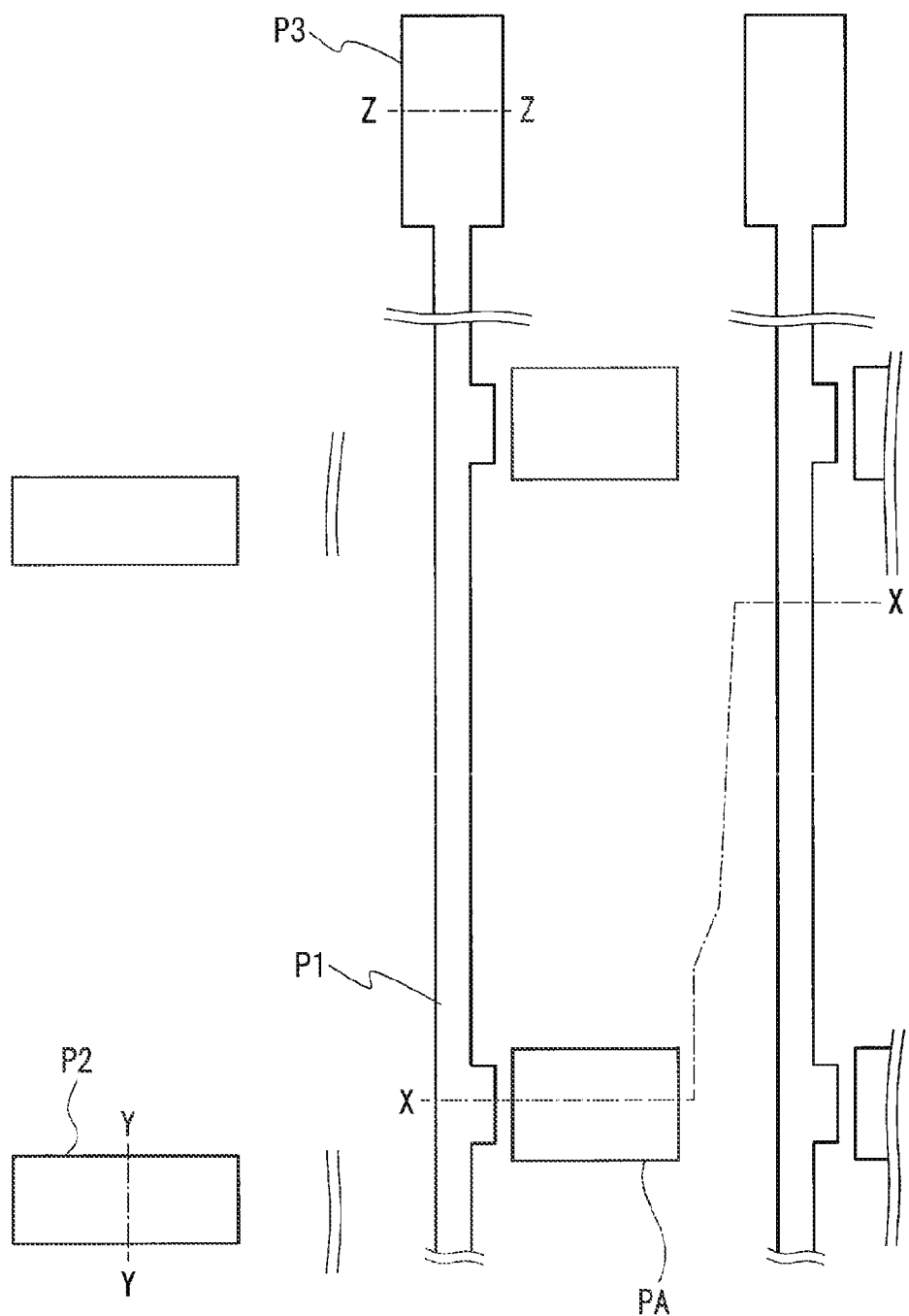

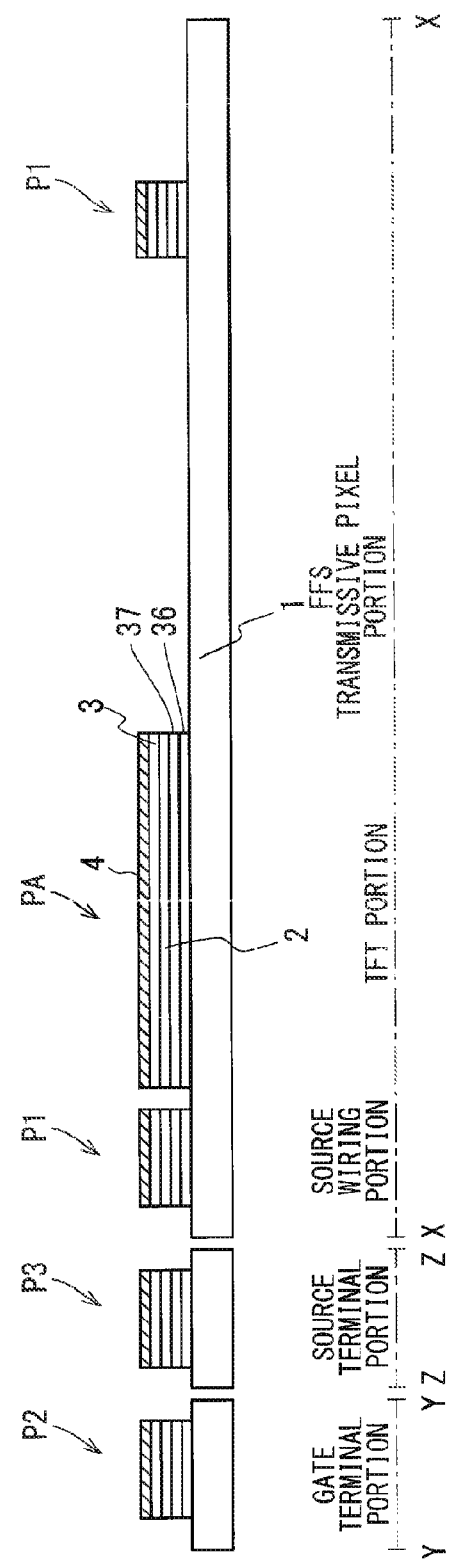

F I G. 56
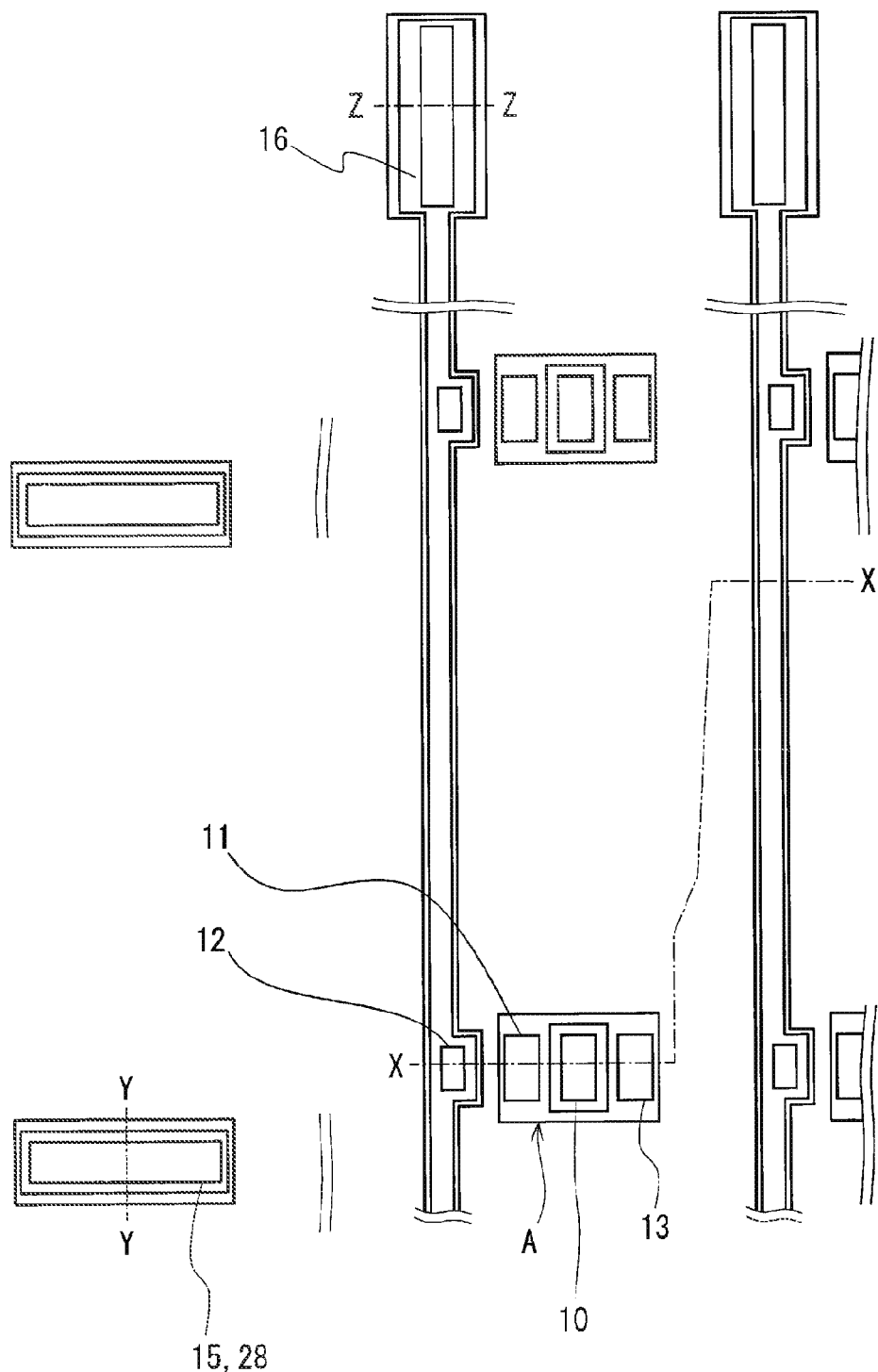

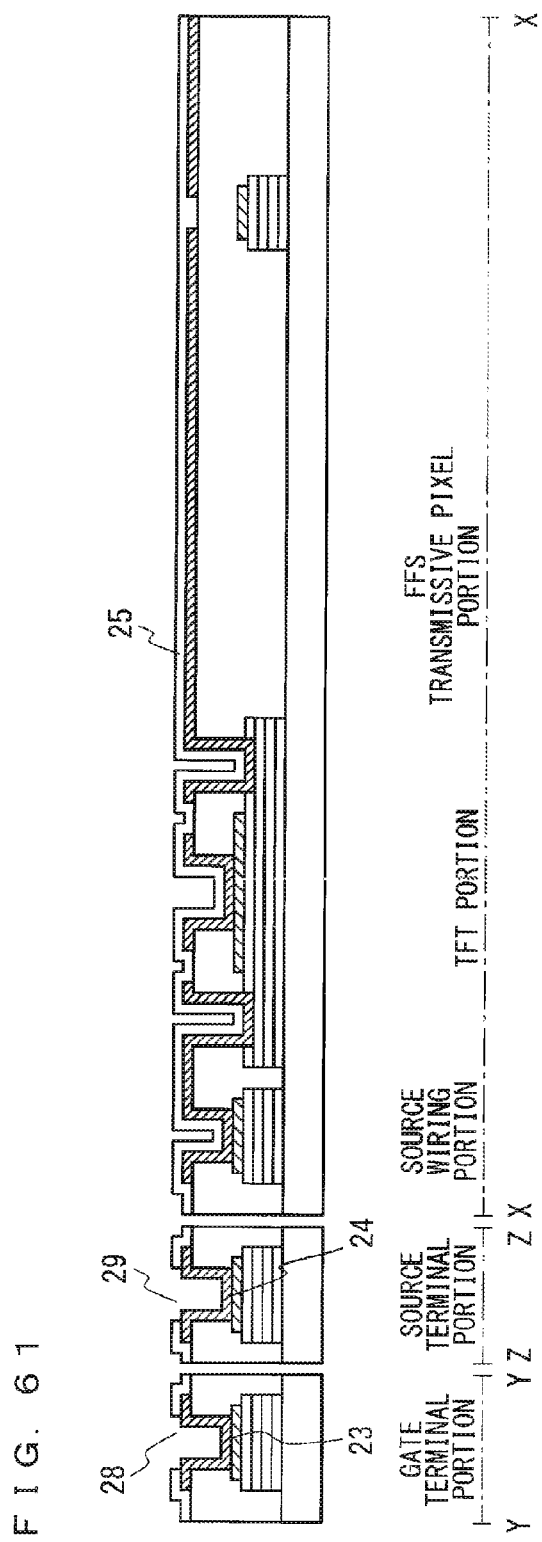

THIN FILM TRANSISTOR SUBSTRATE AND METHOD FOR MANUFACTURING THE SAME

BACKGROUND OF THE INVENTION

Field of the Invention

The present invention relates to a TFT active matrix substrate (hereinafter referred to as "TFT substrate") in a liquid crystal display that employs the fringe field switching (FFS) mode in which liquid crystals are held between the TFT substrate including a thin film transistor (TFT) as a switching device and a counter substrate and to a method for manufacturing the TFT substrate.

Description of the Background Art

Generally, the display modes of liquid crystal displays are broadly divided into the twisted nematic (TN) mode and the transverse electric field mode typified by the in-plane switching (IPS) mode (IPS is a registered trademark) and the FFS mode. The liquid crystal displays in the transverse electric field mode have the feature of providing the wide viewing angle and the high contrast.

The IPS mode is a display mode in which displaying is performed by applying a transverse electric field onto the liquid crystals sandwiched between opposed substrates. The pixel electrodes and the common electrodes onto which the transverse electric field is applied are provided in the same layer. Thus, liquid crystal molecules positioned right above the pixel electrodes cannot be sufficiently driven, which reduces the transmittance.

In the FFS mode, meanwhile, the pixel electrodes and the common electrodes are disposed on the insulating film (planarization insulating film) that has been leveled, being opposed to one another via the interlayer insulating film. Thus, an oblique field (fringe field) is generated, allowing the transverse electric field to be applied onto the liquid crystal molecules including the ones right above the pixel electrodes, so that the liquid crystal molecules can be sufficiently driven. Therefore, the FFS mode provides a transmittance higher than that of the IPS mode.

In recent years, the liquid crystal displays are required to attain a higher aperture ratio and a further reduction in power consumption. Thus, the FFS-mode TFT substrate that includes a thick planarization insulating film is proposed in, for example, Japanese Patent Application Laid-Open No. 2009-128397, Japanese Patent Application Laid-Open No. 2009-133954, and Japanese Patent Application Laid-Open No. 2009-151285.

That is, in the FFS-mode TFT substrate described above, a thick planarization film is formed above the common wirings, the source wirings, and the TFT elements, whereby the parasitic capacitance of each signal line is reduced, which can suppress the power consumption. Moreover, the upper surface of the TFT substrate can be planarized by burying the steps caused by the respective wirings. This can eliminate the irregularities in the liquid crystal alignment that have been generated in the step portion, reducing the region that does not contribute to the displaying. The aperture ratio is thus improved. Furthermore, the pixel electrodes and the signal lines are disposed to be apart from each other, to thereby eliminate the effects of electric fields generated by the signal line. Thus, the pixel electrodes can be formed to overlap the signal lines. Consequently, the pixel electrodes are extended, whereby the pixel aperture ratio can be increased.

In the liquid crystal display including the FFS-mode TFT substrate, the liquid crystals are driven by the fringe field generated between the pixel electrodes (or the counter electrodes) that are provided in the upper layer and have slits and the counter electrodes (or the pixel electrodes) disposed in the layer below the pixel electrodes via the interlayer insulating film. In this configuration, the pixel electrodes and the counter electrodes are formed of a transparent conductive film based on an oxide such as indium tin oxide (ITO) containing indium oxide and tin oxide or InZnO containing indium oxide and zinc oxide, so that the pixel aperture ratio can be prevented from decreasing.

The pixel electrodes and the counter electrodes form the storage capacitance. Therefore, unlikely to the liquid crystal displays in the TN mode, the pattern of the storage capacitance does not need to be separately formed in the pixels. Thus, a high pixel aperture ratio can be provided.

In the switching device of the TFT substrate for the liquid crystal displays, amorphous silicon (Si) has been generally used as the channel layer of the semiconductor. The main reasons for this are as follows. Amorphous silicon, owing to its amorphousness, can be formed into a film having excellent uniformity of properties even on a large-area substrate. In addition, amorphous silicon can be formed into a film at a relatively low temperature. Thus, the film can be formed even on the low-priced glass substrate that has poor heat resistance. Therefore, amorphous silicon is well suited for the liquid crystal displays for use in the common televisions.

Meanwhile, in recent years, the development has been increasingly proceeding in the TFT elements including an oxide semiconductor as the channel layer. An amorphous-state film having excelling uniformity can be stably provided by optimizing the composition of the oxide semiconductor. Moreover, the oxide semiconductor has the mobility higher than that of the conventional amorphous silicon, thus being advantageous in providing small-sized and high-performance TFT elements. Therefore, the oxide semiconductor film is advantageous in providing a FFS-mode TFT substrate that has a higher pixel aperture ratio if the film is used in the TFT element of the FFS-mode TFT substrate that includes the planarization insulating film as described above.

As such an oxide semiconductor, the materials based on zinc oxide (ZnO) or the materials formed of zinc oxide containing gallium oxide ($Ga_2O_3$), indium oxide ($In_2O_3$), tin oxide ($SnO_2$), and the like are mainly used. This technique is disclosed in, for example, Japanese Patent Application Laid-Open No. 2004-103957, Japanese Patent Application Laid-Open No. 2007-281409, and Kenji Nomura, et al., "Room-temperature fabrication of transparent flexible thin-film transistors using amorphous oxide semiconductors," Nature, no. 432 (2004): 488-492.

In manufacturing the FFS structure including the above-mentioned planarization insulating film, a number of photolithography processes for forming patterns using a photomask are required. This leads to a problem of increasing manufacturing costs.

The formation of the TFT substrate including the TFT having a bottom-gate structure disclosed in, for example, Japanese Patent Application Laid-Open No. 2009-128397, Japanese Patent Application Laid-Open No. 2009-133954, and Japanese Patent Application Laid-Open No. 2009-151285 requires at least seven photography processes of: (1) patterning for forming a gate electrode; (2) patterning for forming a semiconductor layer; (3) patterning for forming a source electrode and a drain electrode; (4) forming a contact hole in a planarization insulating film; (5) patterning for forming a lower-layer electrode; (6) forming a contact hole in a protective insulating film; and (7) patterning for forming an upper-layer electrode.

SUMMARY OF THE INVENTION

The present invention has an object to provide a TFT active matrix substrate (TFT substrate) that allows for a reduction in the number of photolithography processes required for the manufacturing of the TFT substrate for a liquid crystal display having a structure in which common electrodes and pixel electrodes are located on a planarization insulating film and to provide a method for manufacturing the TFT substrate.

A thin film transistor substrate according to the present invention is a thin film transistor substrate including a matrix of a plurality of pixels. Each of the plurality of pixels includes: a semiconductor film located on a plurality of portions of a substrate; a thin film transistor that includes at least a gate insulating film and a gate electrode, the gate insulating film being located on a first portion of the semiconductor film on the substrate and being formed of a first insulating film, the gate electrode being located on the gate insulating film and being formed of a first conductive film; a source wiring that is formed of the first conductive film and is formed on laminated films of the semiconductor film and the first insulating film; a second insulating film covering the thin film transistor and the source wiring; a source-electrode-portion contact hole and a drain-electrode-portion contact hole that penetrate the second insulating film in a thickness direction and penetrate the gate insulating film in the thickness direction to reach the first portion of the semiconductor film; a gate-electrode-portion contact hole that penetrates the second insulating film in the thickness direction to reach the gate electrode; a source-wiring-portion contact hole that penetrates the second insulating film in the thickness direction to reach the source wiring; a source electrode connected to the semiconductor film through the source-electrode-portion contact hole, the source electrode being formed of a second conductive film; a source-electrode connecting wiring that extends from the source electrode and is connected to the source wiring through the source-wiring-portion contact hole, the source-electrode connecting wiring being formed of the second conductive film; a drain electrode connected to the semiconductor film through the drain-electrode-portion contact hole, the drain electrode being formed of the second conductive film; a gate wiring connected to the gate electrode through the gate-electrode-portion contact hole, the gate wiring being formed of the second conductive film; a pixel electrode that extends from the drain electrode and covers the second insulating film corresponding to a pixel region defined by the source wiring and the gate wiring, the pixel electrode being formed of the second conductive film; a third insulating film that covers an entire upper surface of the substrate including the second insulating film; and a counter electrode located to be opposed to the pixel electrode via the third insulating film lying therebetween, the counter electrode being formed of a third conductive film. The counter electrode has a plurality of slits provided across an entire surface thereof.

The above-mentioned TFT substrate allows for the manufacturing of the FFS-mode TFT active matrix substrate including a planarization insulating film through six photolithography processes, so that a FFS-mode liquid crystal display having a high aperture ratio can be manufactured with increased productivity and reduced cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 52 is a plan view showing a method for manufacturing the TFT substrate according to the third preferred embodiment of the present invention;

FIG. 53 is a cross-sectional view showing the method for manufacturing the TFT substrate according to the third preferred embodiment of the present invention;

FIG. 56 is a plan view showing the method for manufacturing the TFT substrate according to the third preferred embodiment of the present invention;

FIG. 61 is a cross-sectional view showing the method for manufacturing the TFT substrate according to the third preferred embodiment of the present invention;

DESCRIPTION OF THE PREFERRED EMBODIMENTS

<First Preferred Embodiment>
<Configuration of Pixel of TFT Substrate>

Figure 1:
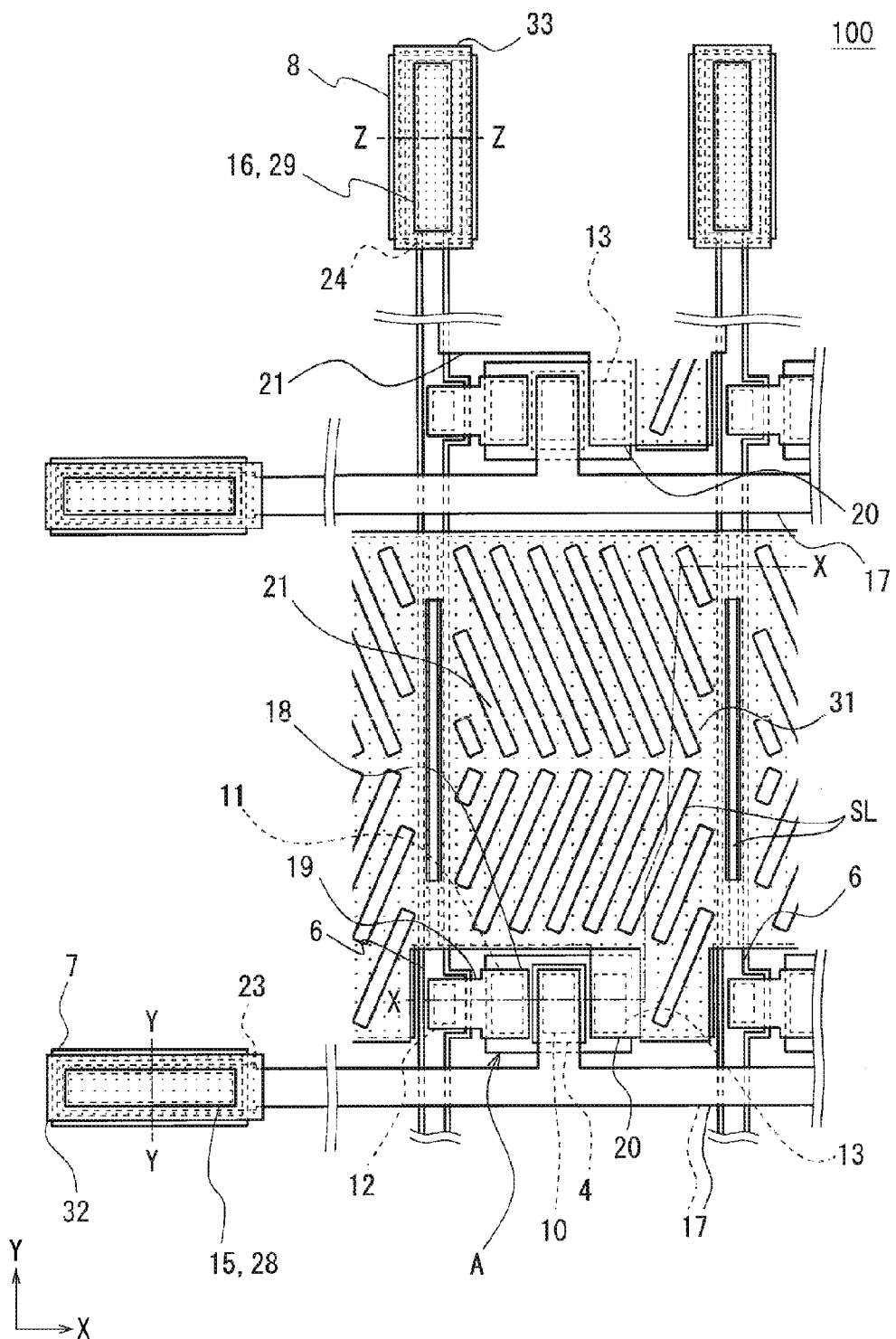
FIG. 1 is a plan view showing a configuration of a TFT substrate according to a first preferred embodiment of the present invention.
Figure 2:
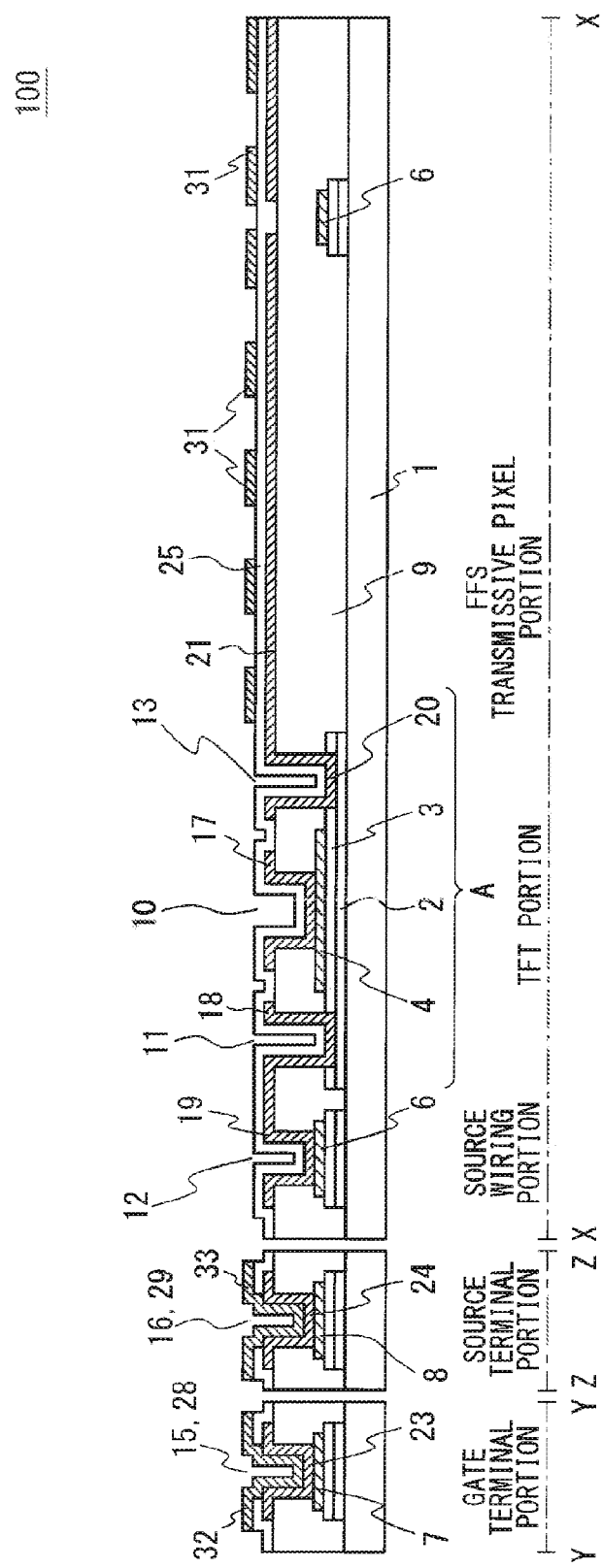
FIG. 2 is a cross-sectional view showing the configuration of the TFT substrate according to the first preferred embodiment of the present invention.

Firstly, with reference to FIGS. 1 and 2, a configuration of a TFT substrate 100 according to a first preferred embodiment is described. Although the present invention relates to the TFT substrate, the configuration of a pixel is particularly distinctive thereof. Therefore, the configuration of the pixel is described below. FIG. 1 is a plan view showing a planar configuration of the pixel according to the first preferred embodiment. FIG. 2 is a cross-sectional view showing a cross-sectional configuration taken along the line X-X in FIG. 1 (cross-sectional configurations of a source wiring portion, a TFT portion, and a FFS transmissive pixel portion), a cross-sectional configuration taken along the line Y-Y in FIG. 1 (a cross-sectional configuration of a gate terminal portion), and a cross-sectional configuration taken along the line Z-Z in FIG. 1 (a cross-sectional configuration of a source terminal portion). The description below is given assuming that the TFT substrate 100 is used for a transmissive liquid crystal display in the FFS mode.

As shown in FIG. 1, in the TFT substrate 100, a plurality of gate wirings 17 (scanning signal lines) and a plurality of source wirings 6 (display signal lines) are located to perpendicularly intersect one another, a TFT element A is located near the point of intersection of both wirings, a gate electrode 4 of the TFT element A is connected to the gate wiring 17, a source electrode 18 of the TFT element A is connected to the source wiring 6, and a drain electrode 20 of the TFT element A is connected to a pixel electrode 21.

That is, in the TFT element A, the portion that diverges from the gate wiring 17 and extends to the formation region of the TFT element A (TFT portion) is connected to the gate electrode 4 through a gate-electrode-portion contact hole 10. The source electrode 18 is connected to a semiconductor film 2 through a source-electrode-portion contact hole 11 and a source-electrode connecting wiring 19 extending from the source electrode 18 is connected to the source wiring 6 through a source-wiring-portion contact hole 12. The drain electrode 20 is connected to the semiconductor film 2 through a drain (pixel)-electrode-portion contact hole 13 and the pixel electrode 21 is formed to extend from the drain electrode 20.

Note that the region surrounded by the adjacent gate wirings 17 and the adjacent source wirings 6 becomes a pixel region, so that the TFT substrate 100 has a configuration in which the pixel regions are arranged in matrix.

In FIG. 1, the gate wirings 17 are disposed to extend in the horizontal direction (X direction) and the source wirings 6 are disposed to extend in the vertical direction (Y direction).

One end of the gate wiring 17 is electrically connected to a gate terminal 7. Above the gate terminal 7, a gate-terminal-portion second contact hole 28 and a gate terminal pad 32 that is connected to the gate terminal 7 through the gate-terminal-portion second contact hole 28 are formed. One end of the source wiring 6 is connected to a source terminal 8. Above the source terminal 8, a source-terminal-portion second contact hole 29 and a source terminal pad 33 that is connected to the source terminal 8 through the source-terminal-portion second contact hole 29 are formed.

As show in FIG. 2, the TFT substrate 100 is formed on a transparent insulating substrate 1 made of, for example, glass. The TFT element A, the source wiring 6, the gate terminal 7, and the source terminal 8 are formed on the transparent insulating substrate 1.

In the TFT element A, the semiconductor film 2 and a gate insulating film 3 formed on the semiconductor film 2 are shaped into islands, having substantially the same contour pattern. The gate electrode 4 is formed on the gate insulating film 3. The planar pattern of the gate electrode 4 of the TFT element A is formed to be smaller than the planar pattern of the semiconductor film 2, so that the gate electrode 4 is located within the formation region of the semiconductor film 2. This configuration allows the TFT element to be easily provided only by connecting the source electrode 18 and the drain electrode 20 to the semiconductor film 2 outside the gate electrode 4.

The source wiring 6, the gate terminal 7, and the source terminal 8 have the same layered structure as that of the TFT element A. That is, the source wiring 6, the gate terminal 7, and the source terminal 8 are formed on the laminated films of the semiconductor film 2 and the gate insulating film 3, thereby forming a three-layer structure.

Then, a planarization insulating film 9 is formed to cover the patterns of the TFT element A, the source wiring 6, the gate terminal 7, and the source terminal 8 and has a plurality of contact holes formed therein. That is, the gate-electrode-portion contact hole 10, the source-wiring-portion contact hole 12, a gate-terminal-portion first contact hole 15, and a source-terminal-portion first contact hole 16 that penetrate the planarization insulating film 9 in the thickness direction are formed to expose the surfaces of the gate electrode 4, the source wiring 6, the gate terminal 7, and the source terminal 8, respectively.

Moreover, the source-electrode-portion contact hole 11 and the drain (pixel)-electrode-portion contact hole 13 that penetrate the planarization insulating film 9 and the gate insulating film 3 in the thickness direction are formed to expose the surface of the semiconductor film 2 in the TFT element A.

A conductive film is formed on the planarization insulating film 9. By patterning the conductive film, the gate wiring 17 that is connected to the gate electrode 4 through the gate-electrode-portion contact hole 10, a gate-terminal extraction electrode 23 that is connected to the gate terminal 7 through the gate-terminal-portion first contact hole 15, and a source-terminal extraction electrode 24 that is connected to the source terminal 8 through the source-terminal-portion first contact hole 16 are respectively formed.

From the same conductive film formed on the planarization insulating film 9, the source electrode 18 that is connected to the semiconductor film 2 through the source-electrode-portion contact hole 11 is formed. The source-electrode connecting wiring 19 extending from the source electrode 18 is connected to the source wiring 6 through the source-wiring-portion contact hole 12. Similarly, the drain electrode 20 that is connected to the semiconductor film 2 through the drain (pixel)-electrode-portion contact hole 13 is formed and the pixel electrode 21 is formed to extend from the drain electrode 20.

The region of the semiconductor film 2 that is sandwiched between the source electrode 18 and the drain electrode 20 and is located below the pattern of the gate electrode 4 becomes the channel region of the TFT element A.

An interlayer insulating film 25 is formed to cover the entire upper surface of the substrate including the batch of above-mentioned electrodes on the planarization insulating film 9. On the interlayer insulating film 25, a counter slit electrode 31 having a comb-teeth shape in which a plurality of slits SL are provided across the entire surface thereof is formed to be opposed to the pixel electrode 21 that has a flat plate shape and becomes a lower electrode.

As shown in FIG. 1, the pixel electrode 21 and the counter slit electrode 31 are disposed to substantially cover the entire pixel region surrounded by two gate wirings 17 and two source wirings 6. As shown in FIGS. 1 and 2, the counter slit electrode 31 is formed into, for example, a pattern that is continuous throughout the adjacent pixel regions astride the source wirings 6.

That is, the counter slit electrodes 31 of the TFT substrate 100 according to this preferred embodiment are formed into a pattern that is continuous across the pixels in the entire image display region of the TFT active matrix substrate. Outside the image display region, the counter slit electrodes 31 are connected to signal wirings (not shown) formed in the peripheral region (frame region) of the image display region.

The interlayer insulating film 25 has the gate-terminal-portion second contact hole 28 and the source-terminal-portion second contact hole 29 formed therein. The gate-terminal-portion second contact hole 28 penetrates the interlayer insulating film 25 in the thickness direction to reach the surface of the gate-terminal extraction electrode 23. The source-terminal-portion second contact hole 29 penetrates the interlayer insulating film 25 in the thickness direction to reach the surface of the source-terminal extraction electrode 24. The gate terminal pad 32 connected to the gate-terminal extraction electrode 23 through the contact hole 28 and the source terminal pad 33 connected to the source-terminal extraction electrode 24 through the contact hole 29 are formed.

In this configuration, predetermined signals can be respectively given to the gate electrode 4 and the source electrode 18.

The gate terminal pad 32 and the source terminal pad 33 are formed of the same conductive film as the counter slit electrode 31 formed on the interlayer insulating film 25.

<Manufacturing Method>

With reference to FIGS. 3 to 12, a method for manufacturing the TFT substrate 100 according to the first preferred embodiment is described below. The plan view and the cross-sectional view showing the final process correspond to FIG. 1 and FIG. 2, respectively.

Firstly, on the entire upper surface of the transparent insulating substrate 1 made of, for example, glass, a semiconductor film, an insulating film, and a conductive film are formed in the stated order. In the first preferred embodiment, an InGaZnO-based oxide semiconductor formed of indium oxide ($In_2O_3$) containing gallium oxide ($Ga_2O_3$) and zinc oxide (ZnO) is used as the semiconductor film. An silicon oxide (SiO) film is used as the insulating film and molybdenum (Mo), which is metal, is used as the conductive film.

More specifically, a semiconductor film is firstly formed by the DC sputtering method using an InGaZnO target $[In_2O_3.(Ga_2O_3).(ZnO)_2]$ in which the atomic composition ratio of In:Ga1:Zn:O is 1:1:1:4. When the sputtering method using argon (Ar) gas or krypton (Kr) gas that is commonly known is employed, the atomic composition ratio of oxygen is usually smaller than the stoichiometry, whereby an oxide film in an oxygen-ion deficient state (in which the composition ratio of O is less than 4 in the above example) is formed. Thus, Ar gas mixed with oxygen ($O_2$) gas is desirably used for sputtering. Here, a sputtering was performed using Ar gas containing $O_2$ gas mixed at 10% by partial pressure ratio, whereby an InGaZnO-based oxide semiconductor film was formed to have a thickness of 40 nm. The oxide semiconductor film functions as the semiconductor film 2 in the TFT element A. The In—Ga—Zn—O film immediately after formation had an amorphous structure.

Next, an insulating film composed of SiO is formed by the plasma chemical vapor deposition (CVD) method using silane ($SiH_4$) gas and dinitrogen oxide ($N_2O$) gas. The insulating film functions as the gate insulating film 3 in the TFT element.

Subsequently, a conductive film composed of Mo is formed to have a thickness of 200 nm by the DC sputtering method using a Mo target. At this time, Ar gas or Kr gas that is commonly known is used as a sputtering gas.

Next, in the first photolithography process, a pattern that later becomes the TFT element A and patterns that later become the source wiring 6, the gate terminal 7, and the source terminal 8 are formed.

Specifically, a photoresist pattern is formed on the laminated films of the semiconductor film, the insulating film, and the conductive film in the photolithography process, and then, the Mo film located in the top layer is firstly etched to be patterned using the photoresist pattern as a mask by wet etching in which a mixed acid (hereinafter referred to as PAN solution) including phosphoric acid, acetic acid, and nitric acid is used.

Next, the insulating film (SiO film) is etched to be patterned using the photoresist pattern and the patterned Mo film as a mask by dry etching in which oxygen ($O_2$) gas and a gas containing fluorine such as $CHF_3$ and $CF_4$ are used.

Subsequently, the semiconductor film (InGaZnO-based oxide semiconductor film) is etched to be patterned using the photoresist pattern and the patterned Mo film and the patterned SiO film as a mask by wet etching in which a solution (hereinafter referred to as oxalic-acid based solution) mainly composed of oxalic acid (carboxylic acid) is used.

Figure 3:
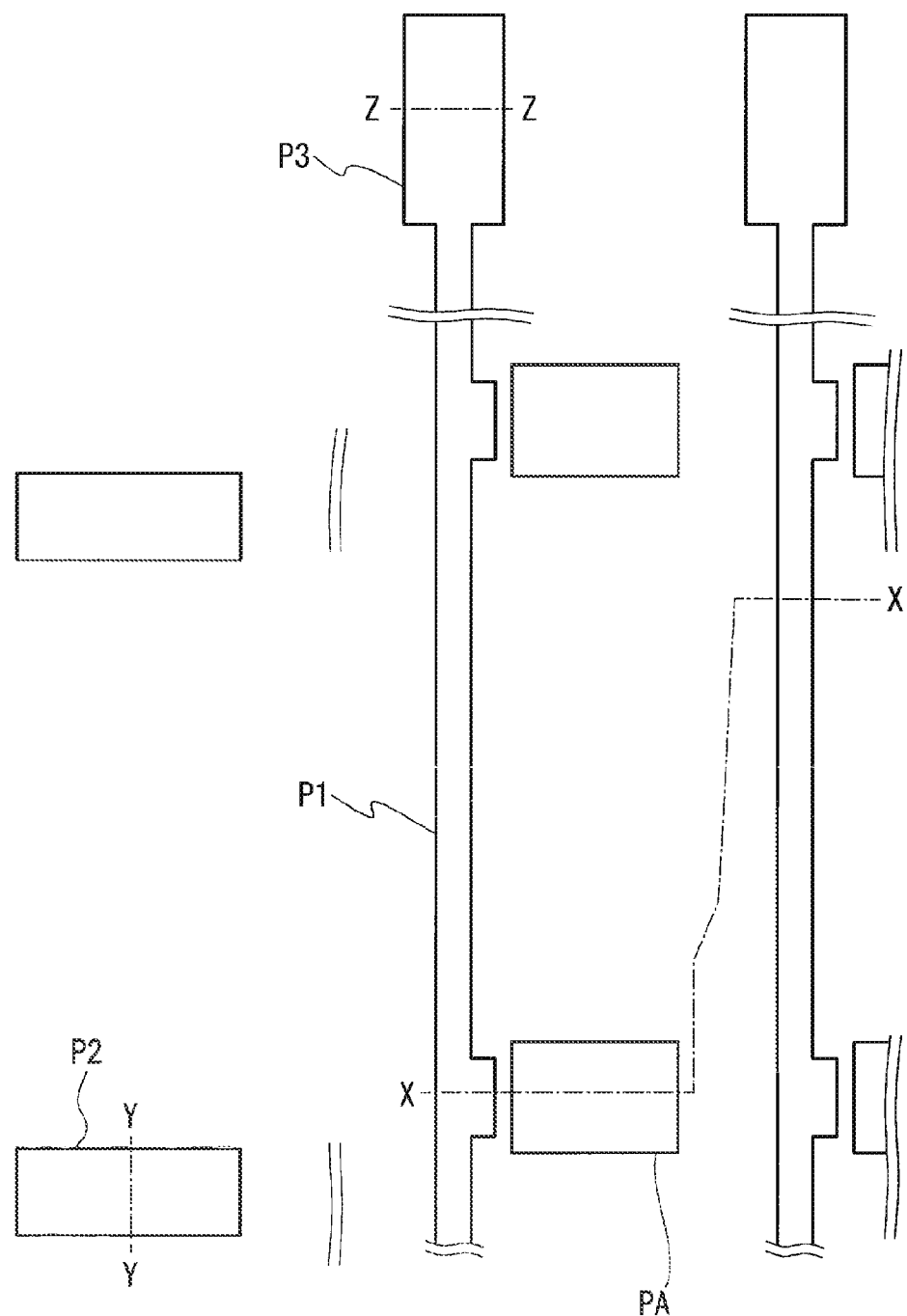
FIG. 3 is a plan view showing a method for manufacturing the TFT substrate according to the first preferred embodiment of the present invention.
Figure 4:
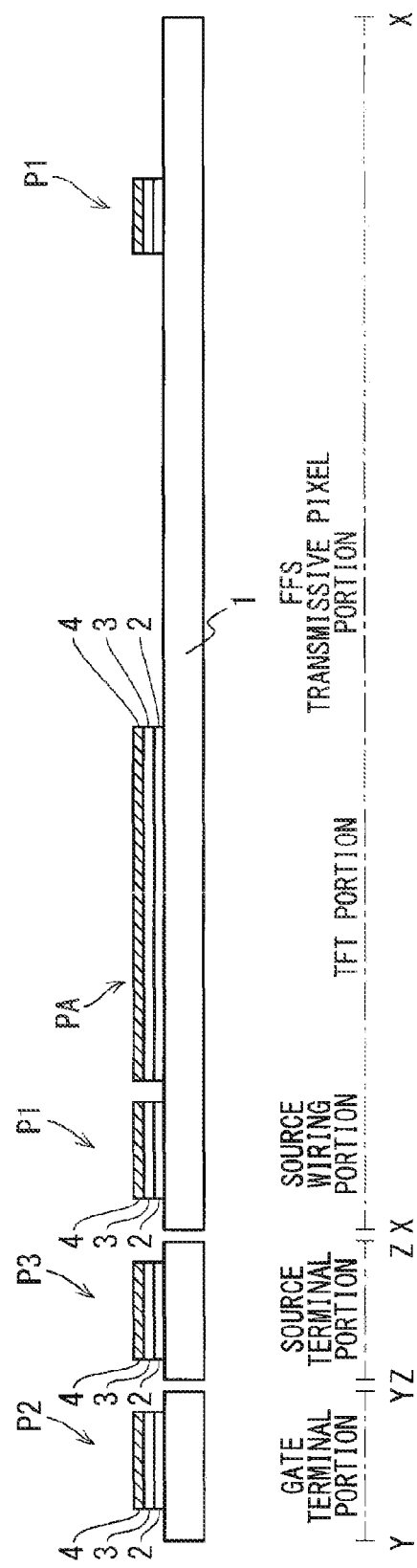
FIG. 4 is a cross-sectional view showing the method for manufacturing the TFT substrate according to the first preferred embodiment of the present invention.

After that, the photoresist pattern is removed, to thereby form, as shown in FIGS. 3 and 4, a pattern PA that later becomes the TFT element A and patterns P1, P2, and P3 that later become the source wiring 6, the gate terminal 7, and the source terminal 8, respectively. FIG. 3 is a plan view corresponding to FIG. 1 and FIG. 4 is a cross-sectional view corresponding to FIG. 2.

Figure 5:
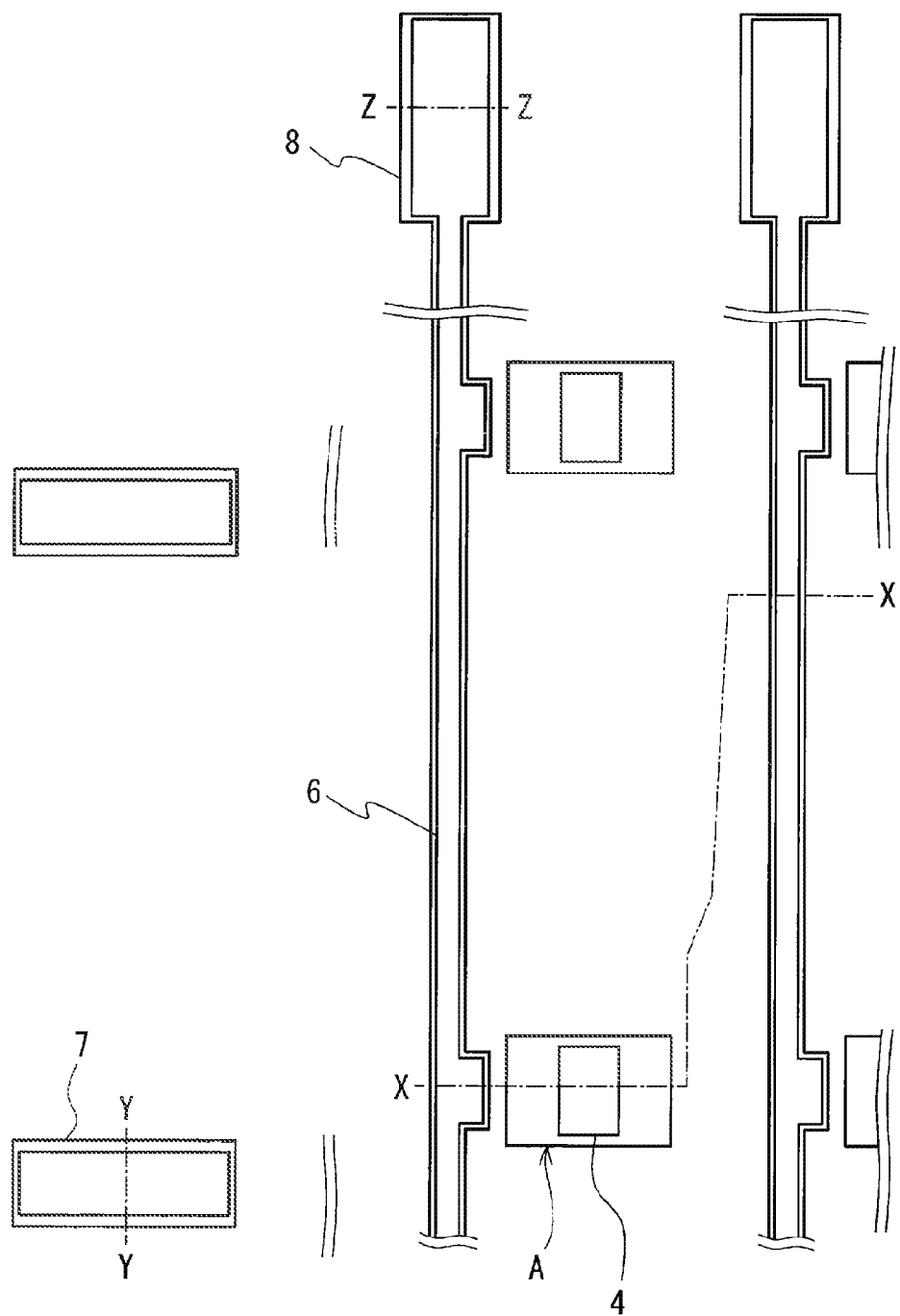
FIG. 5 is a plan view showing the method for manufacturing the TFT substrate according to the first preferred embodiment of the present invention.
Figure 6:
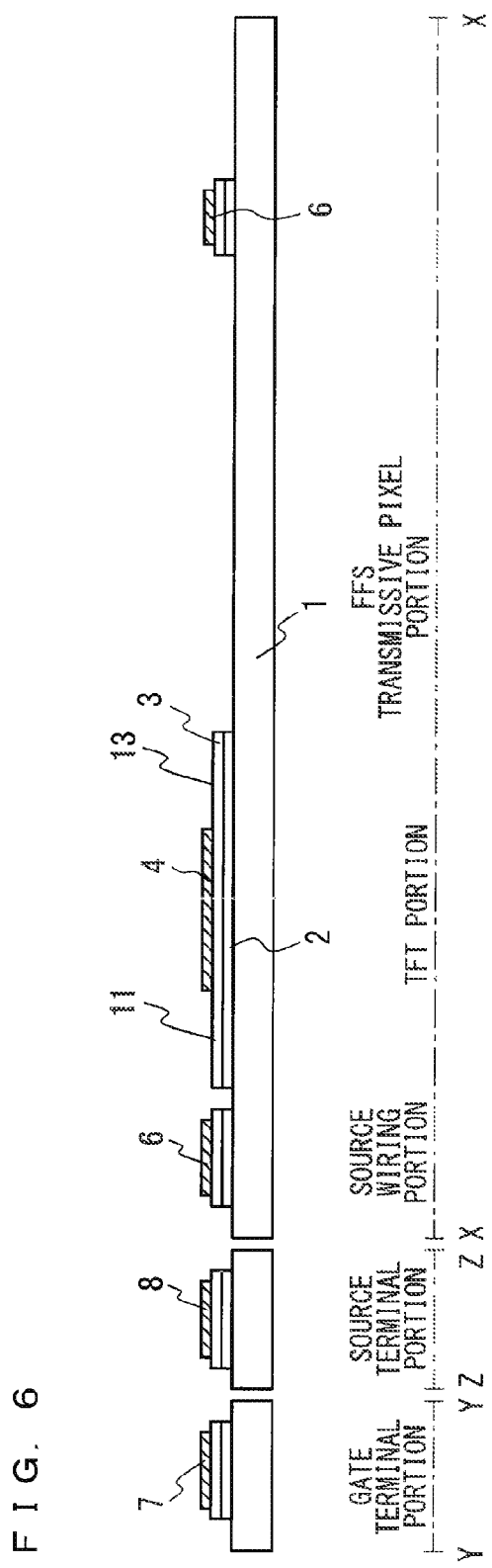
FIG. 6 is a cross-sectional view showing the method for manufacturing the TFT substrate according to the first preferred embodiment of the present invention.

Next, in the second photolithography process, a photoresist pattern is formed on the patterns PA, P1, P2, and P3, and then, the Mo film is etched to be patterned using the photoresist pattern as a mask by wet etching in which the PAN solution is used. After that, the photoresist pattern is removed. Consequently, as shown in FIGS. 5 and 6, the gate electrode 4 of the TFT element A, the source wiring 6, the gate terminal 7, and the source terminal 8 are obtained. FIG. 5 is a plan view corresponding to FIG. 1 and FIG. 6 is a cross-sectional view corresponding to FIG. 2.

Next, the planarization insulating film 9 is formed to cover the entire upper surface of the transparent insulating substrate 1 including the gate electrode 4, the source wiring 6, the gate terminal 7, and the source terminal 8 formed by patterning. Then, a plurality of contact holes are formed.

More specifically, for example, an acrylic organic resin material having photosensitivity is applied onto the transparent insulating substrate 1 to have a thickness of 2.0 to 3.0 µm by spin coating. Thus, the irregularities of the upper surface of the transparent insulating substrate 1 that have been formed in the previous processes are covered, whereby the surface can be leveled.

The planarization insulating film 9 may be made of an olefin-based material, a novolac-based material, a polyimide-based material, or a siloxane-based material aside from the acrylic organic resin material. These coating-type organic insulating materials have low dielectric constants, thus being capable of keeping the wiring capacitance low. The use of such a material enables the TFT substrate to be driven at low voltage, thereby contributing to a reduction in power consumption.

Subsequently, in the third photolithography process, the planarization insulating film 9 having photosensitivity is patterned for simultaneously forming the gate-electrode-portion contact hole 10, the source-electrode-portion contact hole 11, the source-wiring-portion contact hole 12, the drain (pixel)-electrode-portion contact hole 13, the gate-terminal-portion first contact hole 15, and the source-terminal-portion first contact hole 16.

Figure 7:
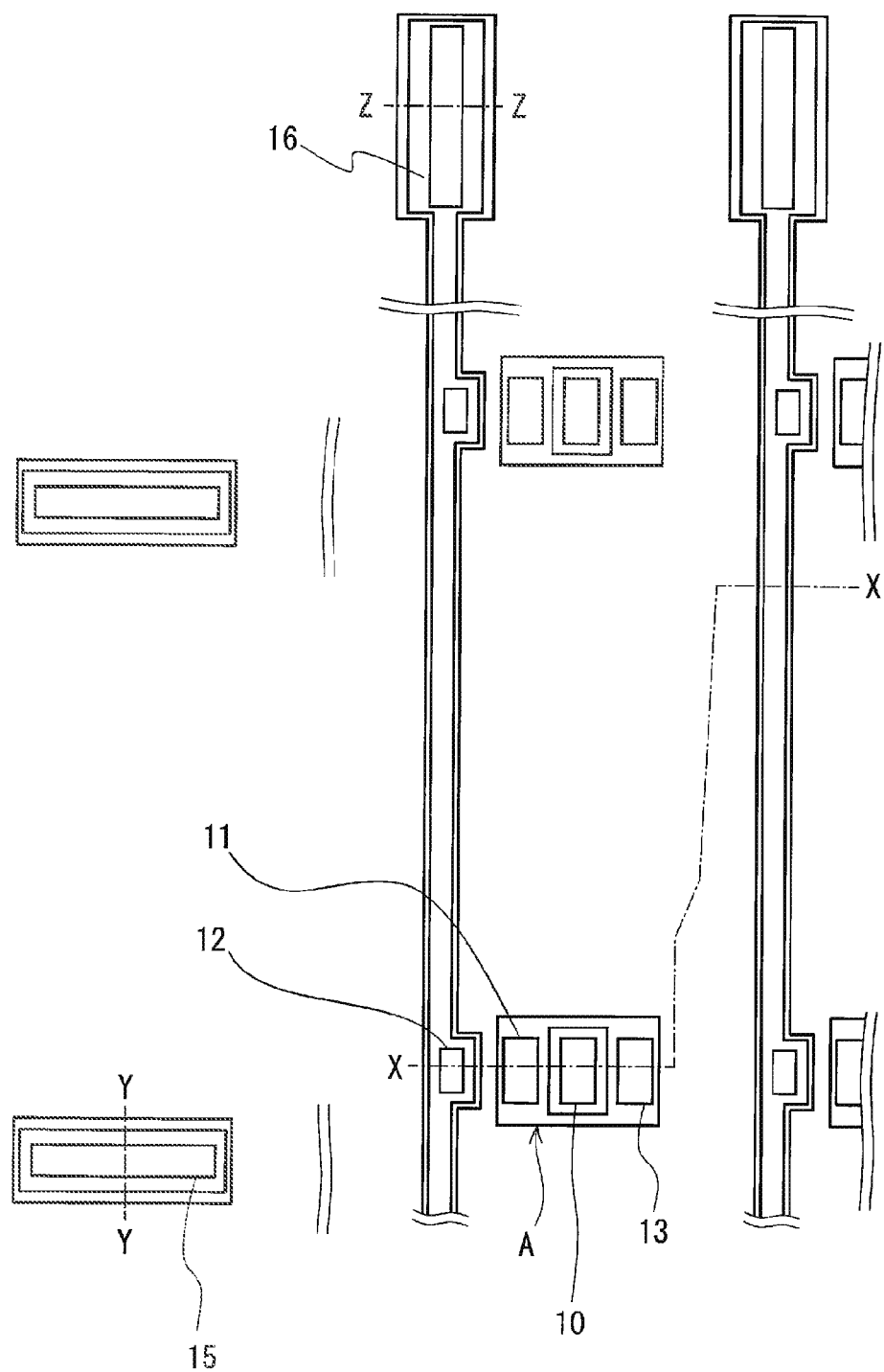
FIG. 7 is a plan view showing the method for manufacturing the TFT substrate according to the first preferred embodiment of the present invention.
Figure 8:
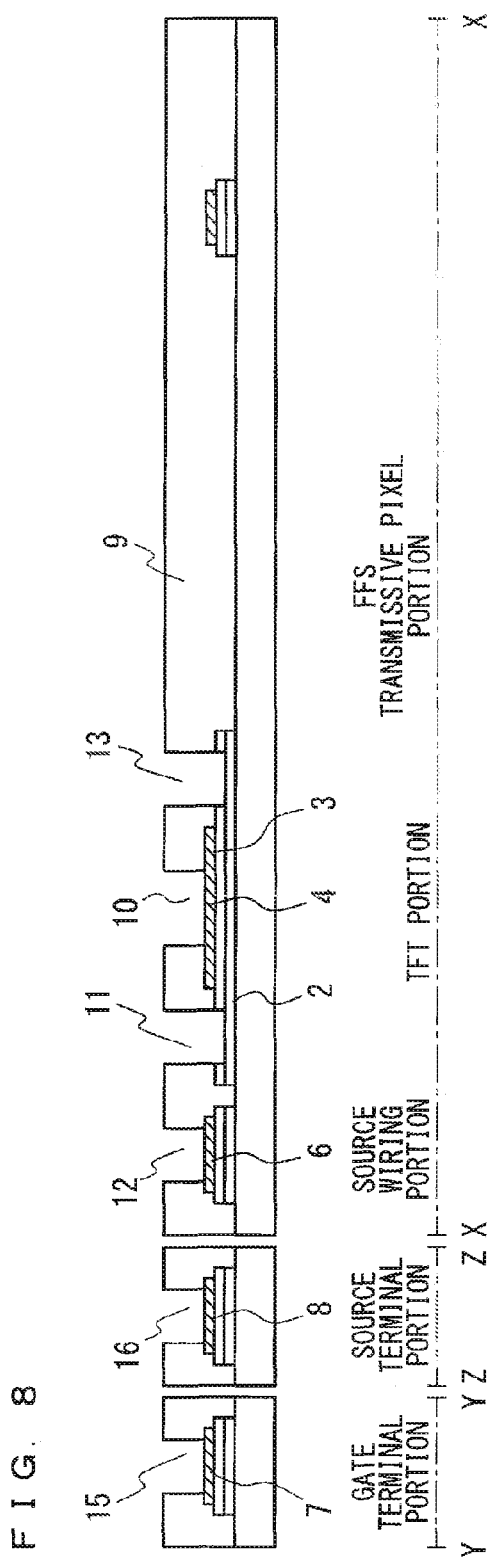
FIG. 8 is a cross-sectional view showing the method for manufacturing the TFT substrate according to the first preferred embodiment of the present invention.

At this time, the gate insulating film 3 is exposed through the bottom of the source-electrode-portion contact hole 11 and the drain (pixel)-electrode-portion contact hole 13. Then, only the exposed part of the gate insulating 3 is selectively etched using the planarization insulating film 9 as a mask, whereby the surface of the underlying semiconductor film 2 is exposed. Consequently, the source-electrode-portion contact hole 11 and the drain (pixel)-electrode-portion contact hole 13 that reach the semiconductor film 2 are completed. Thus, as shown in FIGS. 7 and 8, a plurality of contact holes that penetrate the planarization insulating film 9 in the thickness direction are obtained. The gate insulating film 3 composed of SiO can be etched by dry etching in which oxygen ($O_2$) gas and a gas containing fluorine such as $CHF_3$ and $CF_4$ are used. FIG. 7 is a plan view corresponding to FIG. 1 and FIG. 8 is a cross-sectional view corresponding to FIG. 8.

Next, a transparent conductive film is formed on the entire upper surface of the planarization insulating film 9 and a photoresist pattern is formed on the transparent conductive film in the fourth photolithography process. After that, the above-mentioned transparent conductive film is patterned using the photoresist pattern as a mask. Consequently, the gate wiring 17 connected to the gate electrode 4 through the gate-electrode-portion contact hole 10, the gate-terminal extraction electrode 23 connected to the gate terminal 7 through the gate-terminal-portion first contact hole 15, and the source-terminal extraction electrode 24 connected to the source terminal 8 through the source-terminal-portion first contact hole 16 are respectively formed.

At the same time, the source electrode 18 connected to the semiconductor film 2 through the source-electrode-portion contact hole 11 is formed. At this time, the source-electrode connecting wiring 19 is integrally formed with the source electrode 18. The source-electrode connecting wiring 19 is connected to the source wiring 6 through the source-wiring-portion contact hole 12.

Moreover, at the same time, the drain electrode 20 connected to the semiconductor film 2 through the drain (pixel)-electrode-portion contact hole 13 is also formed. At this time, the pixel electrode 21 that substantially covers the entire pixel region surrounded by two gate wirings 17 and two source wirings 6 is integrally formed with the drain electrode 20. The region of the semiconductor film 2 that is sandwiched between the source electrode 18 and the drain electrode 20 and is located below the pattern of the gate electrode 4 becomes the channel region of the TFT element A.

Figure 9:
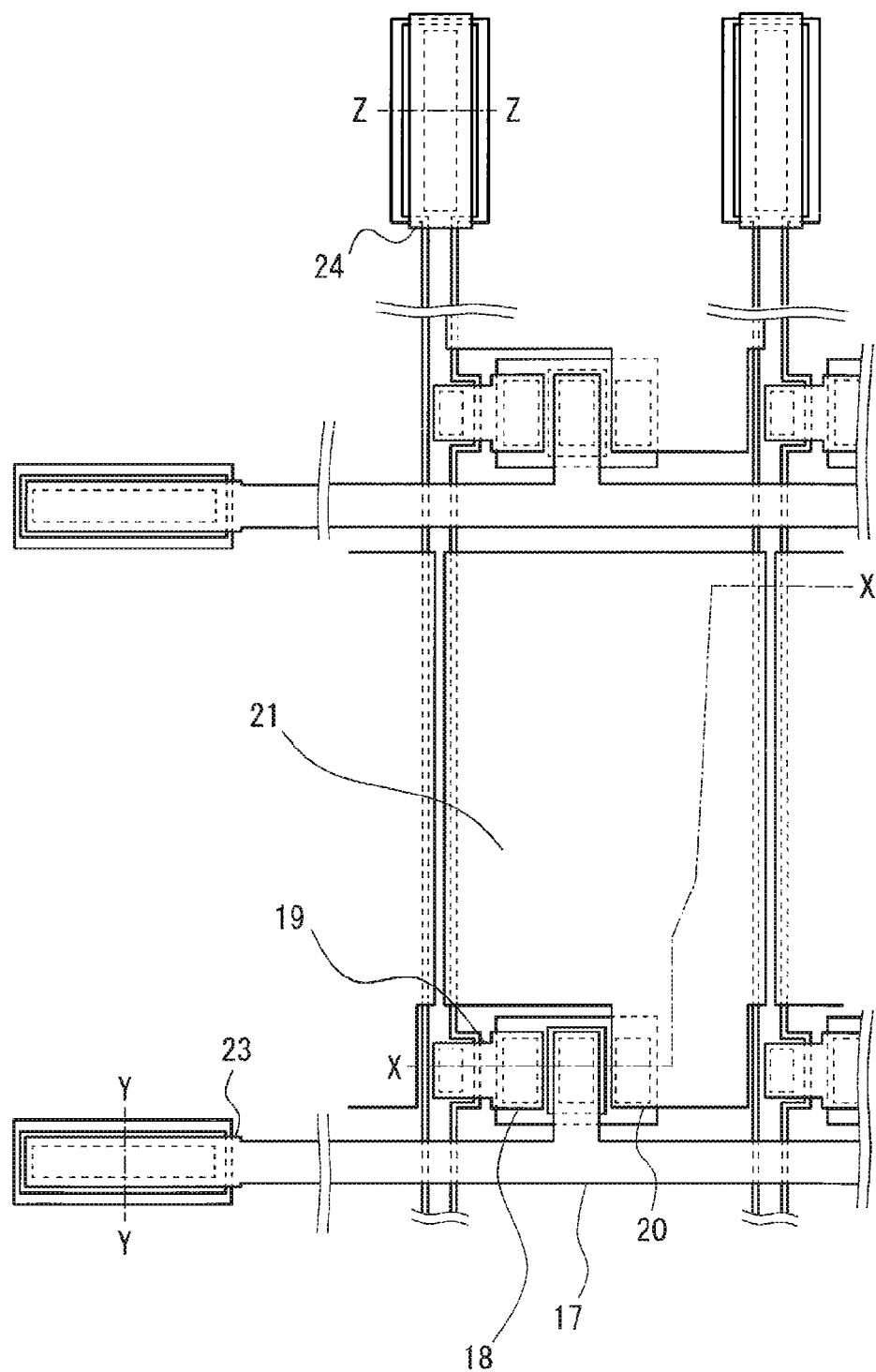
FIG. 9 is a plan view showing the method for manufacturing the TFT substrate according to the first preferred embodiment of the present invention.
Figure 10:
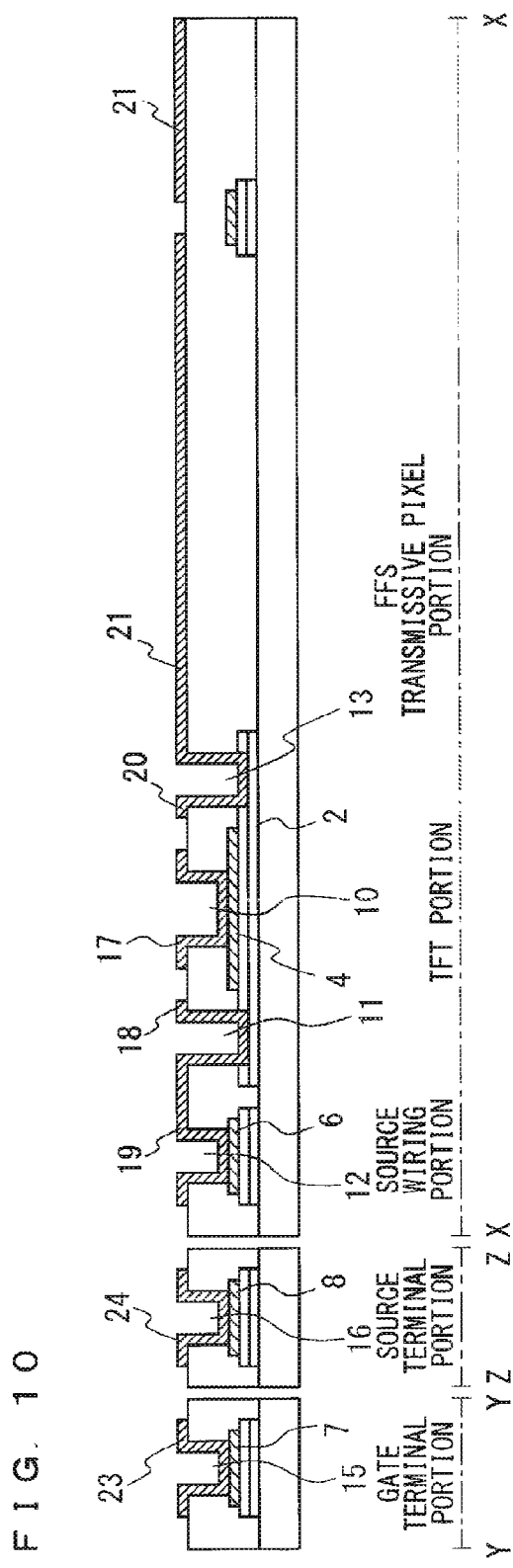
FIG. 10 is a cross-sectional view showing the method for manufacturing the TFT substrate according to the first preferred embodiment of the present invention.

More specifically, as the transparent conductive film, an InZnO film having a thickness of 100 nm is formed on the entire upper surface of the planarization insulating film 9 by the DC sputtering method in which an InZnO target containing indium oxide and zinc oxide is used. Then, the film is wet-etched with the oxalic-acid based solution using the photoresist pattern formed in the fourth photolithography process as a mask and is patterned into each of the above-mentioned electrodes and wirings. Consequently, as shown in FIGS. 9 and 10, the gate wiring 17, the source electrode 18, the source-electrode connecting wiring 19, the drain electrode 20, the pixel electrode 21, the gate-terminal extraction electrode 23, and the source-terminal extraction electrode 24 are obtained. FIG. 9 is a plan view corresponding to FIG. 1 and FIG. 10 is a cross-sectional view corresponding to FIG. 2.

Next, the interlayer insulating film 25 is formed to cover the entire upper surface of the transparent insulating substrate 1. More specifically, for example, a silicon nitride (SiN) film having a thickness of 200 to 400 nm is formed as the interlayer insulating film 25 by the plasma CVD method.

Figure 11:
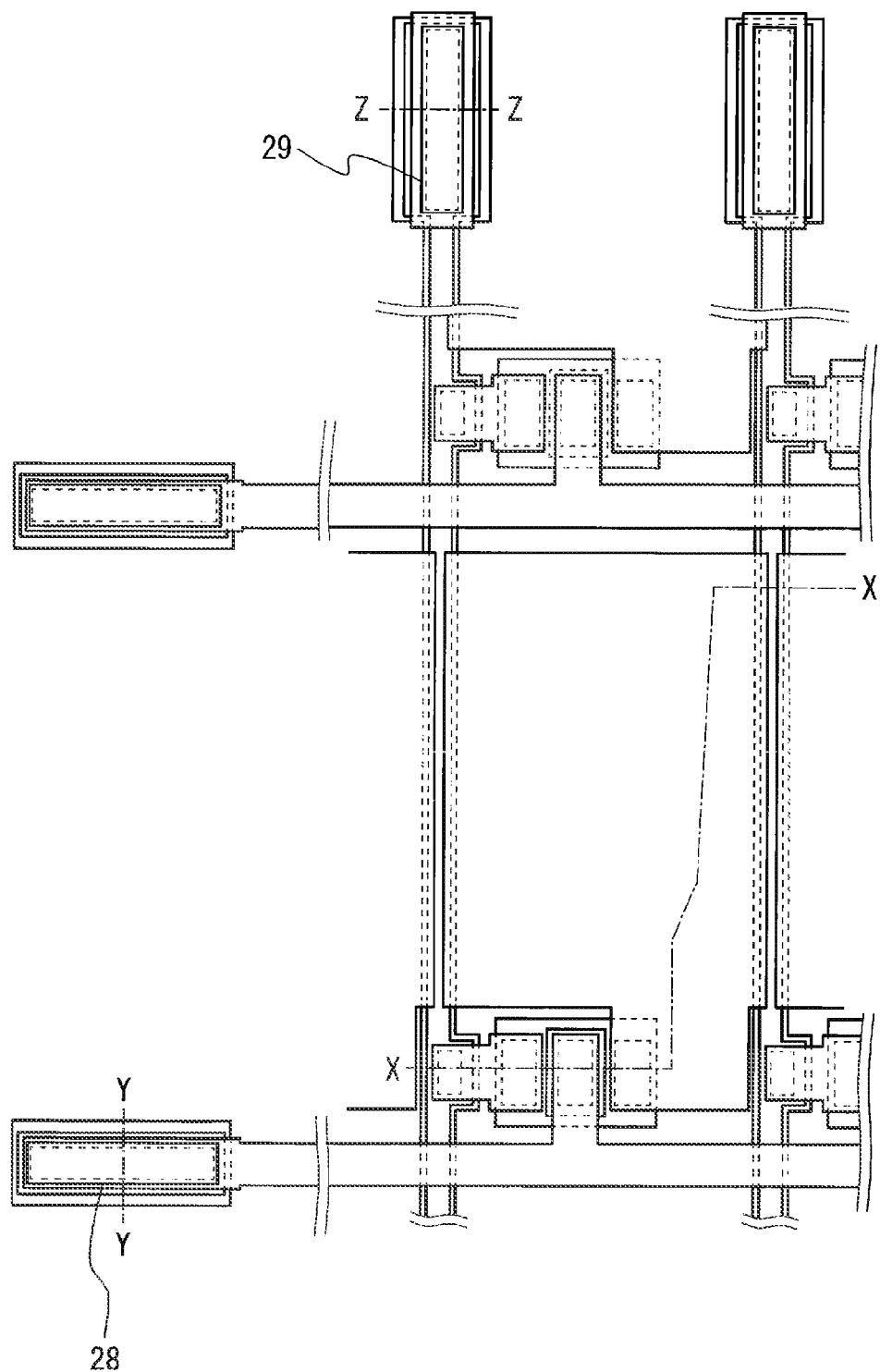
FIG. 11 is a plan view showing the method for manufacturing the TFT substrate according to the first preferred embodiment of the present invention.
Figure 12:
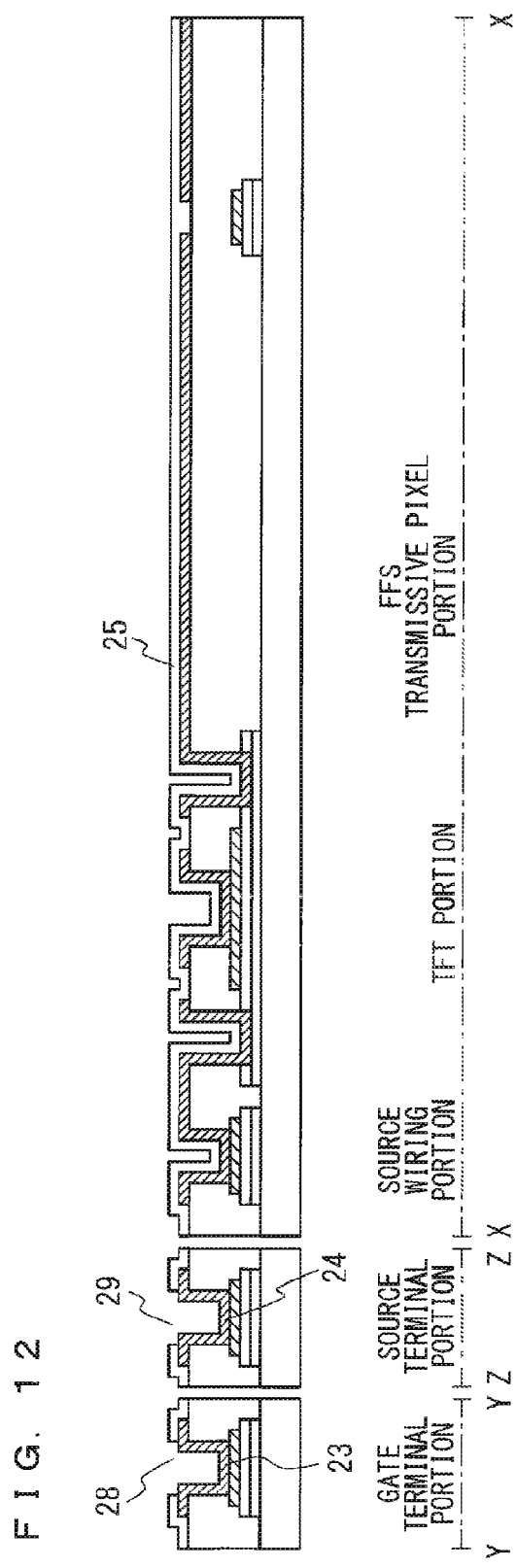
FIG. 12 is a cross-sectional view showing the method for manufacturing the TFT substrate according to the first preferred embodiment of the present invention.

Subsequently, a photoresist pattern is formed on the interlayer insulating film 25 in the fifth photolithography process. After that, the SiN film is etched using the photoresist pattern as a mask by dry etching in which $O_2$ gas and a gas containing fluorine such as $CF_4$ and $SF_6$ are used, and then, the photoresist pattern is removed. Consequently, as shown in FIGS. 11 and 12, the gate-terminal-portion second contact hole 28 that reaches the surface of the gate-terminal extraction electrode 23 and the source-terminal-portion second contact hole 29 that reaches the surface of the source-terminal extraction electrode 24 are obtained. FIG. 11 is a plan view corresponding to FIG. 1 and FIG. 12 is a cross-sectional view corresponding to FIG. 12.

Next, a transparent conductive film is formed on the entire upper surface of the interlayer insulating film 25 and a photoresist pattern is formed on the transparent conductive film in the sixth photolithography process. After that, the above-mentioned transparent conductive film is patterned using the photoresist pattern as a mask. Consequently, the counter slit electrode 31 having a comb-teeth shape in which the plurality of slits SL are provided across the entire surface thereof is formed. The counter slit electrode 31 is disposed to substantially cover the entire pixel region surrounded by two gate wirings 17 and two source wirings 6 such that the counter slit electrode 31 is opposed to the pixel electrode 21 that becomes the lower electrode.

Here, the counter slit electrode 31 is formed into a pattern that is continuous to the counter slit electrodes 31 in the adjacent pixel regions astride the source wirings 6. The counter slit electrodes 31 are formed into a pattern that is continuous across the pixels in the entire image display region of the TFT substrate 100. Outside the image display region, the counter slit electrodes 31 are connected to the signal wirings (not shown) formed in the frame region.

At the same time, by using the above-mentioned conductive film, the gate terminal pad 32 and the source terminal pad 33 are formed. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25.

More specifically, as the transparent conductive film, an InZnO film having a thickness of 100 nm is formed on the entire upper surface of the interlayer insulating film 25 by the DC sputtering method in which an InZnO target containing indium oxide and zinc oxide is used. Then, the film is wet-etched with the oxalic-acid based solution using the photoresist pattern formed in the sixth photolithography process as a mask and is patterned into each of the above-mentioned electrodes and wirings. Consequently, the counter slit electrode 31, the gate terminal pad 32, and the source terminal pad 33 that are shown in FIGS. 1 and 2 are simultaneously obtained.

The counter slit electrode 31 is formed of the transparent conductive film, so that the transmitted display light in the pixel region is not blocked. This prevents the aperture ratio from lowering, whereby the aperture ratio can be kept high.

As described above, the TFT substrate 100 shown in FIGS. 1 and 2 can be obtained through the six photolithography processes.

On the surface of the completed TFT substrate 100, an alignment film and spacers are formed. The alignment film is provided to align liquid crystals and is formed of, for example, polyimide. A counter substrate including a color filter and an alignment film is prepared. Then, the TFT substrate 100 and the counter substrate are bonded together.

The TFT substrate 100 and the counter substrate are bonded together with a certain gap kept therebetween by the above-mentioned spacers. The liquid crystals are injected into the gap to be sealed therein. That is, the liquid crystal layer is sandwiched between the TFT substrate 100 and the counter substrate. On the outer surfaces of the TFT substrate 100 and the counter substrate, polarizing plates, phase difference plates, and a backlight unit are mainly disposed, thereby providing a FFS-mode liquid crystal display.

The above description has been given assuming that the oxide semiconductor composed of InGaZnO is used as the semiconductor film 2, which is not limited thereto. For example, an oxide semiconductor film based on InZnO, InGaO, InSnO, ZnSnO, InSnZnO, InGaZnSnO, InAlZnO, InHfZnO, InZrZnO, InMgZnO, InYZnO, or the like may be used.

Moreover, the above description is given assuming that the transparent conductive film composed of InZnO is used as the pixel electrode 21 and the counter slit electrode 31, which is not limited thereto. For example, oxide-based transparent conductive films such as films based on InSnO (ITO), GaZnO, and ZnAlO may be used.

<Effects>

As described above, in the method for manufacturing the TFT substrate according to the first preferred embodiment, the oxide semiconductor is used as the channel layer of the TFT element, thereby providing the TFT substrate having high mobility, high performance, and a high aperture ratio for use in a FFS-mode liquid crystal display.

The TFT substrate can be manufactured through the six photolithography processes, thereby reducing the manufacturing costs of the FFS-mode liquid crystal display.

<First Modification>

In the first preferred embodiment described above, the method for manufacturing the TFT substrate 100 through the six photolithography processes has been described with reference to FIGS. 3 to 12.

As a modification of the manufacturing method according to the first preferred embodiment, a manufacturing method in which the photolithography processes can be further reduced is described below.

Figure 13:
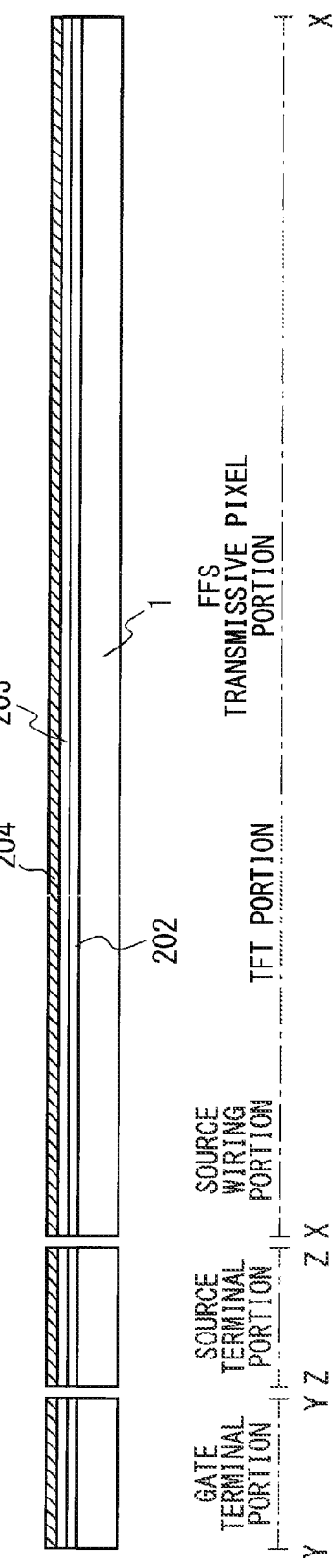
FIGS. 13, 14, 15, 16, 17, 18, and 19 are cross-sectional views showing a method for manufacturing the TFT substrate according to a first modification of the first preferred embodiment of the present invention.

Firstly, in the process shown in FIG. 13, on the entire upper surface of the transparent insulating substrate 1 made of, for example, glass, a semiconductor film 202, an insulating film 203, and a conductive film 204 are formed in the stated order. In a first modification, an InGaZnO-based oxide semiconductor formed of indium oxide ($In_2O_3$) containing gallium oxide ($Ga_2O_3$) and zinc oxide (ZnO) is used as the semiconductor film 202. A silicon oxide (SiO) film is used as the insulating film 203 and molybdenum (Mo), which is metal, is used as the conductive film 204. The specific methods for manufacturing these films are the same as the methods described in the first preferred embodiment, and the description thereof is omitted.

Figure 14:
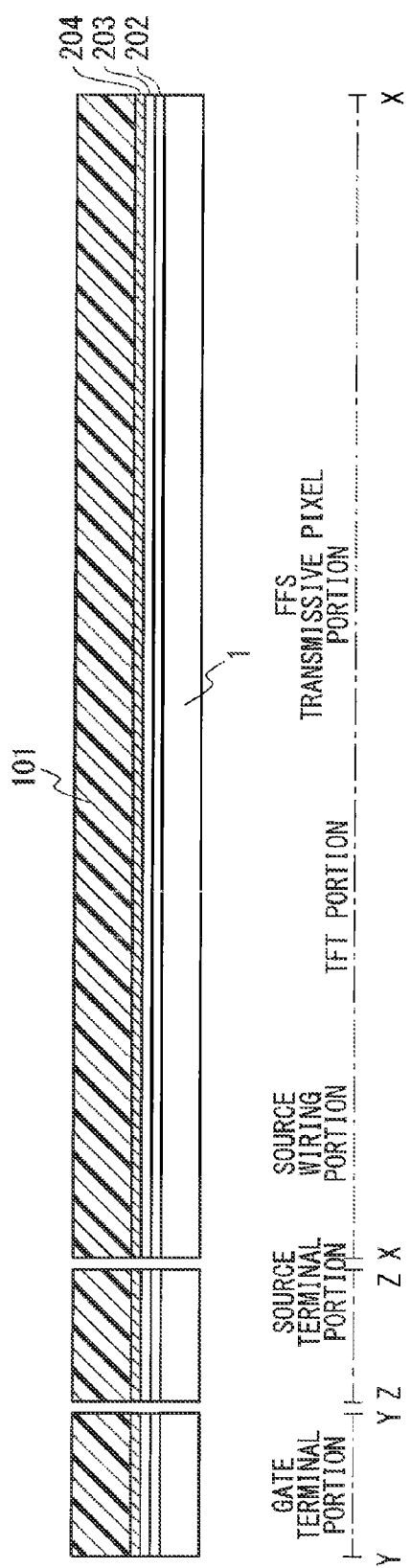

Next, in the process shown in FIG. 14, a photoresist 101 composed of a novolac-based positive-type photosensitive resin is applied onto the laminated films of the semiconductor film 202, the insulating film 203, and the conductive film 204 to have a thickness of about 1.6 μm by spin coating.

Figure 15:
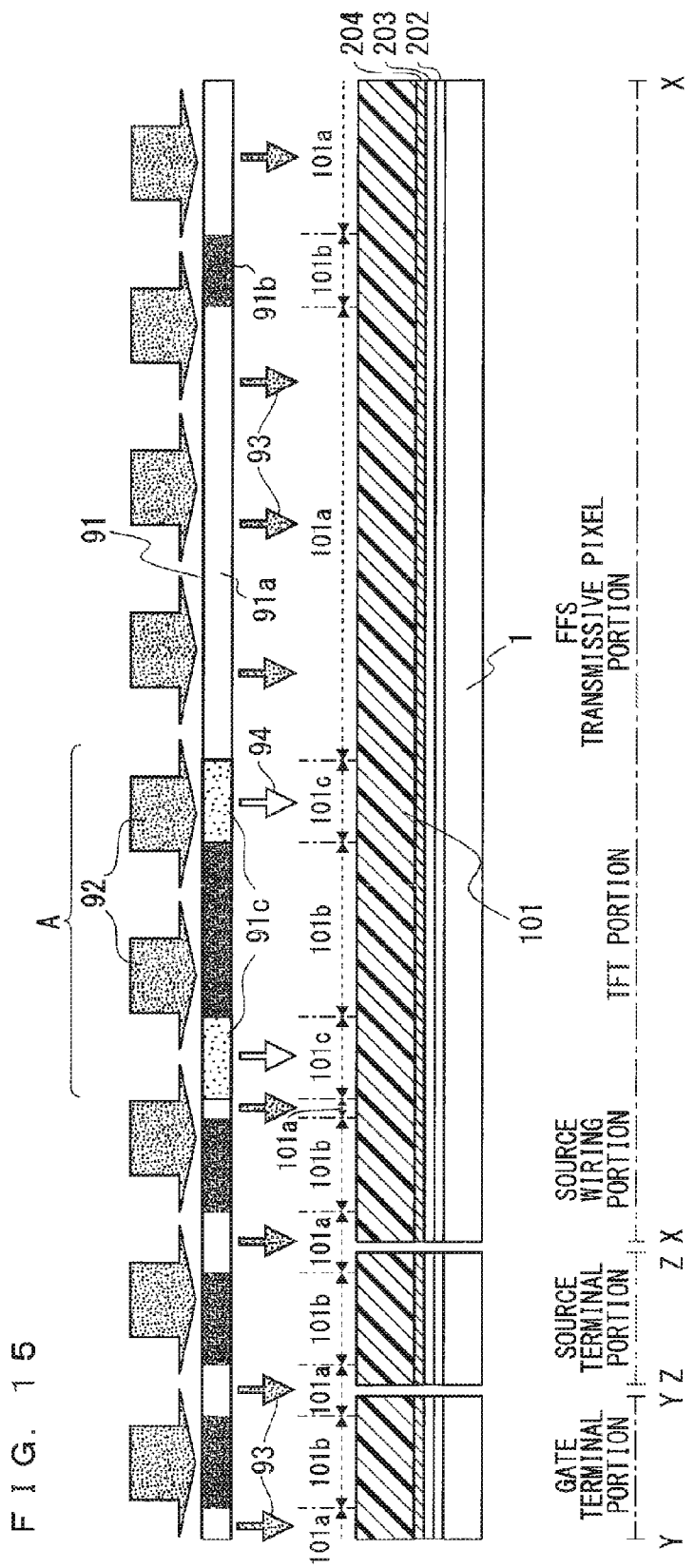

Next, in the process shown in FIG. 15, the photoresist 101 having the positive-type photosensitivity is exposed using a photomask 91 prepared in advance. The photomask 91 has an opening (exposure-light transmissive region) 91a and a light-shielding portion (exposure-light shielding region) 91b formed therein for forming the patterns of the TFT element A, the source wiring 6, the gate terminal 7, and the source terminal 8. The opening 91a corresponds to an exposed region 101a through which an exposure light 92 is transmitted as it is to reach the photoresist 101. The light-shielding portion 91b corresponds to a photoresist unexposed region 101b that blocks the exposure light. An exposure-light semi-transmissive region 91c having a semi-transmissive film formed therein is formed in the regions of the photomask 91 corresponding to the both ends of the TFT element A. The exposure-light semi-transmissive region 91c corresponds to a photoresist intermediate exposed region 101c that transmits an exposure light 94 in which the intensity of the original exposure light 92 is reduced by 40 to 60%. The photolithography method in which the intermediate exposed region is provided as described above is hereinafter referred to as the half-tone method.

Figure 16:
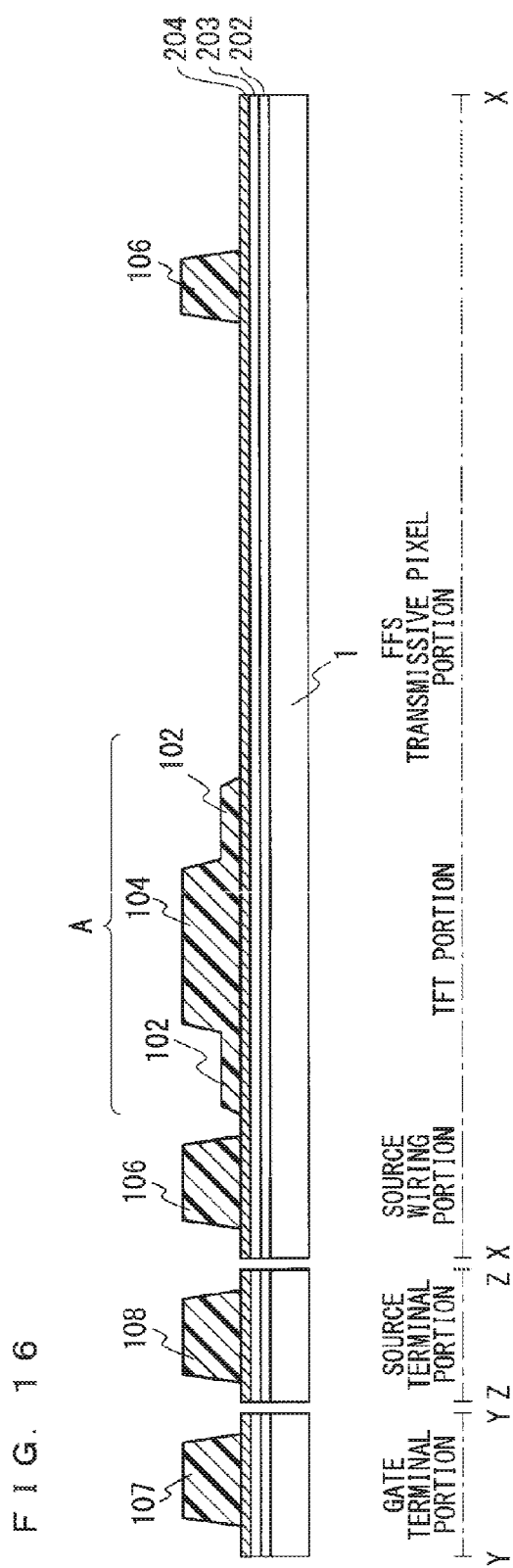

After the photoresist 101 is exposed using the photomask 91, a development is performed using an organic alkali-based developing solution that contains tetramethyl ammonium hydroxide (TMAH). Consequently, as shown in FIG. 16, the photoresist 101 is removed except for the portions corresponding to the TFT element A, a source-wiring resist pattern 106, a gate-terminal resist pattern 107, and a source-terminal resist pattern 108. At the same time, a gate-electrode resist pattern 104 having a first thickness is formed in the TFT element A. Also, a semiconductor resist pattern 102 having a second thickness that is smaller than the thickness of the unexposed region is formed in the exposed region of the TFT element A in the photoresist intermediate exposed region 101c. Here, the second film thickness of the semiconductor resist pattern 102 was about 0.4 μm.

Figure 17:
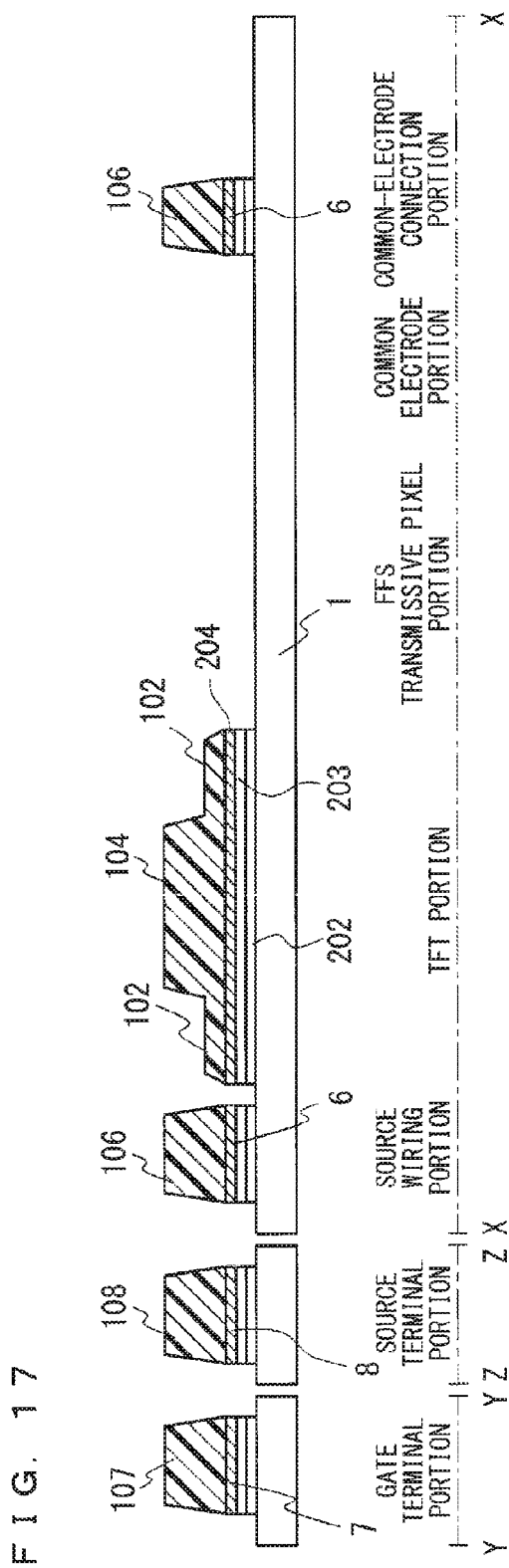

Consequently, in the process shown in FIG. 17, the conductive film 204, the insulating film 203, and the semiconductor film 202 are sequentially etched using the above-described resist patterns 102, 104, 106, 107, and 108 as a mask. The specific method for etching these films is the same as that of the first preferred embodiment, and the description thereof is omitted.

Figure 18:
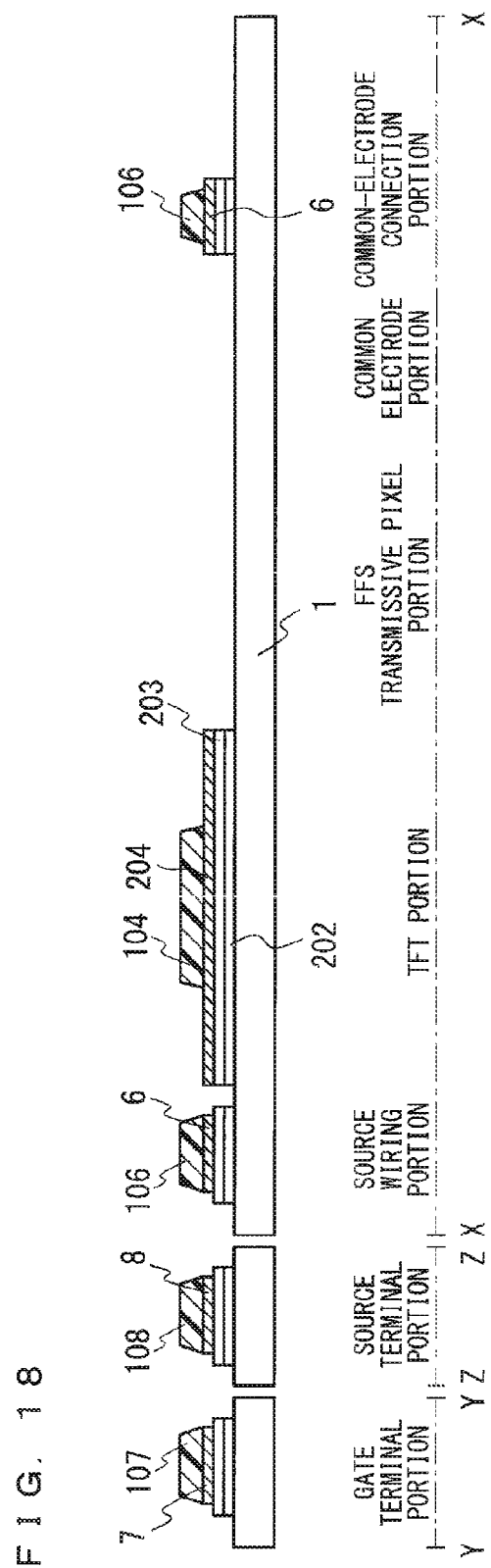

Next, in the process shown in FIG. 18, the film thicknesses of the resist patterns are reduced overall by the $O_2$ ashing and the semiconductor resist pattern 102 having the smaller film thickness is completely removed. Consequently, the gate-electrode resist pattern 104, the source-wiring resist pattern 106, the gate-terminal resist pattern 107, and the source-terminal resist pattern 108 having the desired thickness are formed.

In the above-mentioned $O_2$ ashing, a half ashing is performed for partially leaving the resist, so that the gate-electrode resist pattern 104, the source-wiring resist pattern 106, the gate-terminal resist pattern 107, and the source-terminal resist pattern 108 are left.

Figure 19:
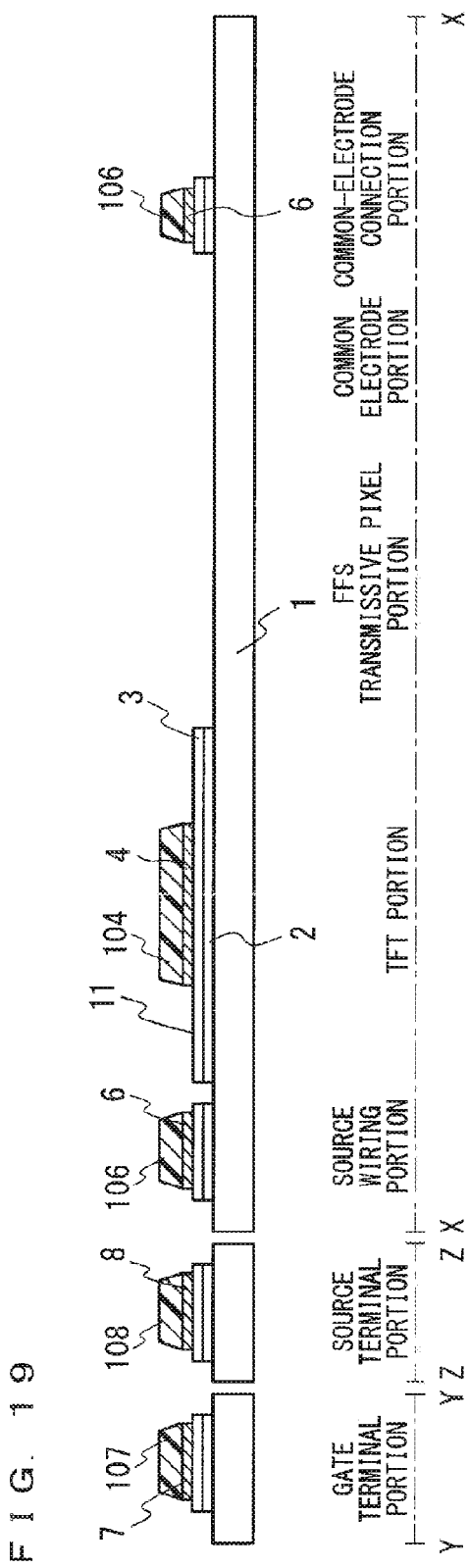

Next, in the process shown in FIG. 19, the conductive film 204 that is located in the top layer and made of Mo is etched to be patterned using the above-mentioned resist patterns as a mask by wet etching in which the PAN solution is used.

Then, the photoresist is removed, whereby the semiconductor film 2, the gate insulating film 3, the gate electrode 4, the source wiring 6, the gate terminal 7, and the source terminal 8 that are similar to the ones in FIG. 6 are obtained. Although two photolithography processes are required to obtain the configuration shown in FIG. 6 in the first preferred embodiment, only one process of photolithography is required in this modification.

After that, the manufacturing processes described in the first preferred embodiment with reference to FIGS. 7 to 12 are performed, whereby the TFT substrate 100 in the FFS mode according to the first preferred embodiment of the present invention is manufactured.

Therefore, the manufacturing method according to this modification can reduce the number of photolithography processes, whereby the TFT substrate can be manufactured through the five photolithography processes. Thus, a FFS-mode liquid crystal display can be manufactured with increased productivity and reduced cost.

<Second Modification>

As another modification of the TFT substrate 100 according to the first preferred embodiment, a configuration further including an upper-layer gate wiring that is formed in the same layer as the counter slit electrode 31 using the same transparent conductive film as the counter slit electrode 31 is described below.

Figure 20:
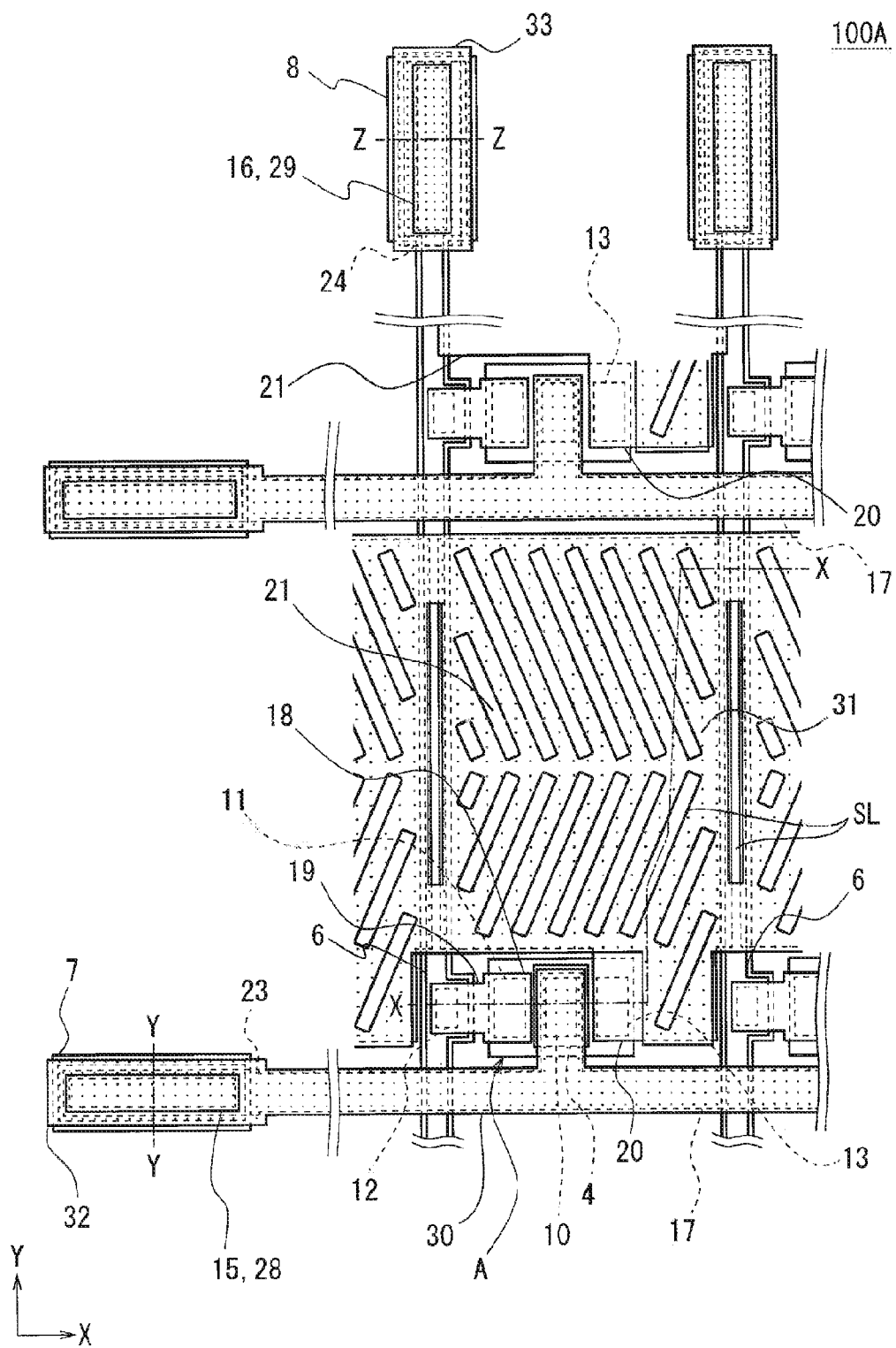
FIG. 20 is a plan view showing a configuration the TFT substrate according to a second modification of the first preferred embodiment of the present invention.
Figure 21:
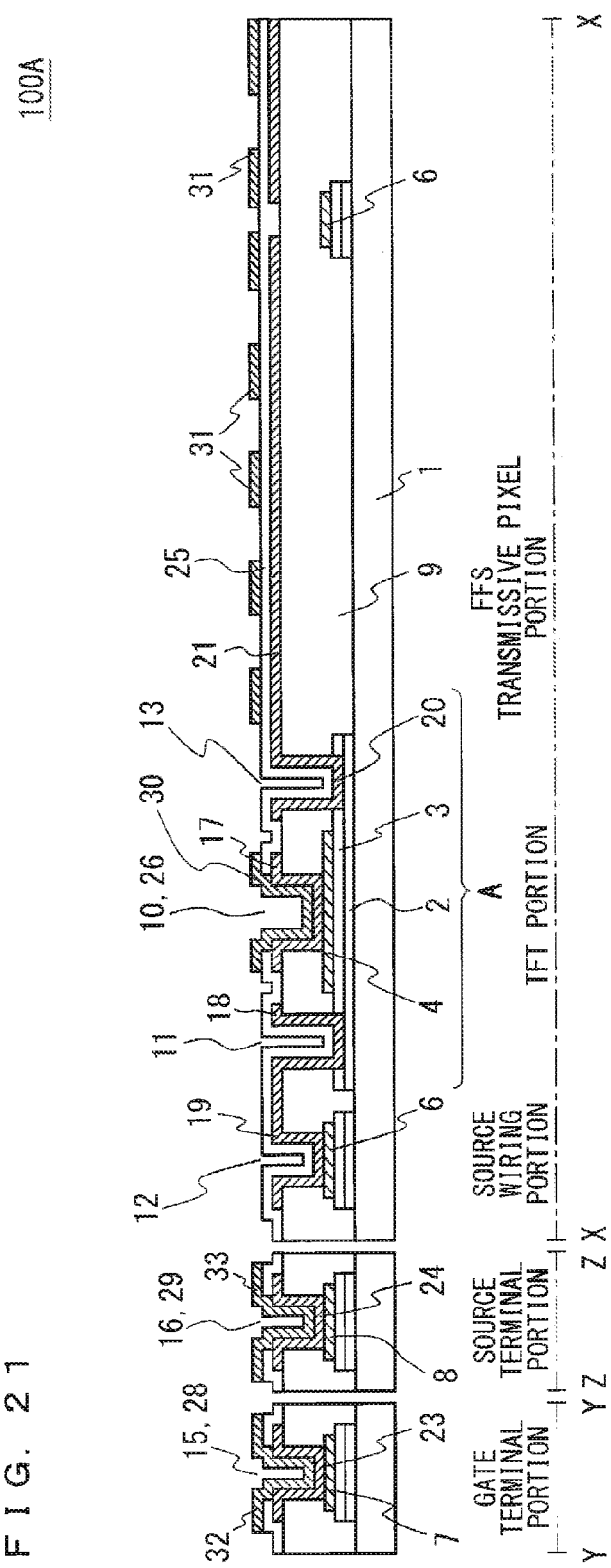
FIG. 21 is a cross-sectional view showing the configuration of the TFT substrate according to the second modification of the first preferred embodiment of the present invention.

With reference to FIGS. 20 and 21, a configuration of a TFT substrate 100A according to this modification is described. FIG. 20 is a plan view showing a planar configuration of a pixel according to a second modification and FIG. 21 is a cross-sectional view showing a cross-sectional configuration taken along the line X-X in FIG. 20 (cross-sectional configurations of the source wiring portion, the TFT portion, and the FFS transmissive pixel portion), a cross-sectional configuration taken along the line Y-Y in FIG. 20 (a cross-sectional configuration of the gate terminal portion), and a cross-sectional configuration taken along the line Z-Z in FIG. 20 (a cross-sectional configuration of the source terminal portion). Note that constituents that are the same as those of the TFT substrate 100 described with reference to FIGS. 1 and 2 are given the same reference signs, and the overlapping description is omitted.

As shown in FIG. 21, in the TFT substrate 100A, the portion that diverges from the gate wiring 17 and extends to the formation region of the TFT element A (TFT portion) is connected to the gate electrode 4 through the gate-electrode-portion contact hole 10. In addition, a gate-electrode-portion upper-layer contact hole 26 is provided above the gate-electrode-portion contact hole 10 and an upper-layer gate wiring 30 that is connected to the gate wiring 17 through the gate-electrode-portion upper-layer contact hole 26 is formed.

Next, a method for manufacturing the TFT substrate 100A is described. After the processes described in the first preferred embodiment with reference to FIGS. 3 to 10 are performed, the interlayer insulating film 25 is formed to cover the entire upper surface of the transparent insulating substrate 1. More specifically, for example, a silicon nitride (SiN) film having a thickness of 200 to 400 nm is formed as the interlayer insulating film 25 by the plasma CVD method.

Figure 22:
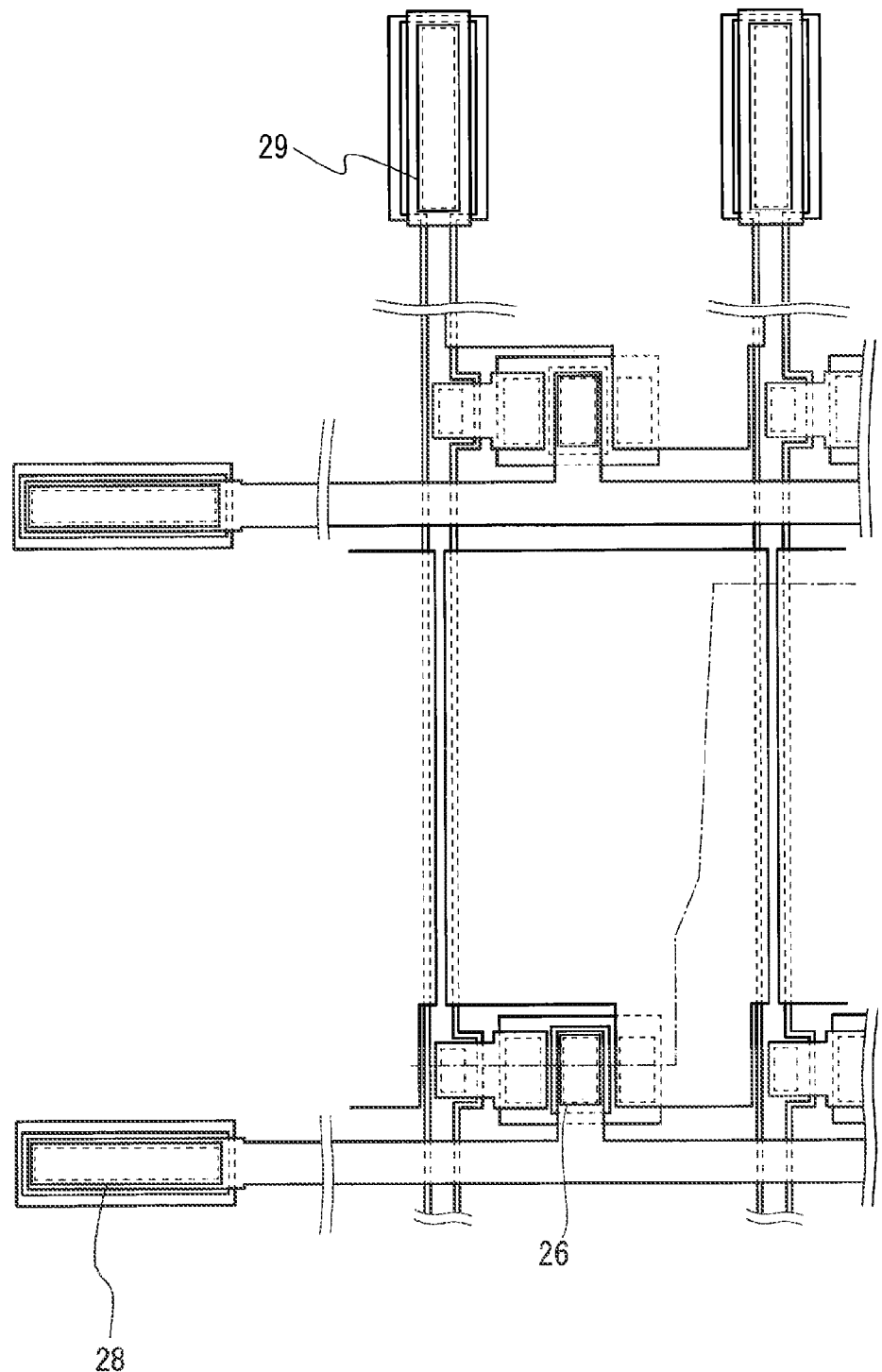
FIG. 22 is a plan view showing a method for manufacturing the TFT substrate according to the second modification of the first preferred embodiment of the present invention.
Figure 23:
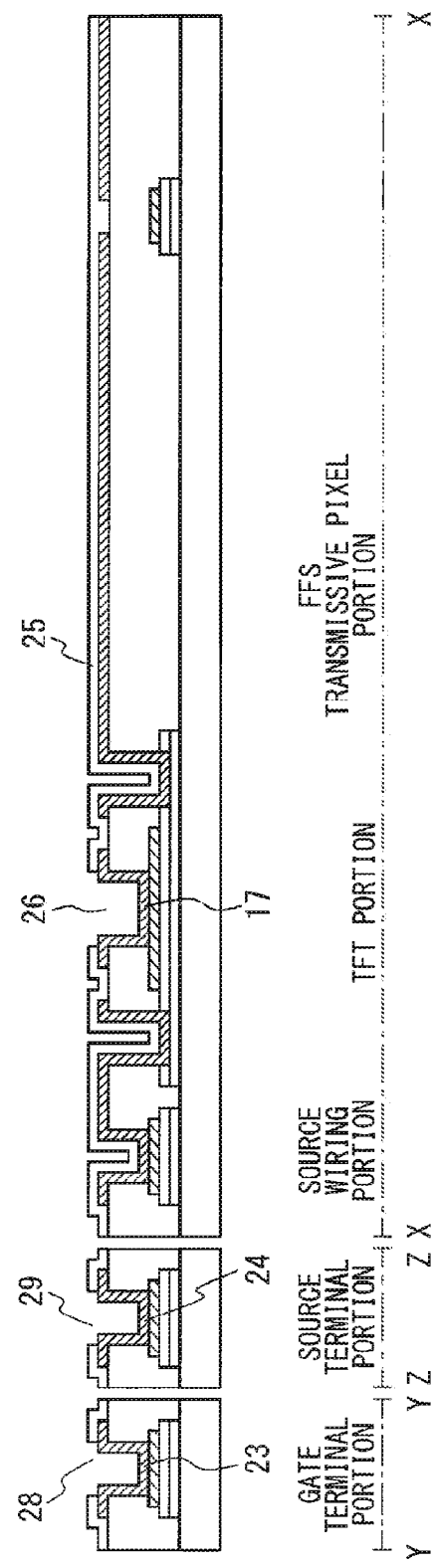
FIG. 23 is a cross-sectional view showing the method for manufacturing the TFT substrate according to the second modification of the first preferred embodiment of the present invention.

Subsequently, a photoresist pattern is formed on the interlayer insulating film 25 in the fifth photolithography process. After that, the SiN film is etched using the photoresist pattern as a mask by dry etching in which $O_2$ gas and a gas containing fluorine such as $CF_4$ and $SF_6$ are used, and then, the photoresist pattern is removed. Consequently, as shown in FIGS. 22 and 23, the gate-terminal-portion second contact hole 28 that reaches the surface of the gate-terminal extraction electrode 23, the source-terminal-portion second contact hole 29 that reaches the surface of the source-terminal extraction electrode 24, and the gate-electrode-portion upper-layer contact hole 26 that reaches the surface of the gate wiring 17 are formed.

Next, a transparent conductive film is formed on the entire upper surface of the interlayer insulating film 25 and a photoresist pattern is formed on the transparent conductive film in the sixth photolithography process. After that, the above-mentioned transparent conductive film is patterned using the photoresist pattern as a mask. Consequently, the counter slit electrode 31 having a comb-teeth shape in which the plurality of slits SL are provided across the entire surface thereof is formed.

At the same time, by using the above-mentioned conductive film, the gate terminal pad 32, the source terminal pad 33, and the upper-layer gate wiring 30 are formed. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25. The upper-layer gate wiring 30 is connected to the gate wiring 17 through the gate-electrode-portion upper-layer contact hole 26 formed through the interlayer insulating film 25. Note that the above-mentioned photoresist pattern is patterned such that the upper-layer gate wiring 30 is also formed on the gate wiring 17.

More specifically, as the transparent conductive film, an InZnO film having a thickness of 100 nm is formed on the entire upper surface of the interlayer insulating film 25 by the DC sputtering method in which an InZnO target containing indium oxide and zinc oxide is used. Then, the film is wet-etched with the oxalic-acid based solution using the photoresist pattern formed in the sixth photolithography process as a mask and is patterned into each of the above-mentioned electrodes and wirings. Consequently, the counter slit electrode 31, the gate terminal pad 32, the source terminal pad 33, and the upper-layer gate wiring 30 that are shown in FIGS. 20 and 21 are simultaneously obtained.

The counter slit electrode 31 is formed of the transparent conductive film, so that the transmitted display light in the pixel region is not blocked. This prevents the aperture ratio from lowering, whereby the aperture ratio can be kept high.

The TFT substrate 100A according to the second modification described above has the following characteristics. The TFT substrate 100A can be obtained through the six photolithography processes, similarly to the manufacturing method in the first preferred embodiment. In addition, the TFT substrate 100A includes the upper-layer gate wiring 30, whereby the gate wiring resistance is further reduced and the gate signal delay is prevented even if the substrate is included in a large panel. Thus, the display quality is improved.

Moreover, the TFT substrate 100A includes the two-layer structure of the gate wiring 17 and the upper-layer gate wiring 30 that is formed in the same layer as the counter silt electrode 31, providing the so-called redundant wiring. This can significantly reduce breakages of the gate wirings.

By applying the half-tone method described in the first modification, the TFT substrate 100A can also be manufactured through the five photolithography processes, allowing for a cost reduction. Therefore, a FFS-mode liquid crystal display can be manufactured with increased productivity and reduced cost.

<Third Modification>

As still another modification of the TFT substrate 100 according to the first preferred embodiment, a configuration further including an uppermost-layer gate wiring disposed on the upper-layer gate wiring is described below.

Figure 24:
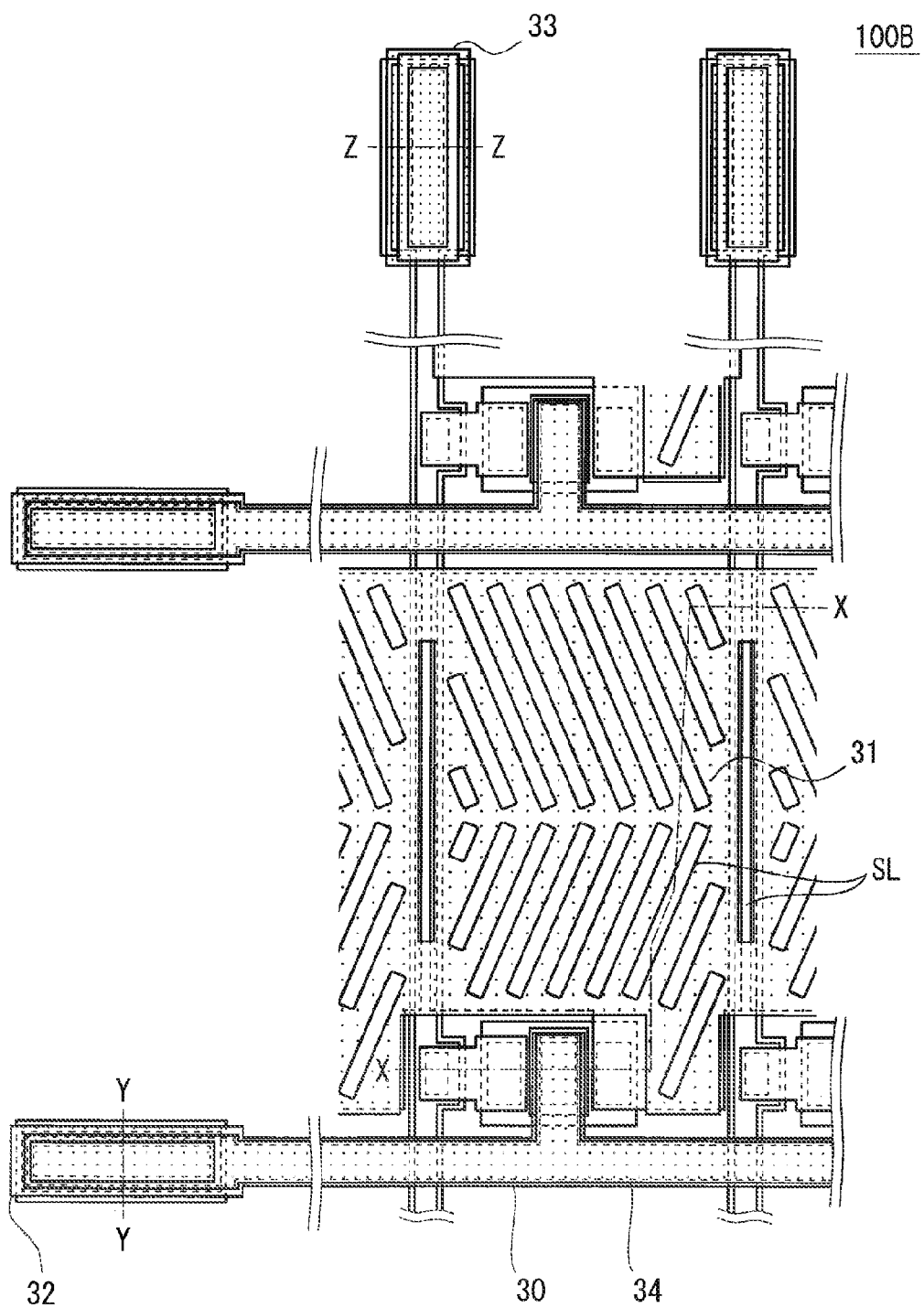
FIG. 24 is a plan view showing a configuration of the TFT substrate according to a third modification of the first preferred embodiment of the present invention.
Figure 25:
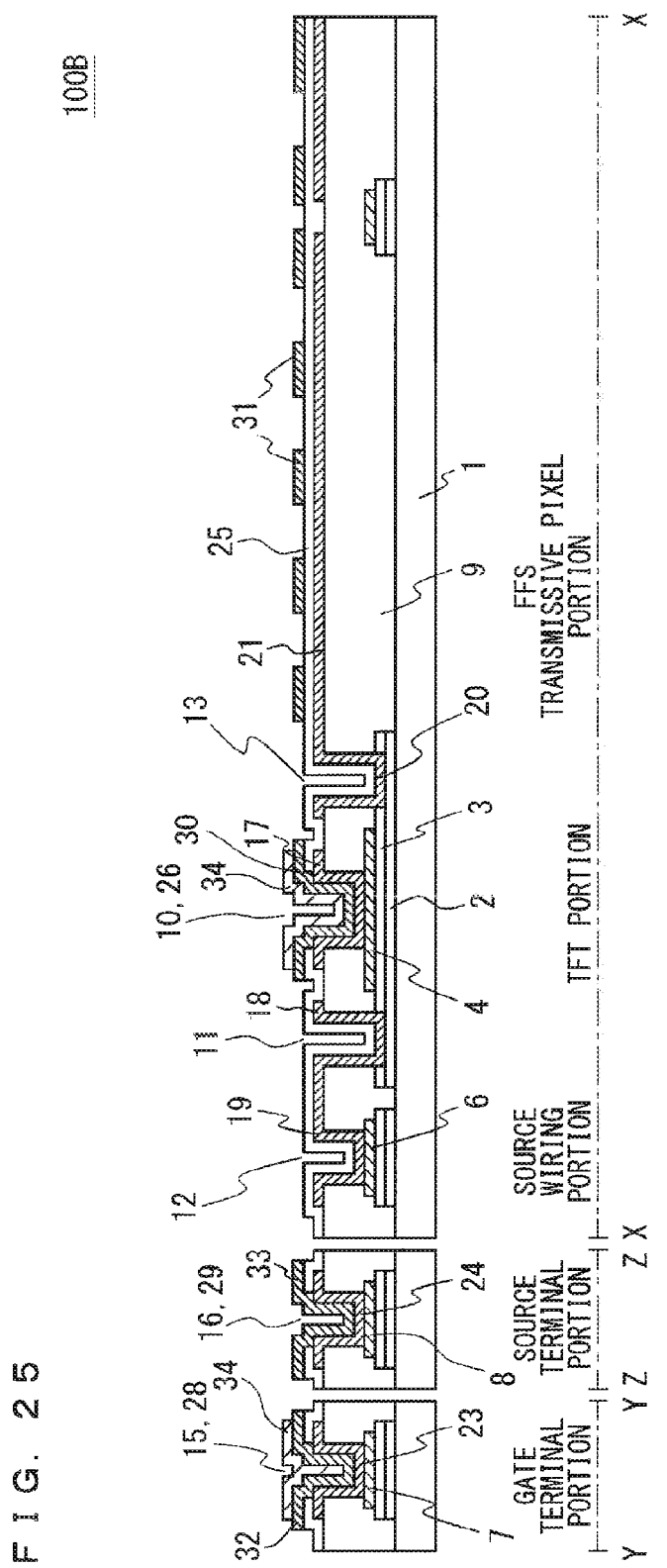
FIG. 25 is a cross-sectional view showing the configuration of the TFT substrate according to the third modification of the first preferred embodiment of the present invention.

With reference to FIGS. 24 and 25, a configuration of a TFT substrate 100B according to this modification is described. FIG. 24 is a plan view showing a planar configuration of a pixel according to a third modification and FIG. 25 is a cross-sectional view showing a cross-sectional configuration taken along the line X-X in FIG. 24 (cross-sectional configurations of the source wiring portion, the TFT portion, and the FFS transmissive pixel portion), a cross-sectional configuration taken along the line Y-Y in FIG. 24 (a cross-sectional configuration of the gate terminal portion), and a cross-sectional configuration taken along the line Z-Z in FIG. 24 (a cross-sectional configuration of the source terminal portion). Note that constituents that are the same as those of the TFT substrate 100 described with reference to FIGS. 1 and 2 are given the same reference signs, and the overlapping description is omitted.

As shown in FIG. 25, in the TFT substrate 100B, the portion that diverges from the gate wiring 17 and extends to the formation region of the TFT element A (TFT portion) is connected to the gate electrode 4 through the gate-electrodeportion contact hole 10. In addition, the upper-layer gate wiring 30 is formed above the gate-electrode-portion contact hole 10 and on the gate wiring 17. The gate-electrode-portion upper-layer contact hole 26 is disposed above the gate-electrode-portion contact hole 10. An uppermost-layer gate wiring 34 formed of a conductive film is disposed on the upper-layer wiring 30 and on the gate terminal pad 32.

Next, a method for manufacturing the TFT substrate 100B is described. The processes described in the first preferred embodiment with reference to FIGS. 3 to 10 and the processes described in the second modification with reference to FIG. 23 are performed, so that the gate-terminal-portion second contact hole 28 that reaches the surface of the gate-terminal extraction electrode 23, the source-terminal-portion second contact hole 29 that reaches the surface of the source-terminal extraction electrode 24, and the gate-electrode-portion upper-layer contact hole 26 that reaches the surface of the gate wiring 17 are formed.

Next, a transparent conductive film and a metal film are formed on the entire upper surface of the interlayer insulating film 25 in the stated order and a photoresist pattern is formed on the metal film by the half-tone method in the sixth photolithography process. After that, the metal film and the transparent conductive film mentioned above are patterned using the photoresist pattern as a mask, to thereby form the counter slit electrode 31 having a comb-teeth shape, the gate terminal pad 32, the source terminal pad 33, and the upper-layer gate wiring 30. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25. The upper-layer gate wiring 30 is connected to the gate wiring 17 through the gate-electrode-portion upper-layer contact hole 26 formed through the interlayer insulating film 25. Note that a metal film is formed on these electrodes and wirings.

Then, the photoresist pattern that is unnecessary is removed using the photoresist pattern that has been partially left by half ashing and the metal film that is unnecessary is removed using the photoresist pattern that has been left. Consequently, the TFT substrate 100B shown in FIGS. 24 and 25 is obtained.

Figure 26:
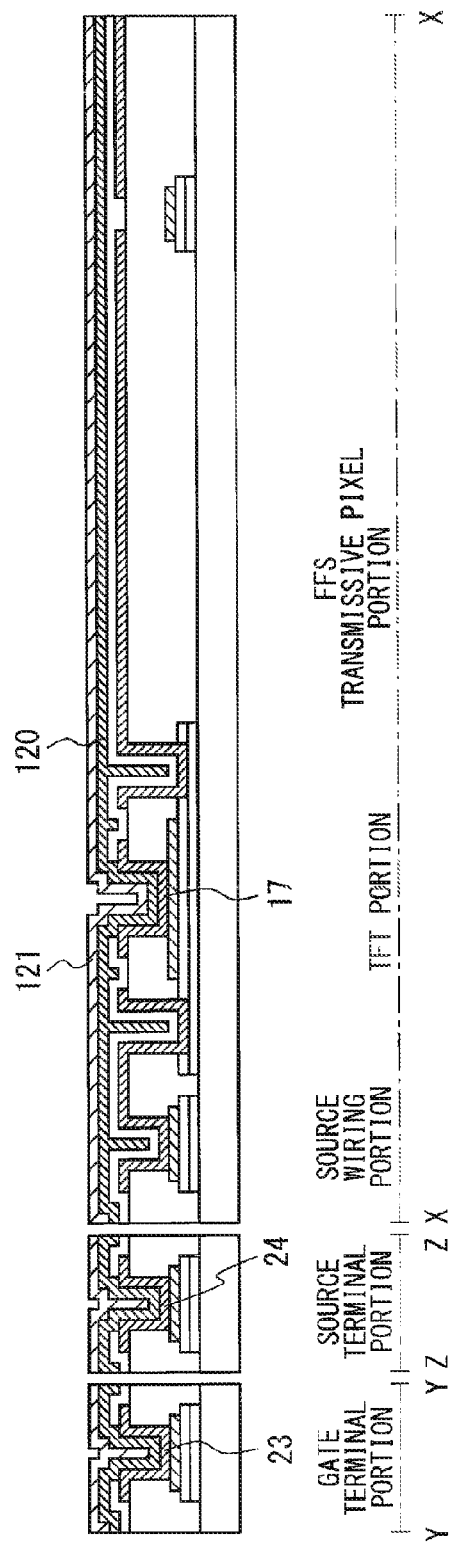
FIGS. 26, 27, 28, 29, and 30 are cross-sectional views showing a method for manufacturing the TFT substrate according to the third modification of the first preferred embodiment of the present invention.

The manufacturing method described above is further described below with reference to FIGS. 26 to 30. The processes described in the second modification with reference to FIG. 23 are performed, so that the gate-terminal-portion second contact hole 28 that reaches the surface of the gate-terminal extraction electrode 23, the source-terminal-portion second contact hole 29 that reaches the surface of the source-terminal extraction electrode 24, and the gate-electrode-portion upper-layer contact hole 26 that reaches the surface of the gate wiring 17 are formed. After that, a transparent conductive film 120 is formed on the interlayer insulating film 25 and in these holes as shown in FIG. 26.

An InZnO film having a thickness of 100 nm is formed by the DC sputtering method in which an InZnO target containing indium oxide and zinc oxide is used, whereby the transparent conductive film 120 is obtained. Subsequently, an AlNiNd film having a thickness of 100 nm is formed on the entire upper surface of the transparent conductive film 120 by the DC magnetron sputtering method in which an AlNiNd target that is an Al alloy is used, thereby providing a metal film 121.

Figure 27:
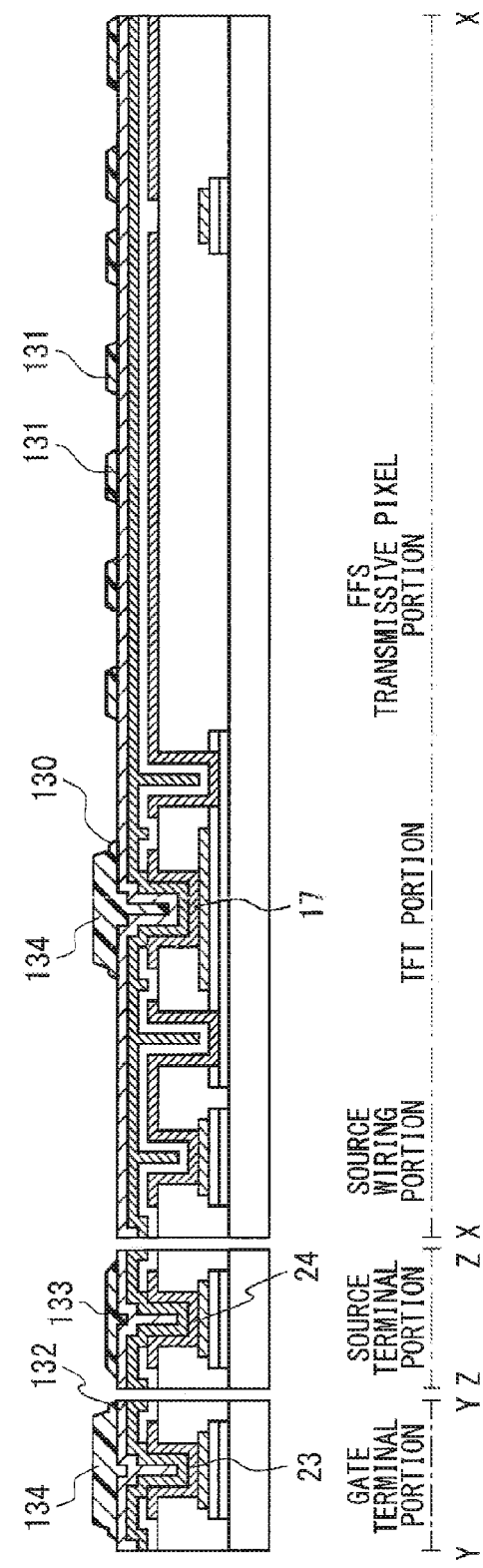

Next, in the process shown in FIG. 27, a photoresist composed of a novolac-based positive-type photosensitive resin is applied onto the metal film 121 to have a thickness of about 1.6 µm by spin coating. The photoresist is exposed by the half-tone method and developed, whereby a predetermined photoresist pattern is obtained. The predetermined photoresist pattern includes an upper-layer gate-wiring photoresist pattern 130 for patterning for forming the upper-layer gate wiring 30, a counter-slit-electrode photoresist pattern 131 for patterning for forming the counter slit electrode 31, a gate-terminal-pad photoresist pattern 132 for patterning for forming the gate terminal pad 32, a source-terminal-pad photoresist pattern 133 for patterning for forming the source terminal pad 33, and an uppermost-layer gate-wiring photoresist pattern 134 for patterning for forming the uppermost-layer gate wiring 34.

All of the patterns except for the uppermost-layer gate-wiring photoresist pattern 134 having a first thickness are formed into a second thickness (about 0.4 µm). The uppermost-layer gate-wiring photoresist pattern 134 formed inside the regions of the upper-layer gate-wiring photoresist pattern 130 and gate-terminal-pad photoresist pattern 132 is formed to have a thickness larger than that of the other patterns.

Figure 28:
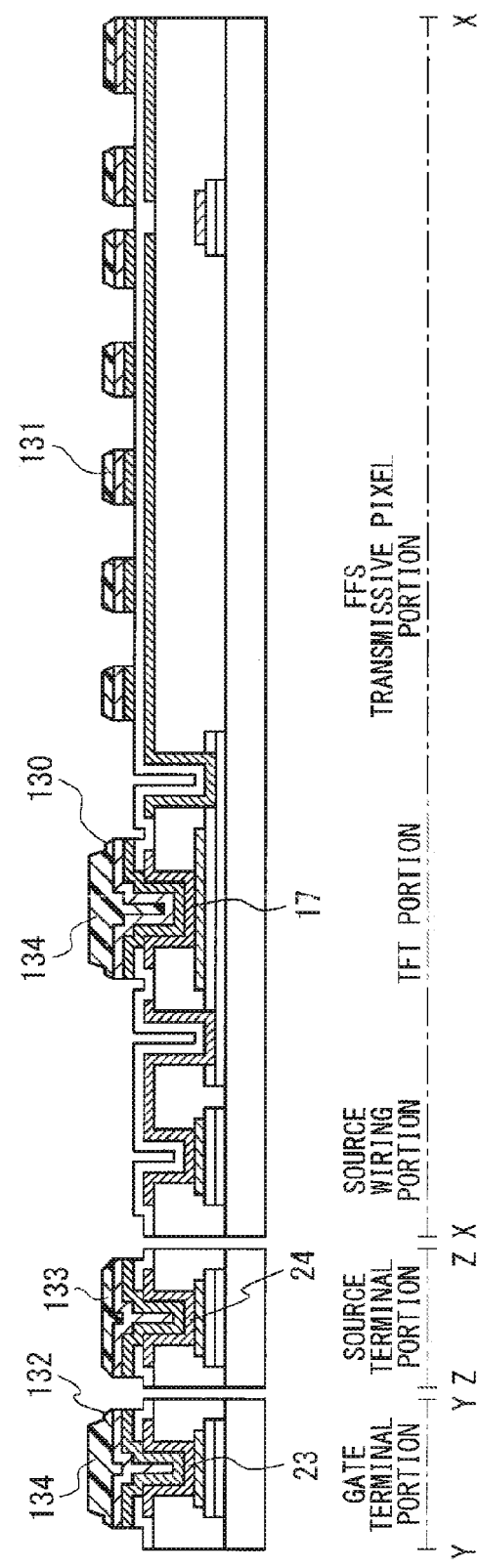

Next, in the process shown in FIG. 28, the metal film 121 is etched with an alkali-based organic developing solution that contains tetramethyl ammonium hydroxide (TMAH) using the above-mentioned photoresist patterns as a mask. Then, the transparent conductive film 120 is etched with an oxalic-acid based solution, whereby the metal film 121 and the transparent conductive film 120 located in the regions that are not covered by the photoresist patterns are removed.

Figure 29:
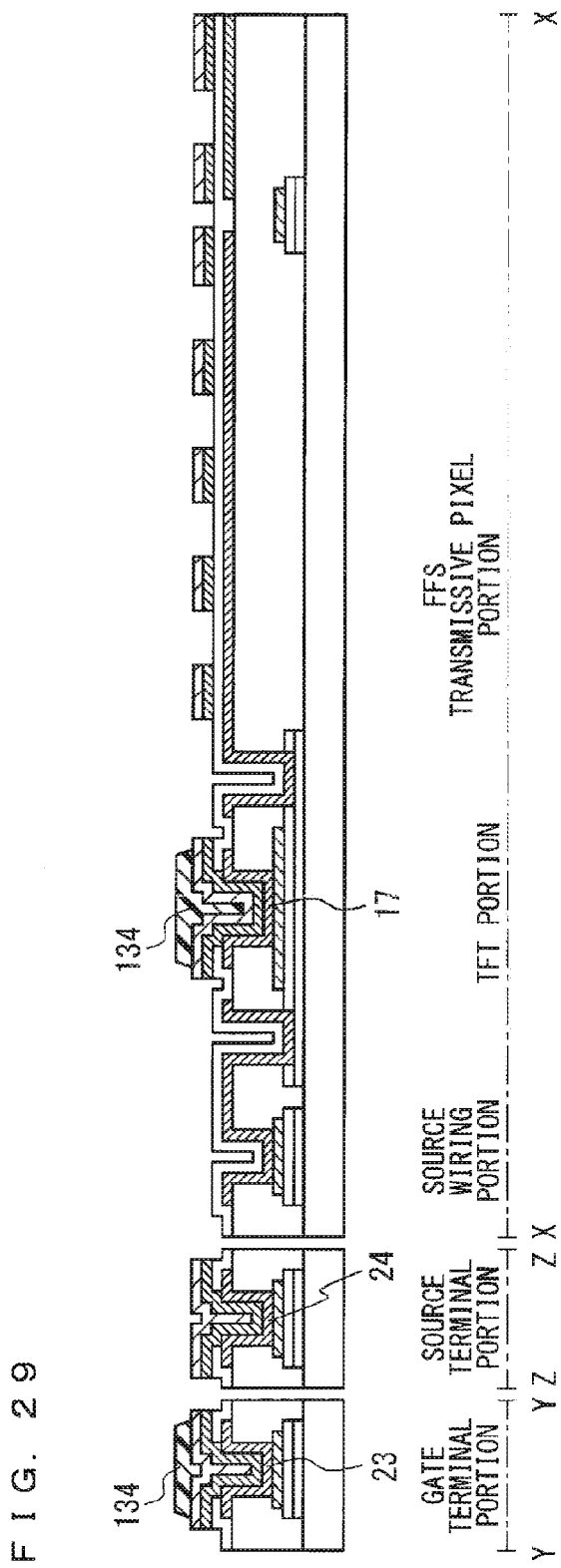

Next, in the process shown in FIG. 29, the photoresist is thinned by ashing in which the transparent insulating substrate 1 is entirely irradiated with oxygen ($O_2$) plasma, whereby only the uppermost-layer gate-wiring photoresist pattern 134 is left and other photoresist patterns are removed.

Figure 30:
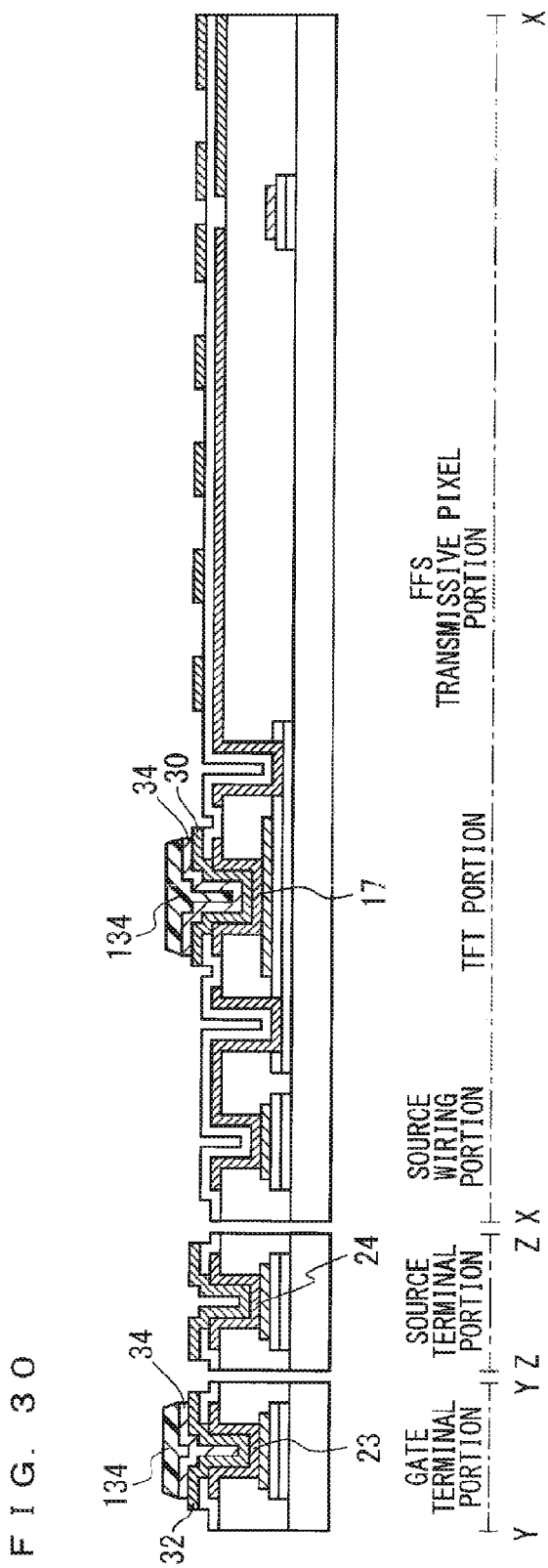

Then, in the process shown in FIG. 30, the metal film 121 is etched with above-mentioned developing solution using the uppermost-layer gate-wiring photoresist pattern 134 as a mask, thereby being patterned into the uppermost-layer gate wiring 34 on the upper-layer gate wiring 30 and on the gate terminal pad 32. Then, the photoresist pattern is removed.

Consequently, as shown in FIGS. 24 and 25, the TFT substrate 100B including the counter slit electrode 31, the gate terminal pad 32, the source terminal pad 33, the upper-layer gate wiring 30, and the uppermost-layer gate wiring 34 can be obtained through the six photolithography processes.

Although a configuration including the uppermost-layer gate wiring 34 also disposed on the gate terminal pad 32 has been described above, the metal film 121 may be patterned such that the metal film 121 on the gate terminal pad 32 is deleted, whereby the uppermost-layer gate wiring 34 is not disposed on the gate terminal pad 32.

On the contrary, the metal film 121 may be left not only on the gate terminal pad 32 but also on the source terminal pad 33, to thereby provide an uppermost-layer source wiring in the same way as the uppermost-layer gate wiring 34.

The metal film 121 may not be left on the gate terminal pad 32 and the metal film 121 may be alternatively left on the source terminal pad 33, to thereby provide the uppermost-layer source wiring.

In effect, the uppermost-layer gate wiring 34 and the wirings disposed in the same layer thereof are provided only to reduce the gate wiring resistance. Therefore, the wirings need to be formed on the layer above the gate wiring while being optionally disposed on the layer above the respective terminal portions.

In a case where the uppermost-layer gate wiring 34 and the wirings in the same layer thereof are provided in the layer above the respective terminal portions, in the use of the Al alloy film, which is soft and easily changes in shape on its surface, as the terminal pads, the film can be easily transformed, at the time of connection (mounting) of the wiring substrate and the integrated circuit (IC) chips for imputing signals from the outside, along the shapes of the mounted members. This can improve the connection properties, leading to an improvement in reliability.

Meanwhile, even if the uppermost-layer gate wiring 34 and the wirings in the same layer thereof are not provided in the layer above the respective terminal portions, the terminal pads are formed of an oxide conductive film such as InZnO. This is in no way inferior in terms of improving the connection properties, leading to an improvement in reliability similarly to the above case.

The TFT substrate 100B according to the third modification described above has the following characteristics. The TFT substrate 100B can be obtained through the six photolithography processes similarly to the manufacturing method in the first preferred embodiment. In addition, the TFT substrate 100B includes the upper-layer gate wiring 30 and the uppermost-layer gate wiring 34 disposed on the gate wiring 17, whereby the gate wiring resistance is further reduced and the gate signal delay is prevented even if the substrate is included in a large panel. Thus, the display quality is improved.

The TFT substrate 100B includes the three-layer structure of the gate wiring 17, the upper-layer gate wiring 30 that is formed in the same layer as the counter silt electrode 31, and the uppermost-layer gate wiring 34 that is formed on the upper-layer gate wiring 30, providing the so-called redundant wiring. This can significantly reduce breakages of the gate wirings.

By applying the half-tone method described in the first modification, the TFT substrate 100B can also be manufactured through the five photolithography processes, allowing for a cost reduction. Therefore, a FFS-mode liquid crystal display can be manufactured with increased productivity and reduced cost.

The counter slit electrode 31 is formed of the transparent conductive film, so that the transmitted display light in the pixel region is not blocked. This prevents the aperture ratio from lowering, whereby the aperture ratio can be kept high.

<Second Preferred Embodiment>
<Configuration of Pixel of TFT Substrate>

Figure 31:
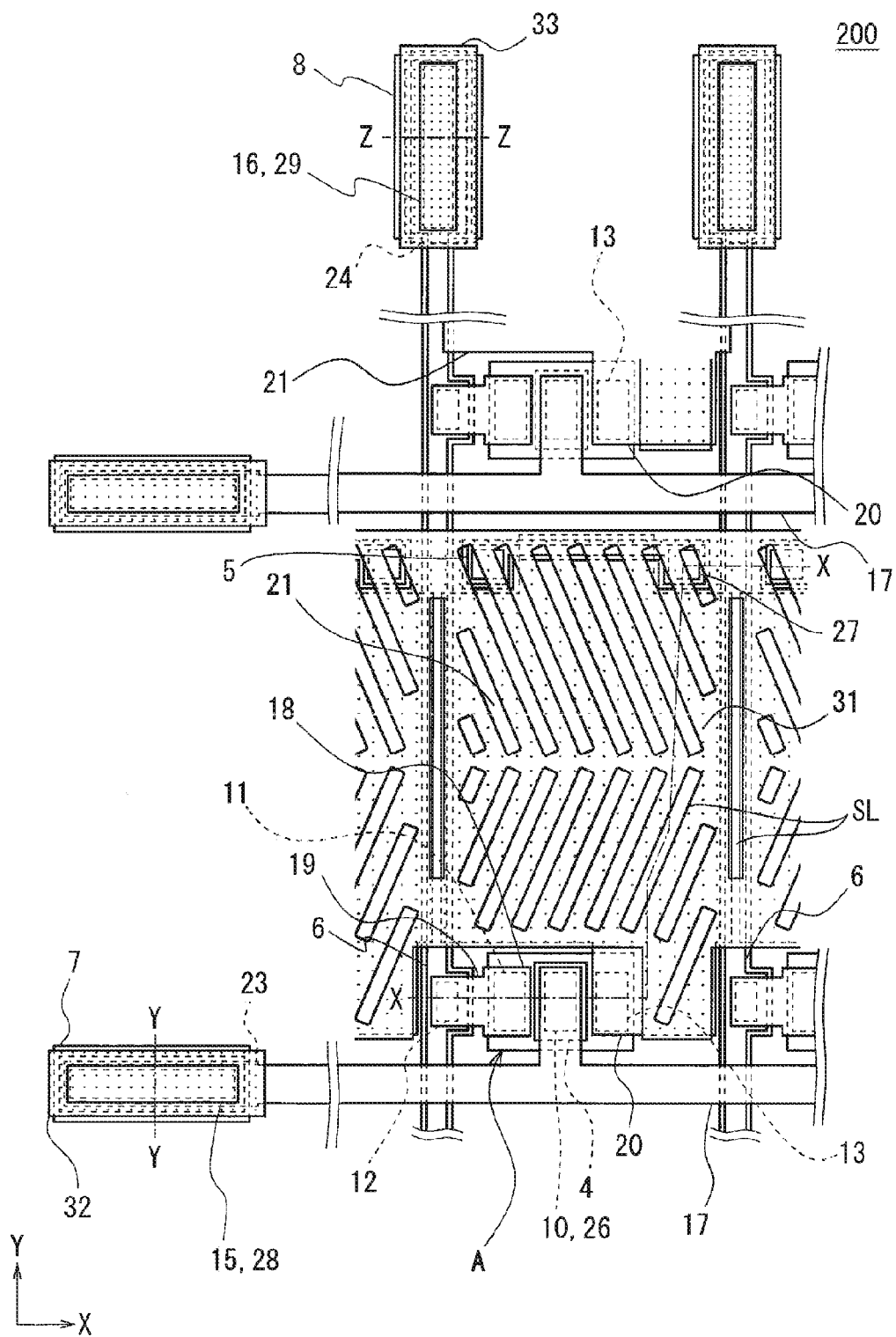
FIG. 31 is a plan view showing a configuration of the TFT substrate according to a second preferred embodiment of the present invention.
Figure 32:
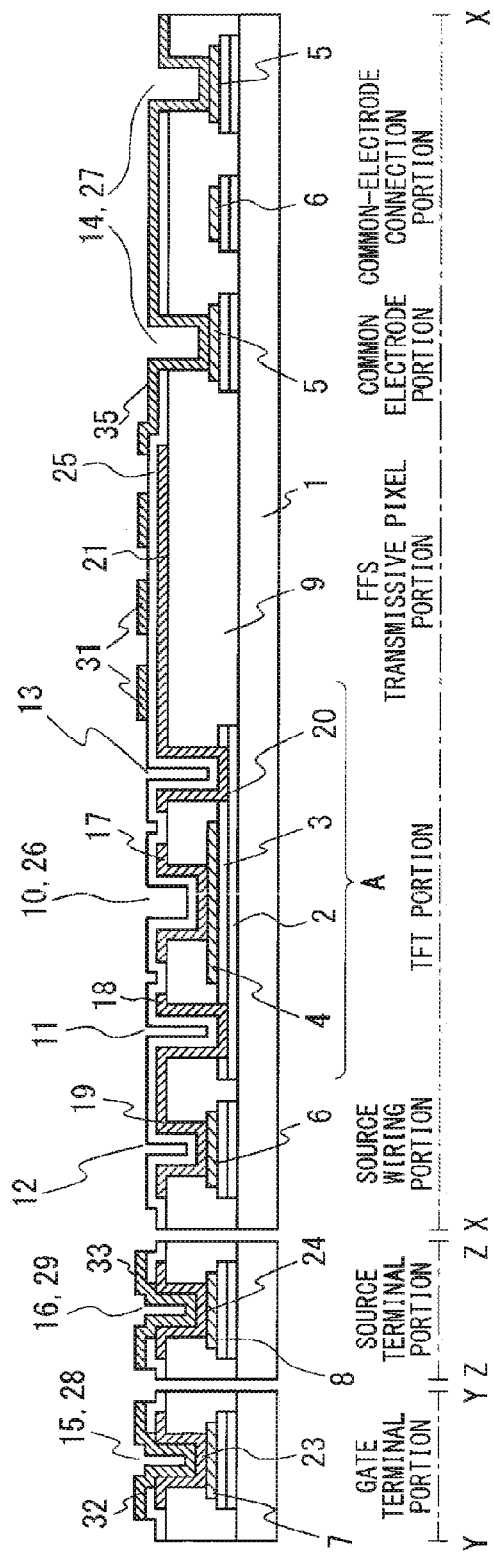
FIG. 32 is a cross-sectional view showing the configuration of the TFT substrate according to the second preferred embodiment of the present invention.

Firstly, with reference to FIGS. 31 and 32, a configuration of a TFT substrate 200 according to a second preferred embodiment is described. Note that constituents that are the same as those of the TFT substrate 100 described with reference to FIGS. 1 and 2 are given the same reference signs, and the overlapping description is omitted.

FIG. 31 is a plan view showing a planar configuration of a pixel according to the second preferred embodiment. FIG. 32 is a cross-sectional view showing a cross-sectional configuration taken along the line X-X in FIG. 31 (cross-sectional configurations of the source wiring portion, the TFT portion, the FFS transmissive pixel portion, a common electrode portion, and a common-electrode connection portion), a cross-sectional configuration taken along the line Y-Y in FIG. 31 (a cross-sectional configuration of the gate terminal portion), and a cross-sectional configuration taken along the line Z-Z in FIG. 31 (a cross-sectional configuration of the source terminal portion). The description below is given assuming that the TFT substrate 200 is used for a transmissive liquid crystal display in the FFS mode.

As shown in FIG. 31, in the TFT substrate 200 according to the second preferred embodiment, a common electrode 5 is disposed to extend in a direction parallel to the gate wiring 17 in each pixel. As shown in FIG. 32, the common electrode 5 is formed in the same layer as, for example, the source wiring 6. In the planarization insulating film 9 that covers the common electrode 5, a common-electrode connection-portion contact hole 14 that penetrates the planarization insulating film 9 in the thickness direction is formed. The common electrodes 5 that are adjacent to each other are electrically connected by an upper-layer common-electrode connecting wiring 35 that extends from the counter slit electrode 31 through the common-electrode connection-portion contact hole 14. This configuration can reduce the electrical resistance of the common electrodes 5 for supplying the counter slit electrode 31 with a certain common potential. Thus, the substrate is applicable to a large panel. An Al alloy (for example, AlNiNd) having lower resistance may be used, in place of Mo, as the source wiring 6 located in the same layer as the common electrodes 5, so that the wiring resistance can be further reduced.

<Manufacturing Method>

With reference to FIGS. 33 to 42, a method for manufacturing the TFT substrate 200 according to the second preferred embodiment is described below. The plan view and the cross-sectional view showing the final process correspond to FIG. 31 and FIG. 32, respectively.

Firstly, on the entire upper surface of the transparent insulating substrate 1 made of, for example, glass, a semiconductor film, an insulating film, and a conductive film are formed in the stated order. The method for manufacturing these films has been described in the first preferred embodiment, and the description thereof is omitted.

Next, in the first photolithography process, patterns that later become the TFT element A and a pattern that later becomes the common electrode 5, the source wiring 6, the gate terminal 7, and the source terminal 8 are formed.

Specifically, a photoresist pattern is formed on the laminated films of the semiconductor film, the insulating film, and the conductive film in the photolithography process, and then, the Mo film located in the top layer is firstly etched to be patterned using the photoresist pattern as a mask by wet etching in which the PAN solution is used.

Next, the insulating film (SiO film) is etched to be patterned using the photoresist pattern and the patterned Mo film as a mask by dry etching in which oxygen ($O_2$) gas and a gas containing fluorine such as $CHF_3$ and $CF_4$ are used.

Subsequently, the semiconductor film (InGaZnO-based oxide semiconductor film) is etched to be patterned using the photoresist pattern, the patterned Mo film, and the patterned SiO film as a mask by wet etching in which the oxalic-acid based solution is used.

Figure 33:
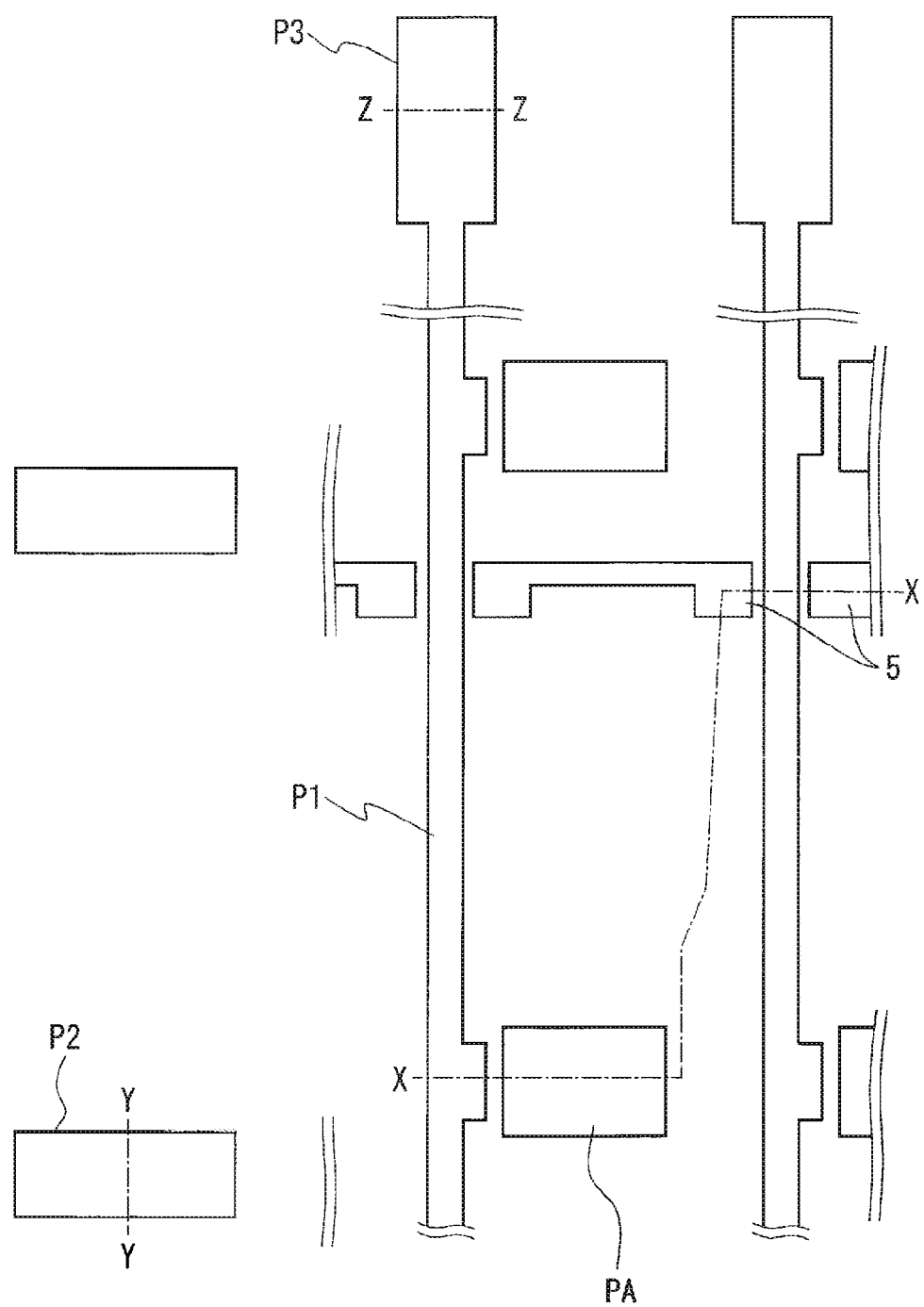
FIG. 33 is a plan view showing a method for manufacturing the TFT substrate according to the second preferred embodiment of the present invention.
Figure 34:
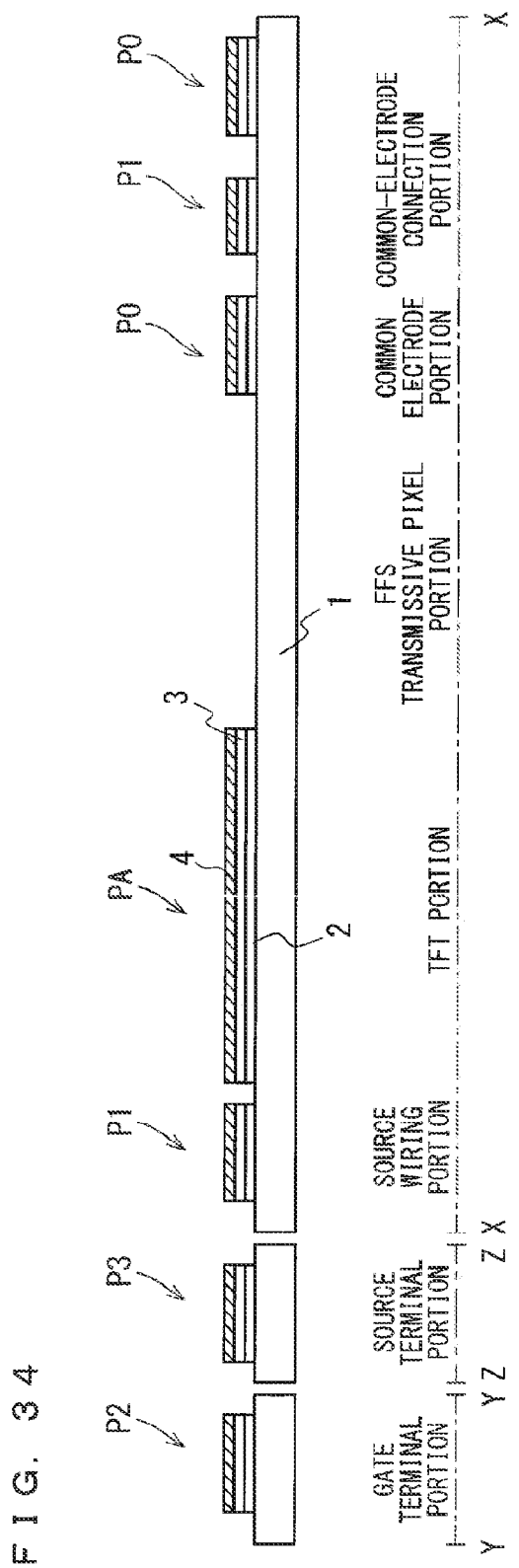
FIG. 34 is a cross-sectional view showing the method for manufacturing the TFT substrate according to the second preferred embodiment of the present invention.

After that, the photoresist pattern is removed, to thereby form, as shown in FIGS. 33 and 34, the pattern PA that later becomes the TFT element A, a pattern P0 that later becomes the common electrode 5, and the patterns P1, P2, and P3 that later become the source wiring 6, the gate terminal 7, and the source terminal 8, respectively. FIG. 33 is a plan view corresponding to FIG. 31 and FIG. 34 is a cross-sectional view corresponding to FIG. 32.

Figure 35:
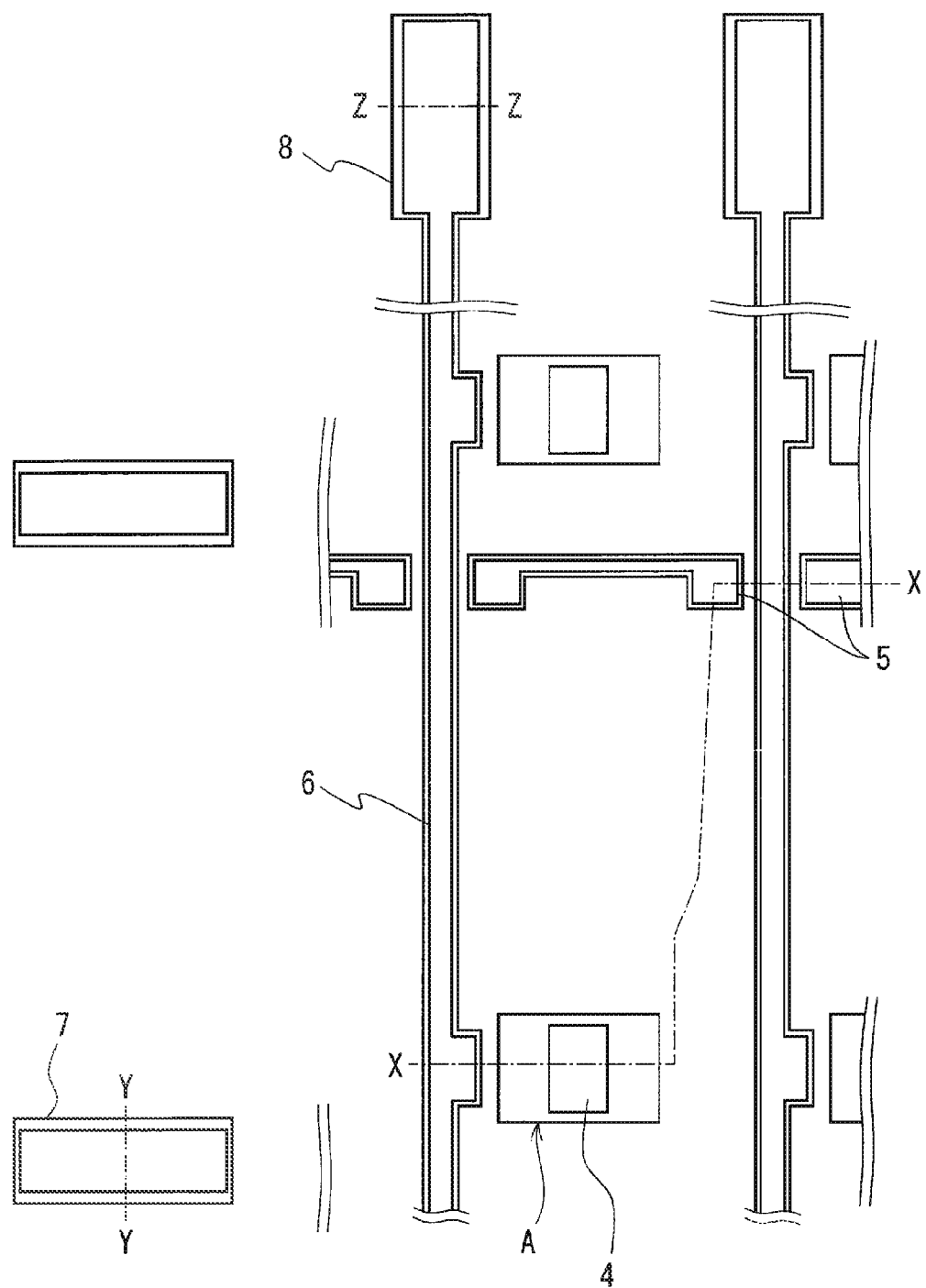
FIG. 35 is a plan view showing the method for manufacturing the TFT substrate according to the second preferred embodiment of the present invention.
Figure 36:
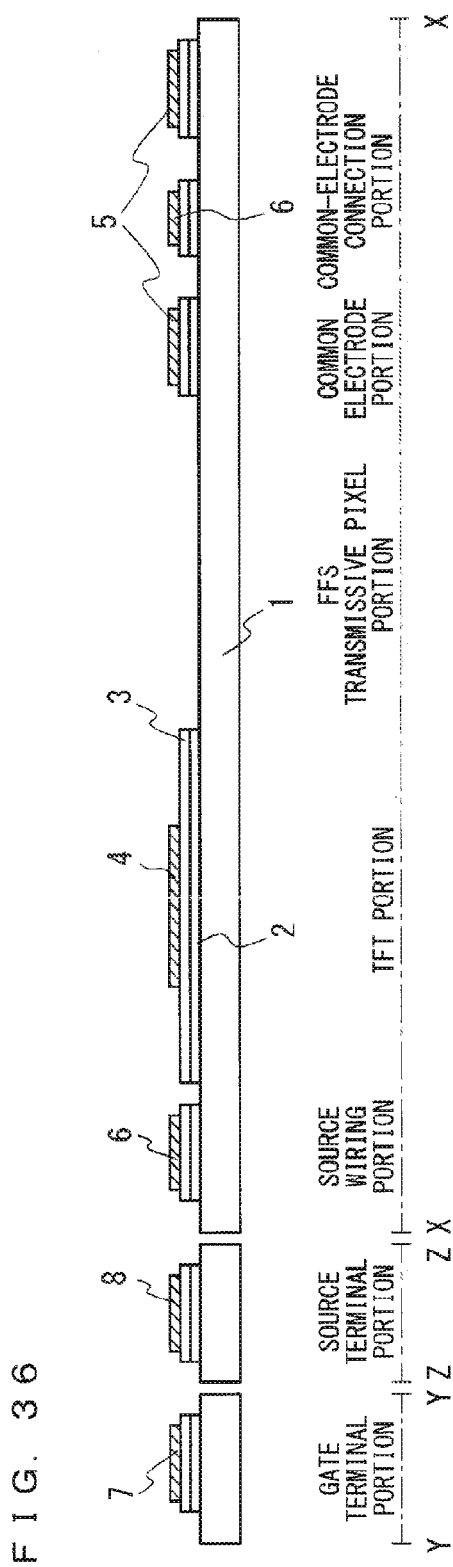
FIG. 36 is a cross-sectional view showing the method for manufacturing the TFT substrate according to the second preferred embodiment of the present invention.

Next, in the second photolithography process, a photoresist pattern is formed on the patterns PA, P0, P1, P2, and P3, and then, the Mo film is etched to be patterned using the photoresist pattern as a mask by wet etching in which the PAN solution is used. After that, the photoresist pattern is removed. Consequently, as shown in FIGS. 35 and 36, the gate electrode 4 of the TFT element A, the source wiring 6, the gate terminal 7, and the source terminal 8 are obtained. FIG. 35 is a plan view corresponding to FIG. 31 and FIG. 36 is a cross-sectional view corresponding to FIG. 32.

Next, the planarization insulating film 9 is formed to cover the entire upper surface of the transparent insulating substrate 1 including the gate electrode 4, the common electrode 5, the source wiring 6, the gate terminal 7, and the source terminal 8 formed by patterning. Then, a plurality of contact holes are formed. The method for manufacturing the planarization insulating film 9 has been described in the first preferred embodiment, and the description thereof is omitted.

Subsequently, in the third photolithography process, the planarization insulating film 9 having photosensitivity is patterned for simultaneously forming the gate-electrode-portion contact hole 10, the source-electrode-portion contact hole 11, the source-wiring-portion contact hole 12, the drain (pixel)-electrode-portion contact hole 13, the common-electrode connection-portion contact hole, the gate-terminal-portion first contact hole 15, and the source-terminal-portion first contact hole 16.

Figure 37:
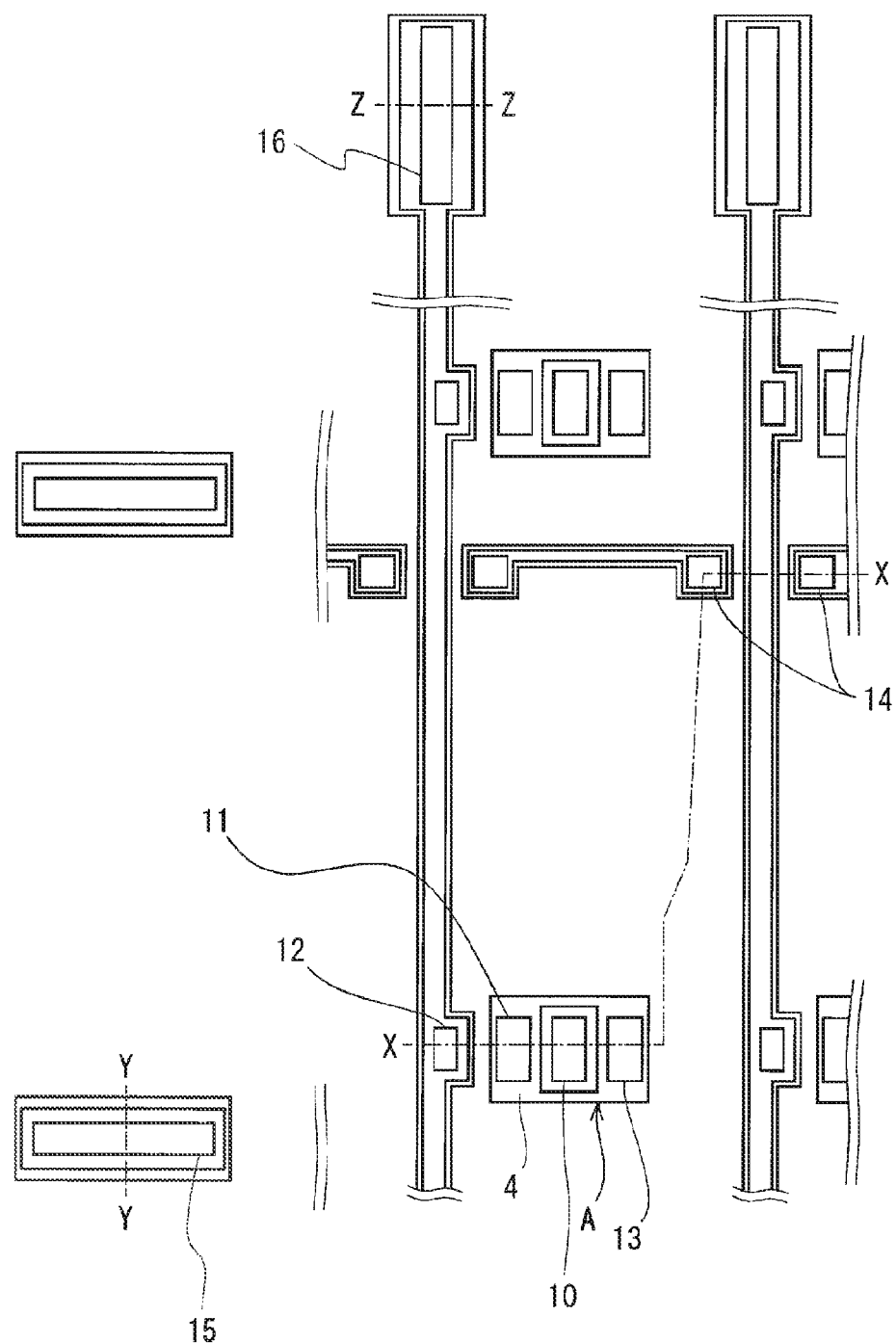
FIG. 37 is a plan view showing the method for manufacturing the TFT substrate according to the second preferred embodiment of the present invention.
Figure 38:
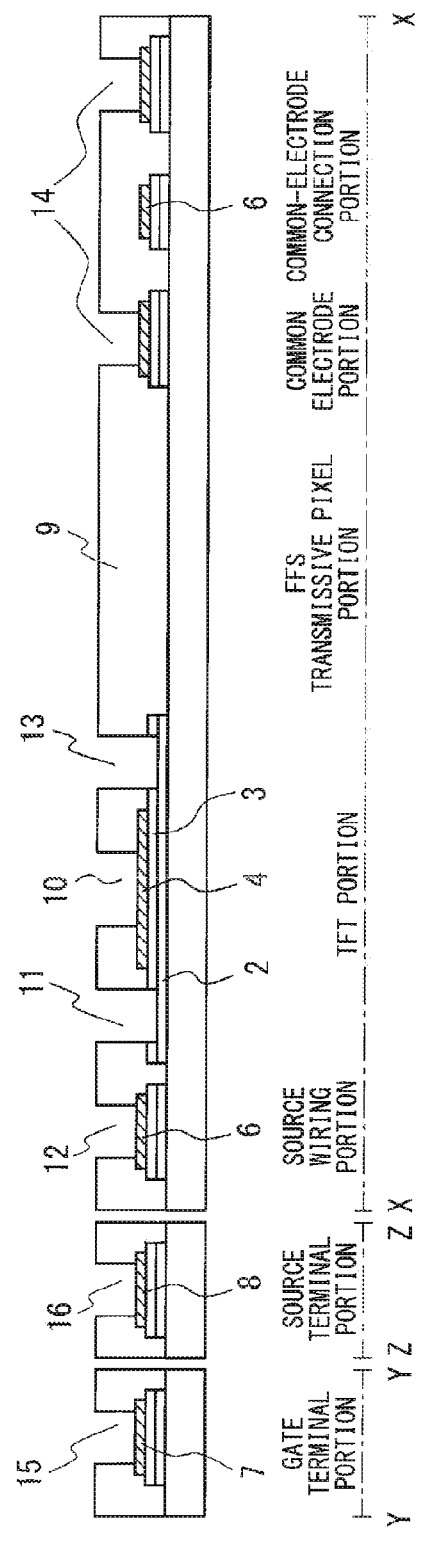
FIG. 38 is a cross-sectional view showing the method for manufacturing the TFT substrate according to the second preferred embodiment of the present invention.

At this time, the gate insulating film 3 is exposed through the bottom of the source-electrode-portion contact hole 11 and the drain (pixel)-electrode-portion contact hole 13. Then, only the exposed part of the gate insulating 3 is selectively etched using the planarization insulating film 9 as a mask, whereby the surface of the underlying semiconductor film 2 is exposed. Consequently, the source-electrode-portion contact hole 11 and the drain (pixel)-electrode-portion contact hole 13 that reach the semiconductor film 2 are completed. Thus, as shown in FIGS. 37 and 38, a plurality of contact holes that penetrate the planarization insulating film 9 in the thickness direction are obtained. The gate insulating film 3 composed of SiO can be etched by dry etching in which oxygen ($O_2$) gas and a gas containing fluorine such as $CHF_3$ and $CF_4$ are used. FIG. 37 is a plan view corresponding to FIG. 31 and FIG. 38 is a cross-sectional view corresponding to FIG. 38.

Next, a transparent conductive film is formed on the entire upper surface of the planarization insulating film 9 and a photoresist pattern is formed on the transparent conductive film in the fourth photolithography process. After that, the above-mentioned transparent conductive film is patterned using the photoresist pattern as a mask. Consequently, the gate wiring 17 connected to the gate electrode 4 through the gate-electrode-portion contact hole 10, the gate-terminal extraction electrode 23 connected to the gate terminal 7 through the gate-terminal-portion first contact hole 15, and the source-terminal extraction electrode 24 connected to the source terminal 8 through the source-terminal-portion first contact hole 16 are respectively formed.

At the same time, the source electrode 18 connected to the semiconductor film 2 through the source-electrode-portion contact hole 11 is formed. At this time, the source-electrode connecting wiring 19 is integrally formed with the source electrode 18. The source-electrode connecting wiring 19 is connected to the source wiring 6 through the source-wiring-portion contact hole 12.

Moreover, at the same time, the drain electrode 20 connected to the semiconductor film 2 through the drain (pixel)-electrode-portion contact hole 13 is also formed. At this time, the pixel electrode 21 that substantially covers the entire pixel region surrounded by two gate wirings 17 and two source wirings 6 is integrally formed with the drain electrode 20. The region of the semiconductor film 2 that is sandwiched between the source electrode 18 and the drain electrode 20 and is located below the pattern of the gate electrode 4 becomes the channel region of the TFT element A. The method for manufacturing the transparent conductive film and the method for etching the transparent conductive film have been described in the first preferred embodiment, and the description thereof is omitted.

Figure 39:
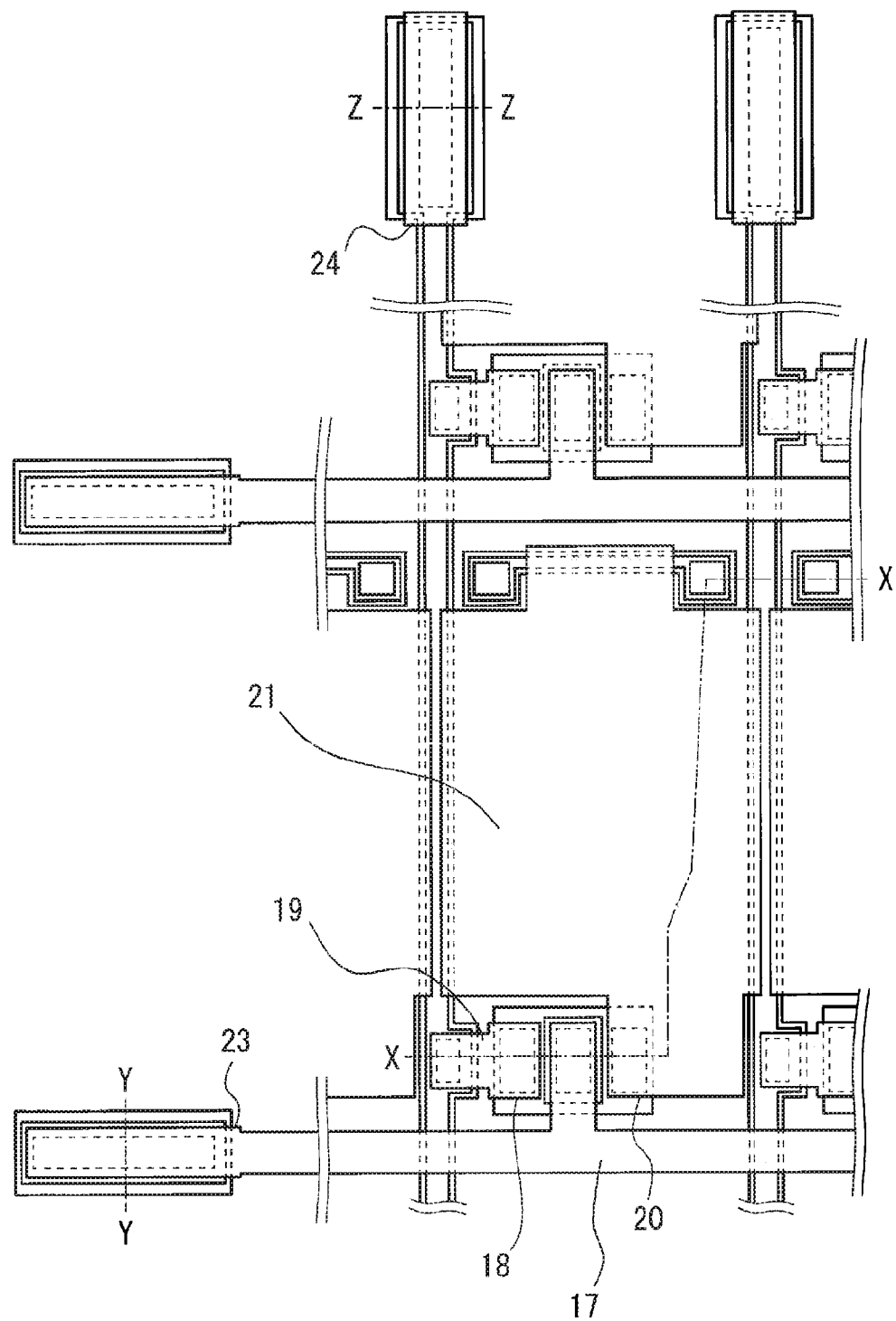
FIG. 39 is a plan view showing the method for manufacturing the TFT substrate according to the second preferred embodiment of the present invention.
Figure 40:
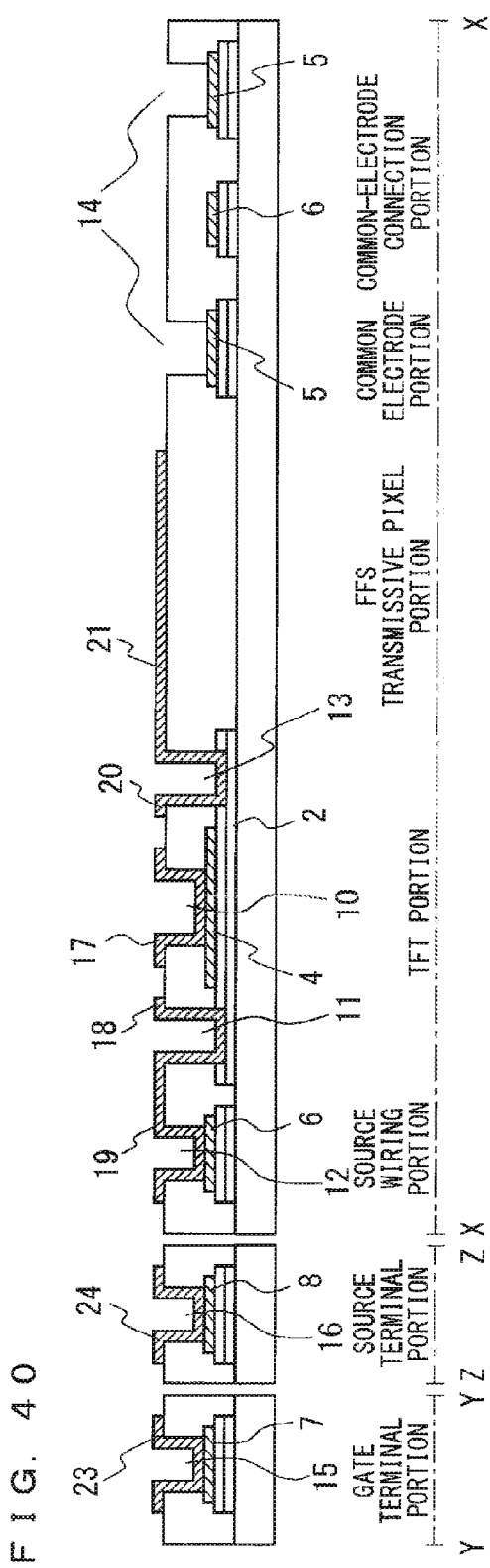
FIG. 40 is a cross-sectional view showing the method for manufacturing the TFT substrate according to the second preferred embodiment of the present invention.

Consequently, as shown in FIGS. 39 and 40, the gate wiring 17, the source electrode 18, the source-electrode connecting wiring 19, the drain electrode 20, the pixel electrode 21, the gate-terminal extraction electrode 23, and the source-terminal extraction electrode 24 are obtained. FIG. 39 is a plan view corresponding to FIG. 31 and FIG. 40 is a cross-sectional view corresponding to FIG. 32.

Next, the interlayer insulating film 25 is formed to cover the entire upper surface of the transparent insulating substrate 1. More specifically, for example, a silicon nitride (SiN) film having a thickness of 200 to 400 nm is formed as the interlayer insulating film 25 by the plasma CVD method.

Figure 41:
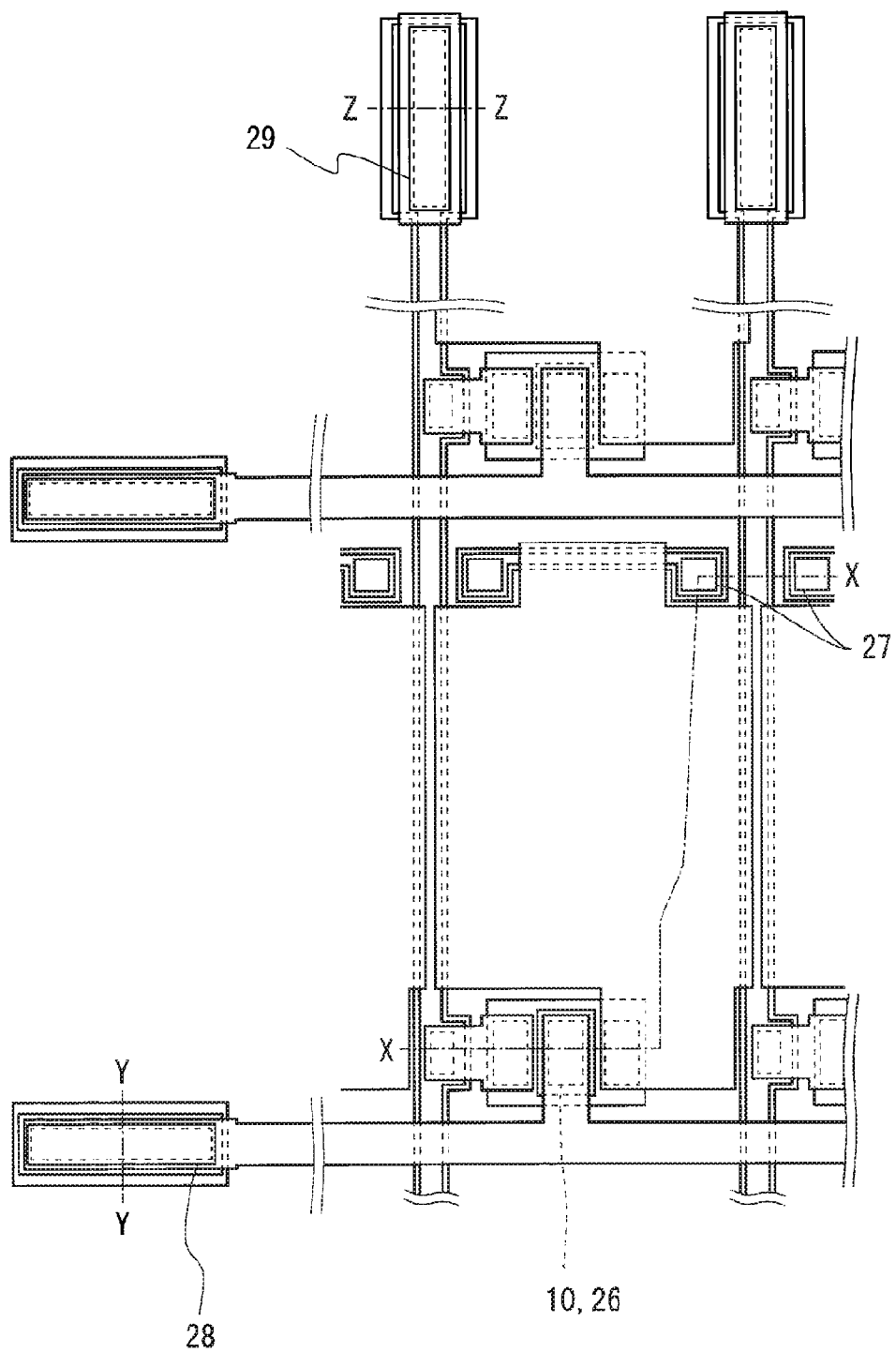
FIG. 41 is a plan view showing the method for manufacturing the TFT substrate according to the second preferred embodiment of the present invention.
Figure 42:
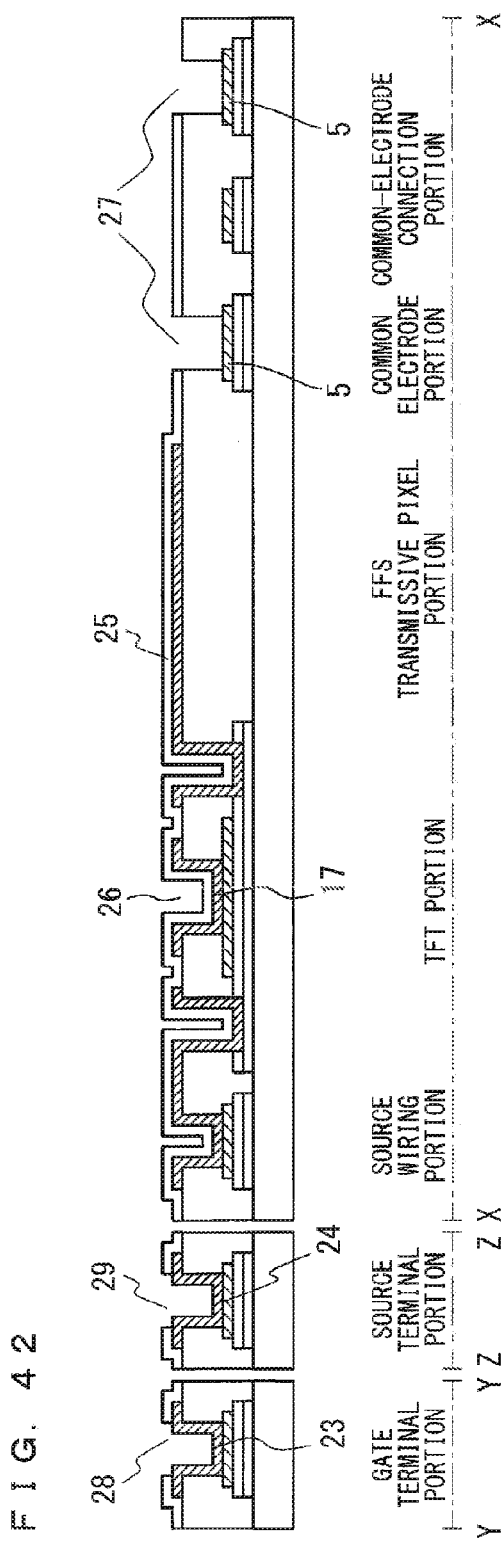
FIG. 42 is a cross-sectional view showing the method for manufacturing the TFT substrate according to the second preferred embodiment of the present invention.

Subsequently, a photoresist pattern is formed on the interlayer insulating film 25 in the fifth photolithography process. After that, the SiN film is etched using the photoresist pattern as a mask by dry etching in which $O_2$ gas and a gas containing fluorine such as $CF_4$ and $SF_6$ are used, and then, the photoresist pattern is removed. Consequently, as shown in FIGS. 41 and 42, the gate-terminal-portion second contact hole 28 that reaches the surface of the gate-terminal extraction electrode 23, the source-terminal-portion second contact hole 29 that reaches the surface of the source-terminal extraction electrode 24, a counter (common)-electrode-portion contact hole 27 that reaches the surface of the common electrode 5 are obtained. FIG. 41 is a plan view corresponding to FIG. 31 and FIG. 42 is a cross-sectional view corresponding to FIG. 32.

Next, a transparent conductive film is formed on the entire upper surface of the interlayer insulating film 25 and a photoresist pattern is formed on the transparent conductive film in the sixth photolithography process. After that, the above-mentioned transparent conductive film is patterned using the photoresist pattern as a mask. Consequently, the counter slit electrode 31 having a comb-teeth shape in which the plurality of slits SL are provided across the entire surface thereof is formed. The counter slit electrode 31 is disposed to substantially cover the entire pixel region surrounded by two gate wirings 17 and two source wirings 6 such that the counter slit electrode 31 is opposed to the pixel electrode 21 that becomes the lower electrode.

Here, the counter slit electrode 31 is formed into a pattern that is continuous to the counter slit electrodes 31 in the adjacent pixel regions astride the source wirings 6. The counter slit electrodes 31 are formed into a pattern that is continuous across the pixels in the entire image display region of the TFT substrate 200. Outside the image display region, the counter slit electrodes 31 are connected to the signal wirings (not shown) formed in the frame region.

At the same time, by using the above-mentioned conductive film, the gate terminal pad 32 and the source terminal pad 33 are formed. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25. The upper-layer common-electrode connecting wiring 35 that is connected to the common electrode 5 through the counter (common)-electrode-portion contact hole 27 is integrally formed with the counter slit electrode 31. The method for manufacturing the transparent conductive film and the method for etching the transparent conductive film have been described in the first preferred embodiment, and the description thereof is omitted.

The counter slit electrode 31 is formed of the transparent conductive film, so that the transmitted display light in the pixel region is not blocked. This prevents the aperture ratio from lowering, whereby the aperture ratio can be kept high.

As described above, the TFT substrate 200 shown in FIGS. 31 and 32 can be obtained through the six photolithography processes.

<Effects>

As described above, in the method for manufacturing the TFT substrate according to the second preferred embodiment, the common electrodes 5 are provided in the respective pixels and are electrically connected to one another by the upper-layer common-electrode connecting wiring 35. This configuration can reduce the common electrode resistance in each pixel throughout the entire image display region. Thus, the substrate is applicable to a large panel.

By applying the half-tone method described in the first modification of the first preferred embodiment, the TFT substrate 200 can also be manufactured through the five photolithography processes, allowing for a cost reduction. Therefore, a FFS-mode liquid crystal display can be manufactured with increased productivity and reduced cost.

Moreover, if the two-layer structure of the gate wirings is included as in the second modification of the first preferred embodiment, not only breakages of the gate wirings but also the gate wiring resistance can be reduced. Thus, the substrate can be easily applied to a large panel.

Furthermore, if the three-layer structure of the gate wirings is included as in the third modification of the first preferred embodiment, breakages of the gate wirings can be significantly reduced, and not only that, the gate wiring resistance can be further reduced. Thus, the substrate is applicable to a large panel.

<Modification>

As a modification of the TFT substrate 200 according to the second preferred embodiment, a configuration in which the common electrodes 5 of the respective pixels are electrically connected by the two-layer structure including a common-electrode connecting wiring 22 located in the same layer as the pixel electrode 21 and the upper-layer common-electrode connecting wiring 35 located in the same layer as the counter slit electrode 31 is described below.

Figure 43:
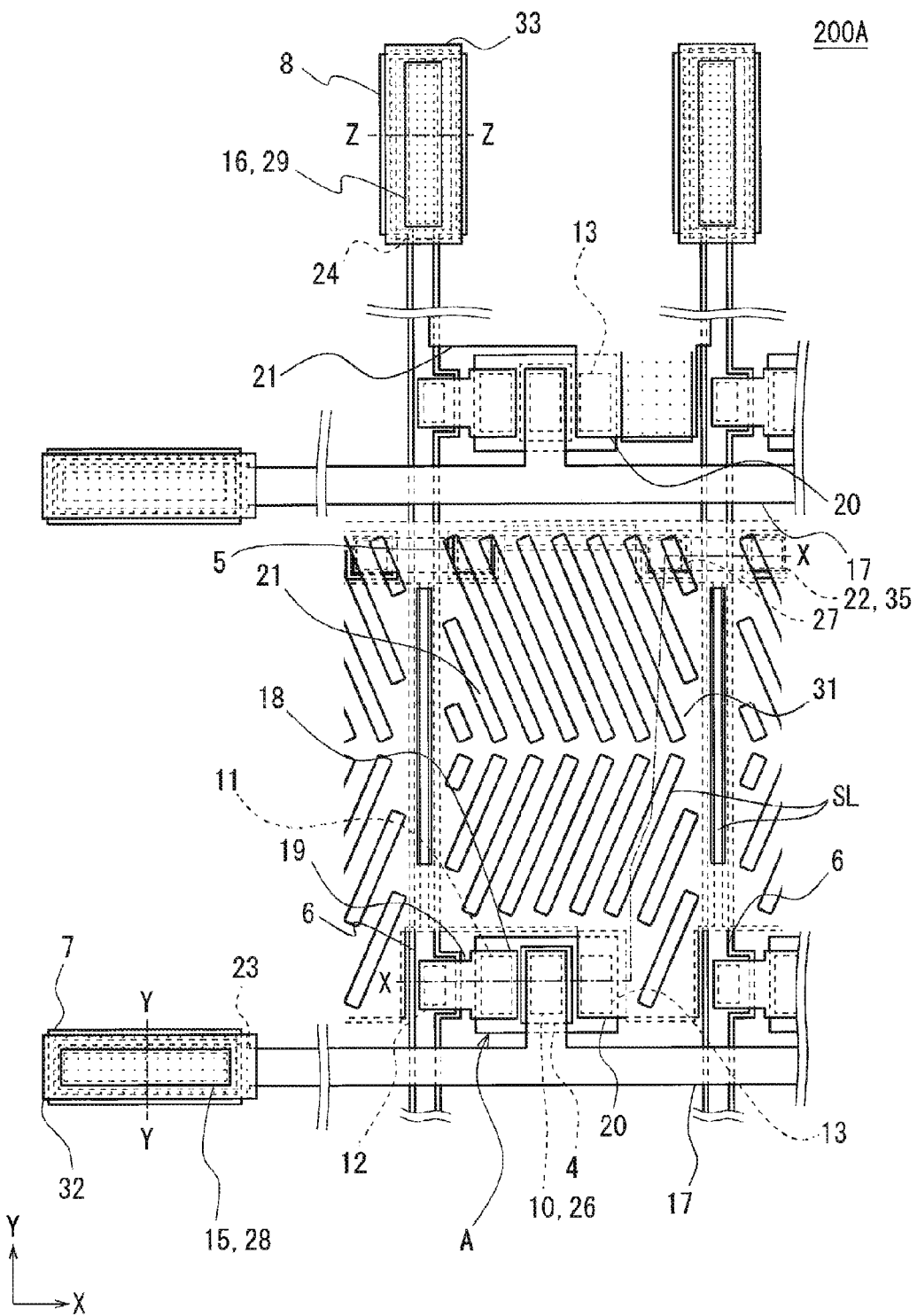
FIG. 43 is a plan view showing a configuration of the TFT substrate according to a modification of the second preferred embodiment of the present invention.
Figure 44:
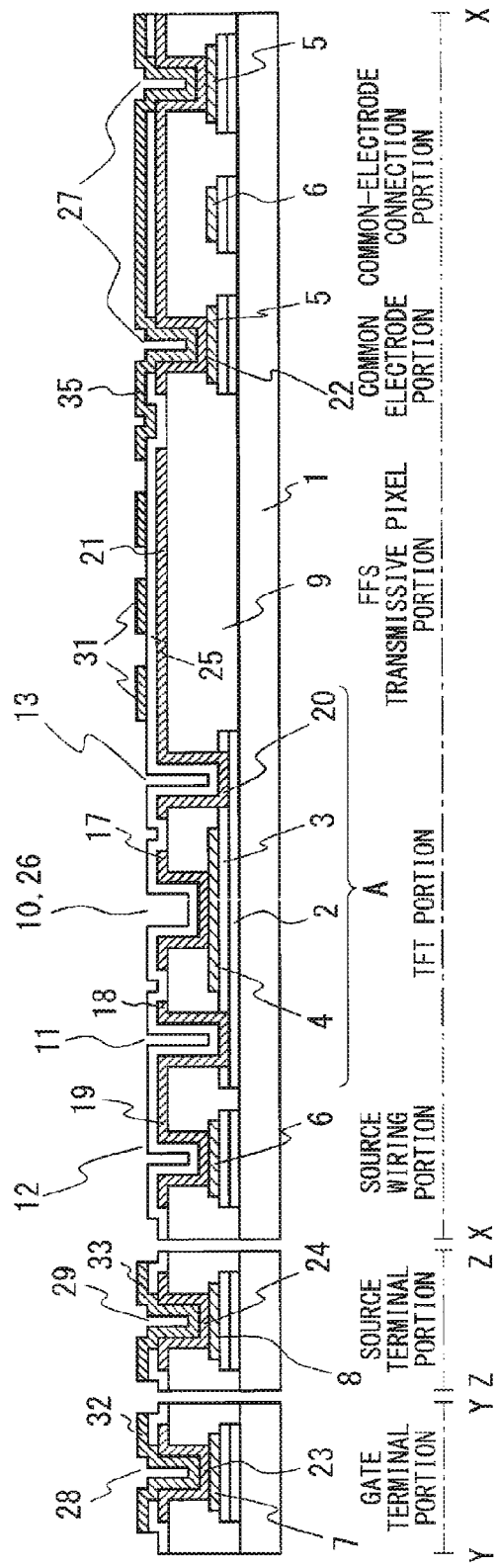
FIG. 44 is a cross-sectional view showing the configuration of the TFT substrate according to the modification of the second preferred embodiment of the present invention.

With reference to FIGS. 43 and 44, a configuration of a TFT substrate 200A according to this modification is described. FIG. 43 is a plan view showing a planar configuration of a pixel according to the modification and FIG. 44 is a cross-sectional view showing a cross-sectional configuration taken along the line X-X in FIG. 43 (cross-sectional configurations of the source wiring portion, the TFT portion, the FFS transmissive pixel portion, the common electrode portion, and the common-electrode connection portion), a cross-sectional configuration taken along the line Y-Y in FIG. 43 (a cross-sectional configuration of the gate terminal portion), and a cross-sectional configuration taken along the line Z-Z in FIG. 43 (a cross-sectional configuration of the source terminal portion). Note that constituents that are the same as those of the TFT substrate 200 described with reference to FIGS. 31 and 32 are given the same reference signs, and the overlapping description is omitted.

As shown in FIG. 43, in the TFT substrate 200A, the common electrodes 5 disposed in the respective pixels are electrically connected to one another by the wirings having the two-layer structure of the common-electrode connecting wiring 22 and the upper-layer common-electrode connecting wiring 35. As shown in FIG. 44, the common-electrode connecting wiring 22 is disposed in the same layer as the pixel electrode 21 and the upper-layer common-electrode connecting wiring 35 is disposed in the same layer as the counter slit electrode 31.

Next, a method for manufacturing the TFT substrate 200A is described. After the processes described in the second preferred embodiment with reference to FIGS. 33 to 38 are performed, a transparent conductive film is formed on the planarization insulating film 9 including the inside of the gate-electrode-portion contact hole 10, the source-electrode-portion contact hole 11, the source-wiring-portion contact hole 12, the drain (pixel)-electrode-portion contact hole 13, the common-electrode connection-portion contact hole 14, the gate-terminal-portion first contact hole 15, and the source-terminal-portion first contact hole 16.

Next, a photoresist pattern is formed on the transparent conductive film in the fourth photolithography process. After that, the above-mentioned transparent conductive film is patterned using the photoresist pattern as a mask, to thereby respectively form the gate wiring 17 connected to the gate electrode 4 through the gate-electrode-portion contact hole 10, the gate-terminal extraction electrode 23 connected to the gate terminal 7 through the gate-terminal-portion first contact hole 15, the source-terminal extraction electrode 24 connected to the source terminal 8 through the source-terminal-portion first contact hole 16, and the common-electrode connecting wiring 22 connected to the common electrode 5 through the common-electrode connection-portion contact hole 14.

At the same time, the source electrode 18 connected to the semiconductor film 2 through the source-electrode-portion contact hole 11 is formed. At this time, the source-electrode connecting wiring 19 is integrally formed with the source electrode 18. The source-electrode connecting wiring 19 is connected to the source wiring 6 through the source-wiring-portion contact hole 12.

Moreover, at the same time, the drain electrode 20 connected to the semiconductor film 2 through the drain (pixel)-electrode-portion contact hole 13 is also formed. At this time, the pixel electrode 21 that substantially covers the entire pixel region surrounded by two gate wirings 17 and two source wirings 6 is integrally formed with the drain electrode 20. The region of the semiconductor film 2 that is sandwiched between the source electrode 18 and the drain electrode 20 and is located below the pattern of the gate electrode 4 becomes the channel region of the TFT element A. The method for manufacturing the transparent conductive film and the method for etching the transparent conductive film have been described in the first preferred embodiment, and the description thereof is omitted.

Figure 45:
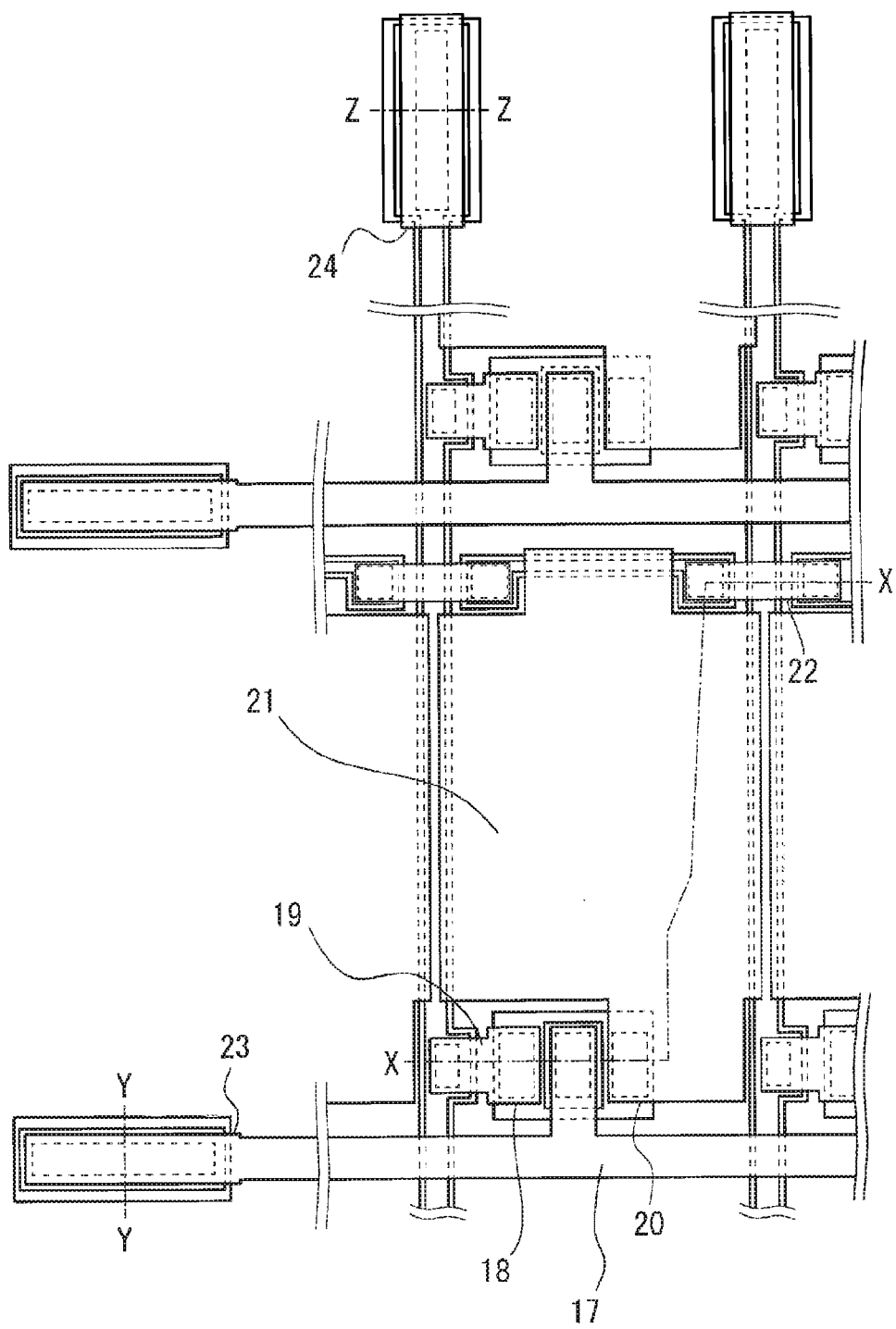
FIG. 45 is a plan view showing a method for manufacturing the TFT substrate according to the modification of the second preferred embodiment of the present invention.
Figure 46:
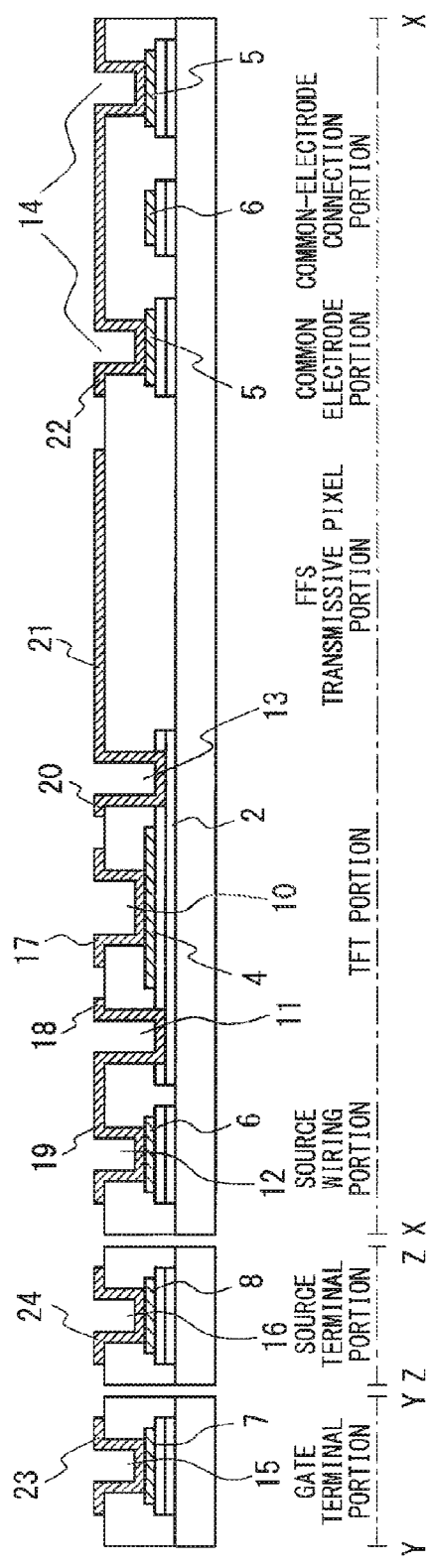
FIG. 46 is a cross-sectional view showing the method for manufacturing the TFT substrate according to the modification of the second preferred embodiment of the present invention.

Consequently, as shown in FIGS. 45 and 46, the gate wiring 17, the source electrode 18, the source-electrode connecting wiring 19, the drain electrode 20, the pixel electrode 21, the common-electrode connecting wiring 22, the gate-terminal extraction electrode 23, and the source-terminal extraction electrode 24 are obtained. FIG. 45 is a plan view corresponding to FIG. 43 and FIG. 46 is a cross-sectional view corresponding to FIG. 44.

Next, the interlayer insulating film 25 is formed to cover the entire upper surface of the transparent insulating substrate 1. More specifically, for example, a silicon nitride (SiN) film having a thickness of 200 to 400 nm is formed as the interlayer insulating film 25 by the plasma CVD method.

Figure 47:
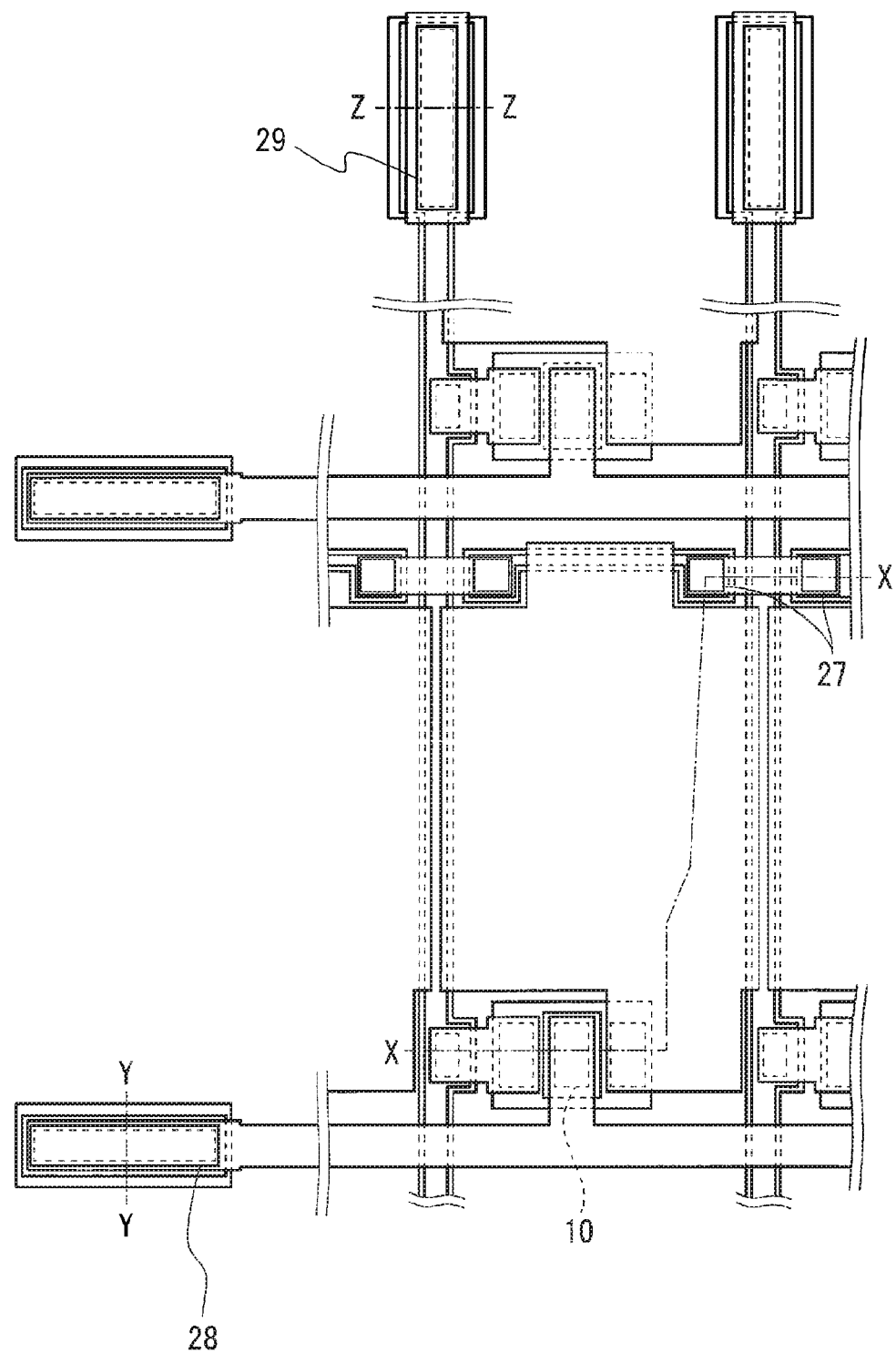
FIG. 47 is a plan view showing the method for manufacturing the TFT substrate according to the modification of the second preferred embodiment of the present invention.
Figure 48:
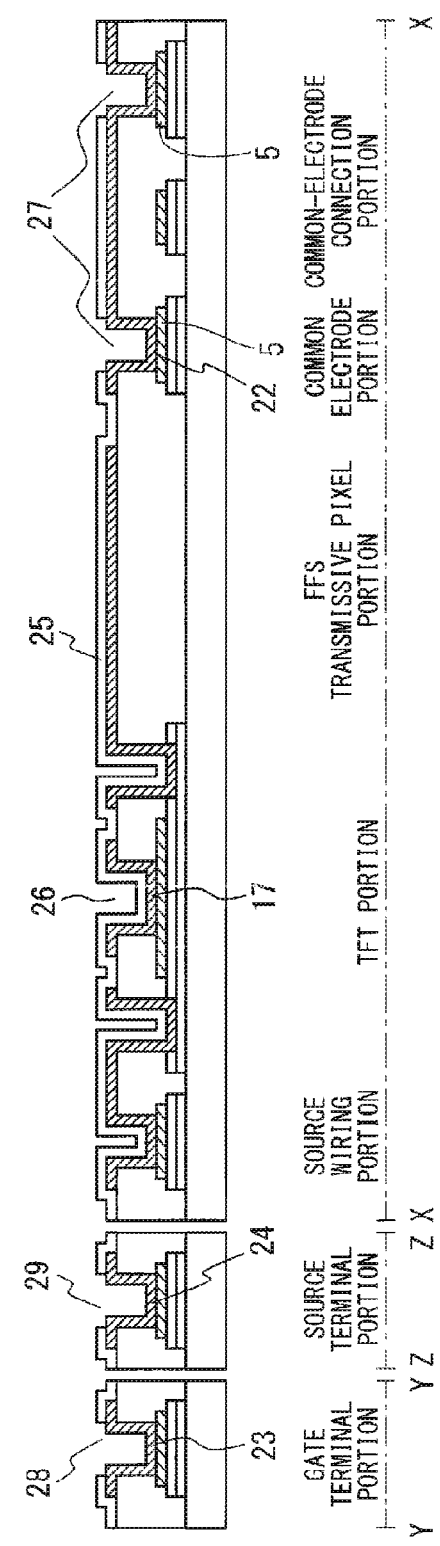
FIG. 48 is a cross-sectional view showing the method for manufacturing the TFT substrate according to the modification of the second preferred embodiment of the present invention.

Subsequently, a photoresist pattern is formed on the interlayer insulating film 25 in the fifth photolithography process. After that, the SiN film is etched using the photoresist pattern as a mask by dry etching in which $O_2$ gas and a gas containing fluorine such as $CF_4$ and $SF_6$ are used, and then, the photoresist pattern is removed. Consequently, as shown in FIGS. 47 and 48, the gate-terminal-portion second contact hole 28 that reaches the surface of the gate-terminal extraction electrode 23, the source-terminal-portion second contact hole 29 that reaches the surface of the source-terminal extraction electrode 24, and the counter (common)-electrode-portion contact hole 27 that reaches the surface of the common-electrode connecting wiring 22 on the common electrode 5 are obtained. FIG. 47 is a plan view corresponding to FIG. 43 and FIG. 48 is a cross-sectional view corresponding to FIG. 44.

Next, a transparent conductive film is formed on the entire upper surface of the interlayer insulating film 25 and a photoresist pattern is formed on the transparent conductive film in the sixth photolithography process. After that, the above-mentioned transparent conductive film is patterned using the photoresist pattern as a mask. Consequently, the counter slit electrode 31 having a comb-teeth shape in which the plurality of slits SL are provided across the entire surface thereof is formed.

At the same time, by using the above-mentioned conductive film, the gate terminal pad 32, the source terminal pad 33, and the upper-layer common-electrode connecting wiring 35 are integrally formed with the counter slit electrode 31. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25. The upper-layer common-electrode connecting wiring 35 is connected to the common-electrode connecting wiring 22 through the counter (common)-electrode-portion contact hole 27 formed through the interlayer insulating film 25. The method for manufacturing the transparent conductive film and the method for etching the transparent conductive film have been described in the first preferred embodiment, and the description thereof is omitted.

The counter slit electrode 31 is formed of the transparent conductive film, so that the transmitted display light in the pixel region is not blocked. This prevents the aperture ratio from lowering, whereby the aperture ratio can be kept high.

As described above, the TFT substrate 200A shown in FIGS. 43 and 44 can be obtained through the six photolithography processes.

The TFT substrate 200A according to the modification described above can be obtained through the six photolithography processes similarly to the manufacturing method in the second preferred embodiment. In addition, the common electrodes 5 are provided in the respective pixels and are electrically connected to one another by the upper-layer common-electrode connecting wiring 35. This configuration can reduce the common electrode resistance in each pixel throughout the entire image display region. Thus, the substrate is applicable to a large panel.

In addition to the upper-layer common-electrode connecting wiring 35, the common-electrode connecting wiring 22 is disposed, thereby providing the so-called redundant wiring structure. This can reduce breakages of the gate wirings, thereby significantly reducing failures caused by the wiring breakages.

By applying the half-tone method described in the first modification of the first preferred embodiment, the TFT substrate 200A can also be manufactured through the five photolithography processes, allowing for a cost reduction. Therefore, a FFS-mode liquid crystal display can be manufactured with increased productivity and reduced cost.

Moreover, if the gate wirings having the two-layer structure is included as in the second modification of the first preferred embodiment, not only breakages of the gate wirings but also the gate wiring resistance can be reduced. Thus, the substrate is applicable to a large panel.

Figure 49:
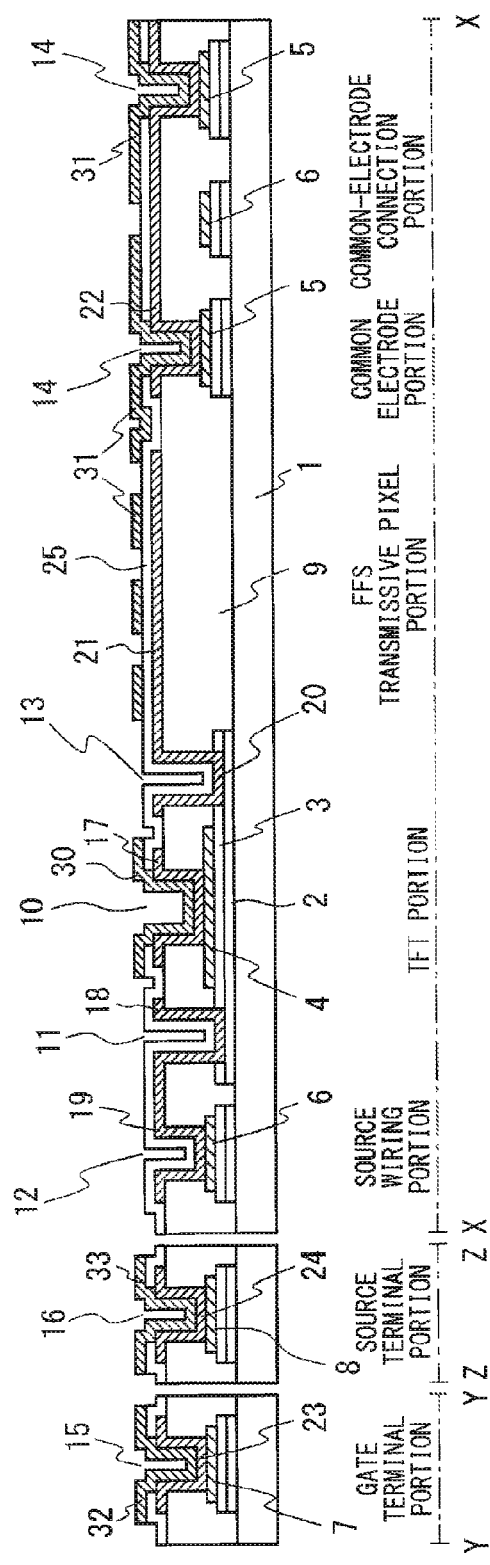
FIG. 49 is a cross-sectional view showing a configuration of the TFT substrate according to another modification of the second preferred embodiment of the present invention.

Here, FIG. 49 shows a cross-sectional configuration of a TFT substrate 200B in which the gate wirings have the two-layer structure. In FIG. 49, the configuration of the TFT substrate 200B except for the upper-layer gate wiring 30 disposed on the gate wiring 17 is the same as that the TFT substrate 200A.

Alternatively, if the gate wirings have the three-layer structure as in the third modification of the first preferred embodiment, breakages of the gate wirings can be significantly reduced, and not only that, the gate wiring resistance can be further reduced. Thus, the substrate can be easily applied to a large panel.

<Third Preferred Embodiment>
<Configuration of Pixel of TFT Substrate>

Figure 50:
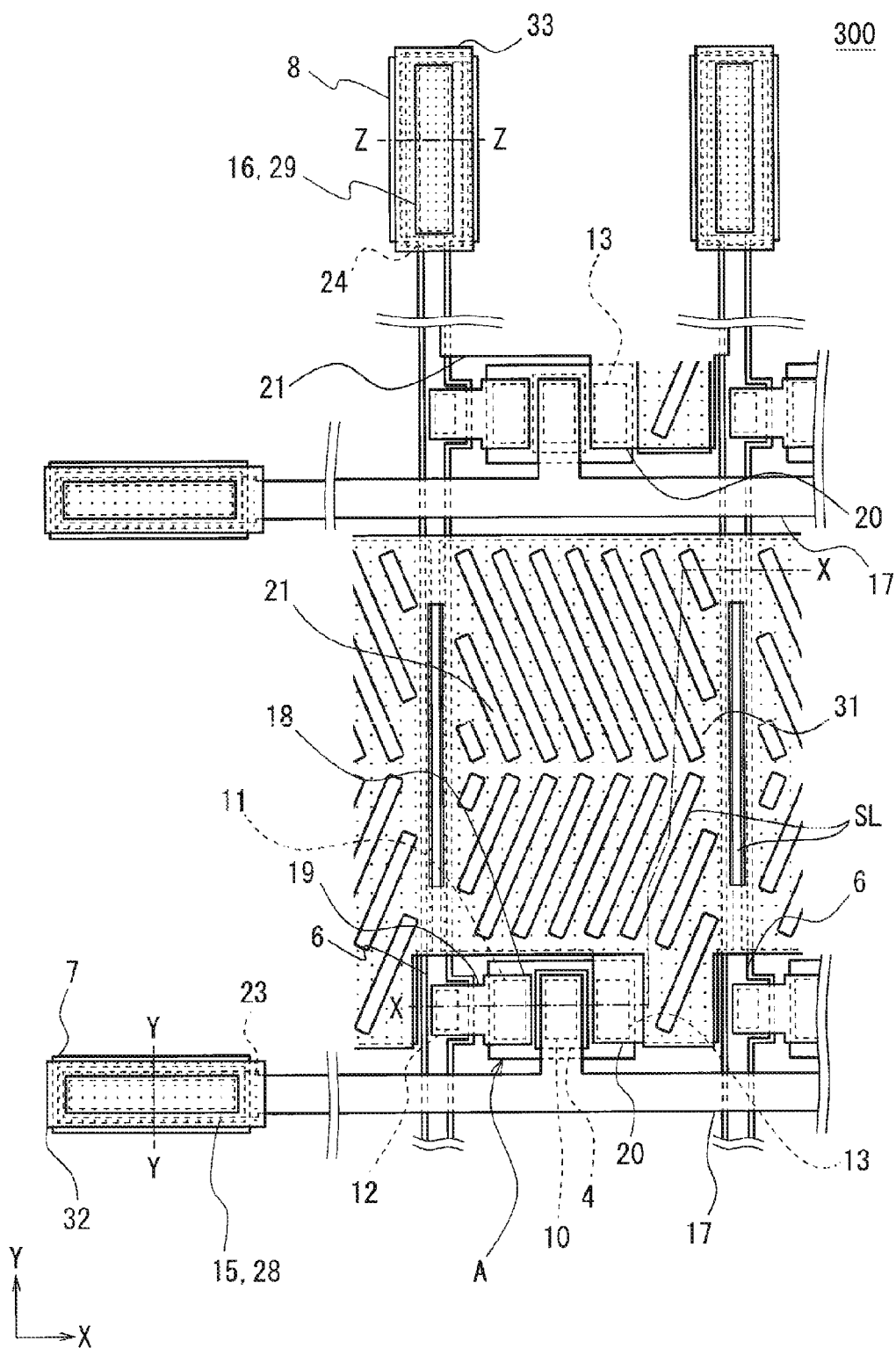
FIG. 50 is a plan view showing a configuration of the TFT substrate according to a third preferred embodiment of the present invention.
Figure 51:
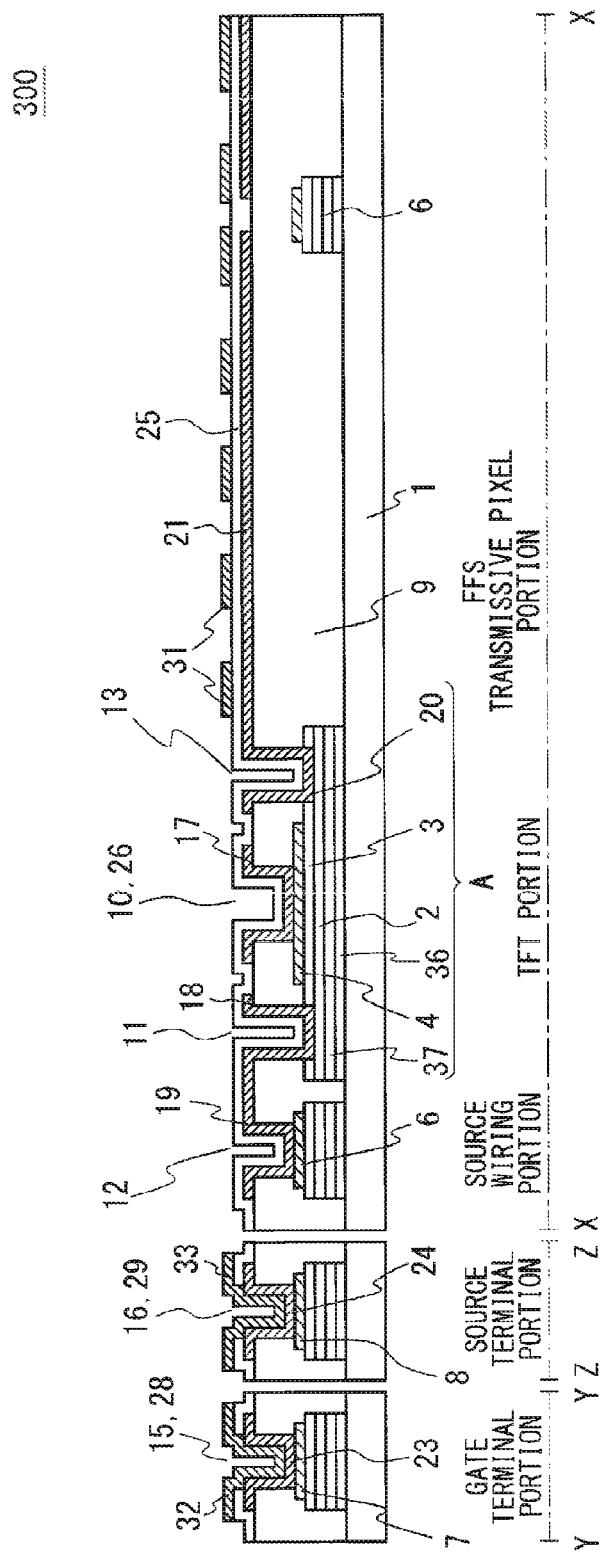
FIG. 51 is a cross-sectional view showing the configuration of the TFT substrate according to the third preferred embodiment of the present invention.

Firstly, with reference to FIGS. 50 and 51, a configuration of a TFT substrate 300 according to a third preferred embodiment is described. Note that constituents that are the same as those of the TFT substrate 100 described with reference to FIGS. 1 and 2 are given the same reference signs, and the overlapping description is omitted.

FIG. 50 is a plan view showing a planar configuration of a pixel according to the third preferred embodiment. FIG. 51 is a cross-sectional view showing a cross-sectional configuration taken along the line X-X in FIG. 50 (cross-sectional configurations of the source wiring portion, the TFT portion, and the FFS transmissive pixel portion), a cross-sectional configuration taken along the line Y-Y in FIG. 50 (a cross-sectional configuration of the gate terminal portion), and a cross-sectional configuration taken along the line Z-Z in FIG. 50 (a cross-sectional configuration of the source terminal portion). The description below is given assuming that the TFT substrate 300 is used for a transmissive liquid crystal display in the FFS mode.

As shown in FIG. 50, the planar configuration of the TFT substrate 300 according to the third preferred embodiment is the same as that of the TFT substrate 100 shown in FIG. 1 and differences are found in the cross-sectional configurations. That is, as shown in FIG. 51, the TFT element A, the source wiring 6, the gate terminal 7, and the source terminal 8 are formed on the laminated films of a metal light-shielding film 36 and an insulating film 37 that are disposed on the transparent insulating substrate 1 made of, for example, glass.

In the TFT element A, the metal light-shielding film 36, the insulating film 37, the semiconductor film 2, and the gate insulating film 3 formed thereon are formed into the island shapes, having substantially the same contour pattern. The gate electrode 4 is formed on the gate insulating film 3.

The source wiring 6, the gate terminal 7, and the source terminal 8 have the same layer structure as that of the TFT element A. That is, the source wiring 6, the gate terminal 7, and the source terminal 8 are formed on the laminated films of the metal light-shielding film 36, the insulating film 37, the semiconductor film 2 and the gate insulating film 3, thereby forming a five-layer structure.

The planarization insulating film 9 is formed to cover the patterns of the TFT element A, the source wiring 6, the gate terminal 7, and the source terminal 8 and a plurality of contact holes are formed. That is, the gate-electrode-portion contact hole 10, the source-wiring-portion contact hole 12, the gate-terminal-portion first contact hole 15, and the source-terminal-portion first contact hole 16 that penetrate the planarization insulating film 9 in the thickness direction are formed to expose the respective surfaces of the gate electrode 4, the source wiring 6, the gate terminal 7, and the source terminal 8.

Moreover, the source-electrode-portion contact hole 11 and the drain (pixel)-electrode-portion contact hole 13 that penetrate the planarization insulating film 9 and the gate insulating film 3 in the thickness direction are formed to expose the surface of the semiconductor film 2 in the TFT element A.

A conductive film is formed on the planarization insulating film 9 and the conductive film is patterned, to thereby respectively form the gate wiring 17 connected to the gate electrode 4 through the gate-electrode-portion contact hole 10, the gate-terminal extraction electrode 23 connected to the gate terminal 7 through the gate-terminal-portion first contact hole 15, the source-terminal extraction electrode 24 connected to the source terminal 8 through the source-terminal-portion first contact hole 16.

From the same conductive film formed on the planarization insulating film 9, the source electrode 18 connected to the semiconductor film 2 through the source-electrode-portion contact hole 11 is formed. The source-electrode connecting wiring 19 extending from the source electrode 18 is connected to the source wiring 6 through the source-wiring-portion contact hole 12. Similarly, the drain electrode 20 connected to the semiconductor film 2 through the drain (pixel)-electrode-portion contact hole 13 is formed and the pixel electrode 21 is formed to extend from the drain electrode 20.

The region of the semiconductor film 2 that is sandwiched between the source electrode 18 and the drain electrode 20 and is located below the pattern of the gate electrode 4 becomes the channel region of the TFT element A.

The interlayer insulating film 25 is formed to cover the entire upper surface of the substrate including the batch of the above-mentioned electrodes on the planarization insulating film 9. On the interlayer insulating film 25, the counter slit electrode 31 having a comb-teeth shape in which the plurality of slits SL are provided across the entire surface thereof is formed to be opposed to the pixel electrode 21 that has a flat plate shape and becomes the lower electrode.

The interlayer insulating film 25 has the gate-terminal-portion second contact hole 28 and the source-terminal-portion second contact hole 29 formed therein. The gate-terminal-portion second contact hole 28 penetrates the interlayer insulating film 25 in the thickness direction to reach the surface of the gate-terminal extraction electrode 23. The source-terminal-portion second contact hole 29 penetrates the interlayer insulating film 25 in the thickness direction to reach the surface of the source-terminal extraction electrode 24. The gate terminal pad 32 connected to the gate-terminal extraction electrode 23 through the gate-terminal-portion second contact hole 28 and the source terminal pad 33 connected to the source-terminal extraction electrode 24 through the source-terminal-portion second contact hole 29 are formed.

The gate terminal pad 32 and the source terminal pad 33 are formed of the same conductive film as the counter slit electrode 31 formed on the interlayer insulating film 25.

<Manufacturing Method>

With reference to FIGS. 52 to 61, a method for manufacturing the TFT substrate 300 according to the third preferred embodiment is described below. The plan view and the cross-sectional view showing the final process correspond to FIG. 50 and FIG. 51, respectively.

Firstly, on the entire upper surface of the transparent insulating substrate 1 made of, for example, glass, a metal light-shielding film, an insulating film, a semiconductor film, an insulating film, and a conductive film are formed in the stated order. In the third preferred embodiment, molybdenum (Mo) is used as the metal light-shielding film and the conductive film. An InGaZnO-based oxide semiconductor formed of indium oxide ($In_2O_3$) containing gallium oxide ($Ga_2O_3$) and zinc oxide (ZnO) is used as the semiconductor film. A silicon oxide (SiO) film is used as the insulating film and molybdenum (Mo) is used as the conductive film.

More specifically, a metal light-shielding film composed of Mo is firstly formed to have a thickness of 200 nm by the DC sputtering method using a Mo target. Subsequently, an insulating film composed of SiO is formed by the plasma CVD method using silane ($SiH_4$) gas and dinitrogen oxide ($N_2O$) gas. Moreover, a semiconductor film is formed by the DC sputtering method using an InGaZnO target [$In_2O_3 \cdot (Ga_2O_3) \cdot (ZnO)_2$] in which the atomic composition ratio of In:Ga1:Zn:O is 1:1:1:4.

When the sputtering method using argon (Ar) gas or krypton (Kr) gas that is commonly known is employed, the atomic composition ratio of oxygen is usually smaller than the stoichiometry, whereby an oxide film in an oxygen-ion deficient state (in which the composition ratio of O is less than 4 in the above example) is formed. Thus, Ar gas mixed with oxygen ($O_2$) gas is desirably used for sputtering. Here, a sputtering was performed using Ar gas containing $O_2$ gas mixed at 10% by partial pressure ratio, whereby an InGaZnO-based oxide semiconductor film was formed to have a thickness of 40 nm. The oxide semiconductor film functions as the semiconductor film 2 in the TFT element A. The In—Ga—Zn—O film immediately after formation had an amorphous structure.

Next, an insulating film composed of SiO is formed by the plasma CVD method using silane ($SiH_4$) gas and dinitrogen oxide ($N_2O$) gas. The insulating film functions as the gate insulating film 3 in the TFT element A.

Subsequently, a conductive film composed of Mo is formed to have a thickness of 200 nm by the DC sputtering method using a Mo target. At this time, Ar gas or Kr gas that is commonly known is used as a sputtering gas.

Next, in the first photolithography process, a pattern that later becomes the TFT element A and patterns that later become the source wiring 6, the gate terminal 7, and the source terminal 8 are formed.

Specifically, a photoresist pattern is formed on the laminated films of the metal light-shielding film, the insulating film, the semiconductor film, the insulating film, and the conductive film in the photolithography process, and then, the Mo film located in the top layer is etched to be patterned using the photoresist pattern as a mask by wet etching in which the PAN solution is used.

Next, the insulating film (SiO film) is etched to be patterned using the photoresist pattern and the patterned Mo film as a mask by dry etching in which oxygen ($O_2$) gas and a gas containing fluorine such as $CHF_3$ and $CF_4$ are used.

Subsequently, the semiconductor film (InGaZnO-based oxide semiconductor film) is etched to be patterned using the photoresist pattern, the patterned Mo film, and the patterned SiO film as a mask by wet etching in which the oxalic-acid based solution is used.

Moreover, the SiO film is etched to be patterned using the photoresist pattern, the patterned Mo film, the patterned SiO film, and the patterned semiconductor film as a mask by dry etching that is the same as the one described above. Furthermore, the Mo film is etched to be patterned using the photoresist pattern, the patterned Mo film, the patterned SiO film, the patterned semiconductor film, and the patterned SiO film as a mask by wet etching in which the PAN solution is used.

After that, the photoresist pattern is removed, to thereby form, as shown in FIGS. 52 and 53, the pattern PA that later becomes the TFT element A and the patterns P1, P2, and P3 that later become the source wiring 6, the gate terminal 7, and the source terminal 8, respectively. FIG. 52 is a plan view corresponding to FIG. 50 and FIG. 53 is a cross-sectional view corresponding to FIG. 51.

Figure 54:
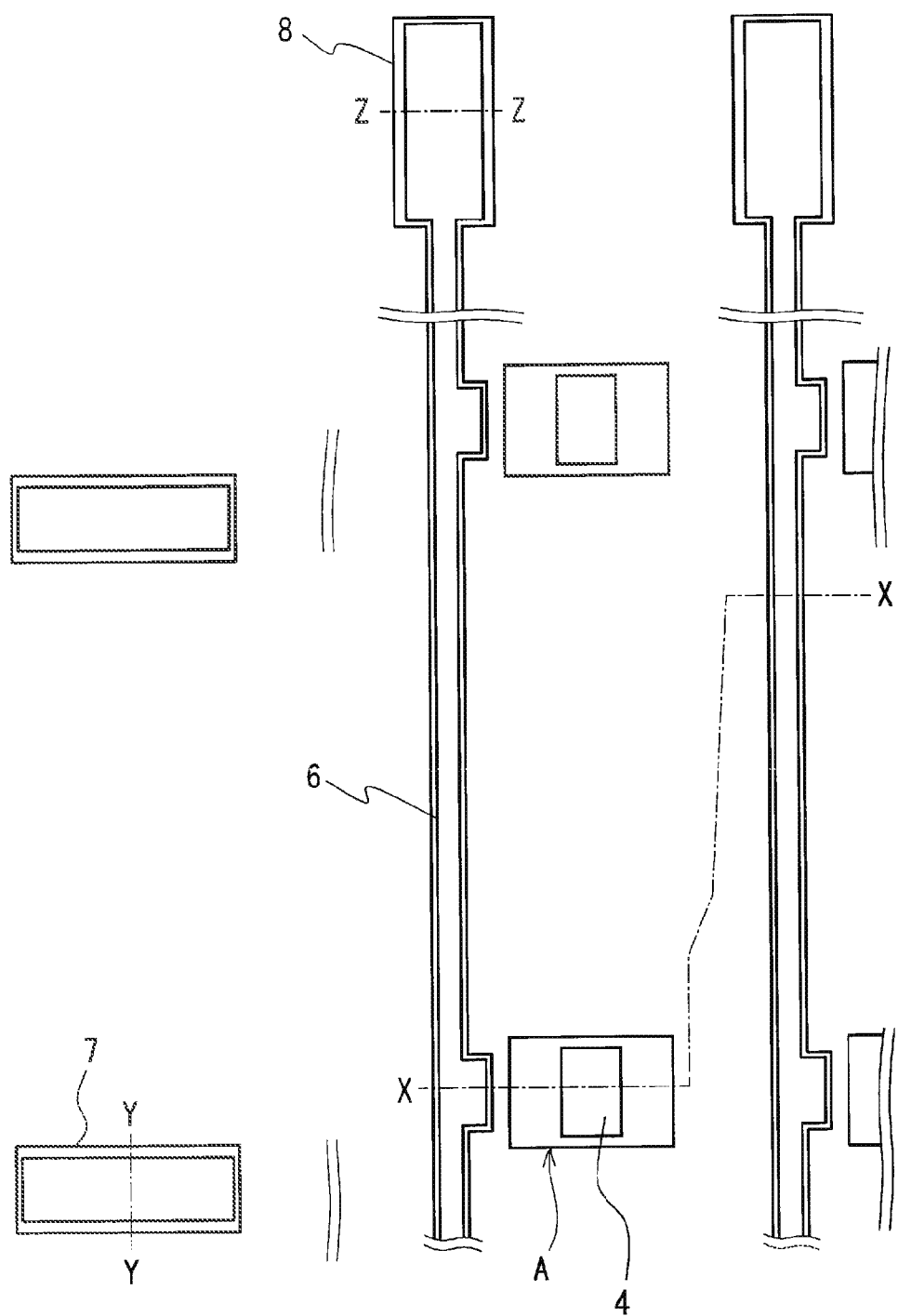
FIG. 54 is a plan view showing the method for manufacturing the TFT substrate according to the third preferred embodiment of the present invention.
Figure 55:
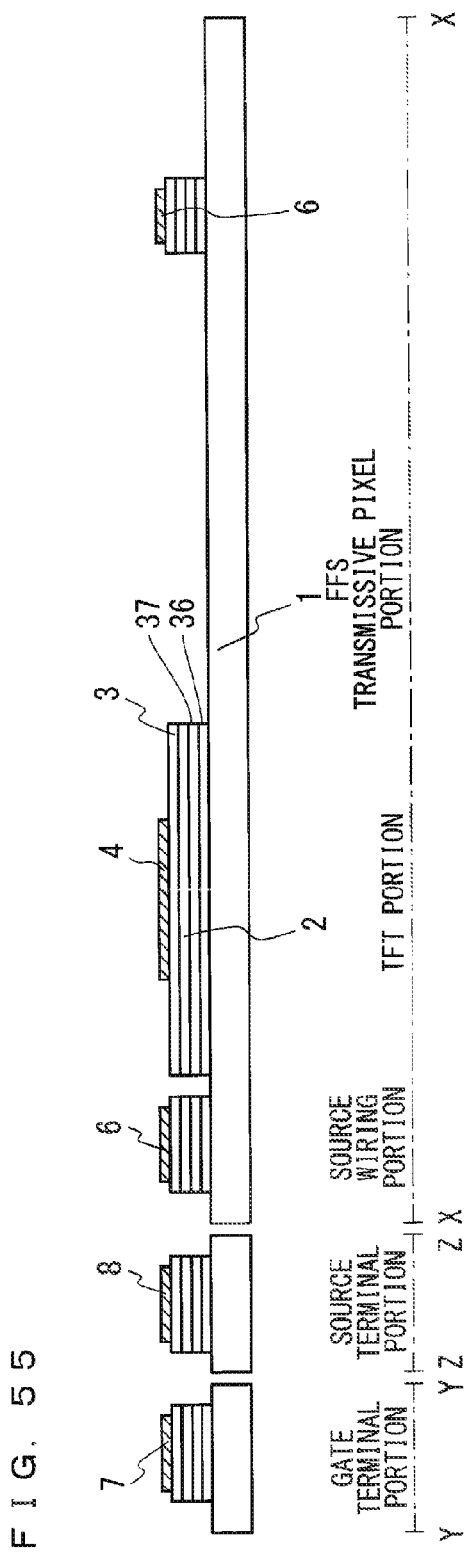
FIG. 55 is a cross-sectional view showing the method for manufacturing the TFT substrate according to the third preferred embodiment of the present invention.

Next, in the second photolithography process, a photoresist pattern is formed on the patterns PA, P1, P2, and P3, and then, the Mo film is etched to be patterned using the photoresist pattern as a mask by wet etching in which the PAN solution is used. After that, the photoresist pattern is removed. Consequently, as shown in FIGS. 54 and 55, the gate electrode 4 of the TFT element A, the source wiring 6, the gate terminal 7, and the source terminal 8 are obtained. FIG. 54 is a plan view corresponding to FIG. 50 and FIG. 55 is a cross-sectional view corresponding to FIG. 51

Next, the planarization insulating film 9 is formed to cover the entire upper surface of the transparent insulating substrate 1 including the gate electrode 4, the source wiring 6, the gate terminal 7, and the source terminal 8 formed by patterning. Then, a plurality of contact holes are formed.

More specifically, for example, an acrylic organic resin material having photosensitivity is applied onto the transparent insulating substrate 1 to have a thickness of 2.0 to 3.0 μm by spin coating. Thus, the irregularities of the upper surface of the transparent insulating substrate 1 that have been formed in the previous processes are covered, whereby the surface can be leveled.

The planarization insulating film 9 may be made of an olefin-based material, a novolac-based material, a polyimide-based material, or a siloxane-based material aside from the acrylic organic resin material. These coating-type organic insulating materials have low dielectric constants, thus being capable of keeping the wiring capacitance low. The use of such a material enables the TFT substrate to be driven at low voltage, thereby contributing to a reduction in power consumption.

Subsequently, in the third photolithography process, the planarization insulating film 9 having photosensitivity is patterned for simultaneously forming the gate-electrode-portion contact hole 10, the source-electrode-portion contact hole 11, the source-wiring-portion contact hole 12, the drain (pixel)-electrode-portion contact hole 13, the gate-terminal-portion first contact hole 15, and the source-terminal-portion first contact hole 16.

Figure 57:
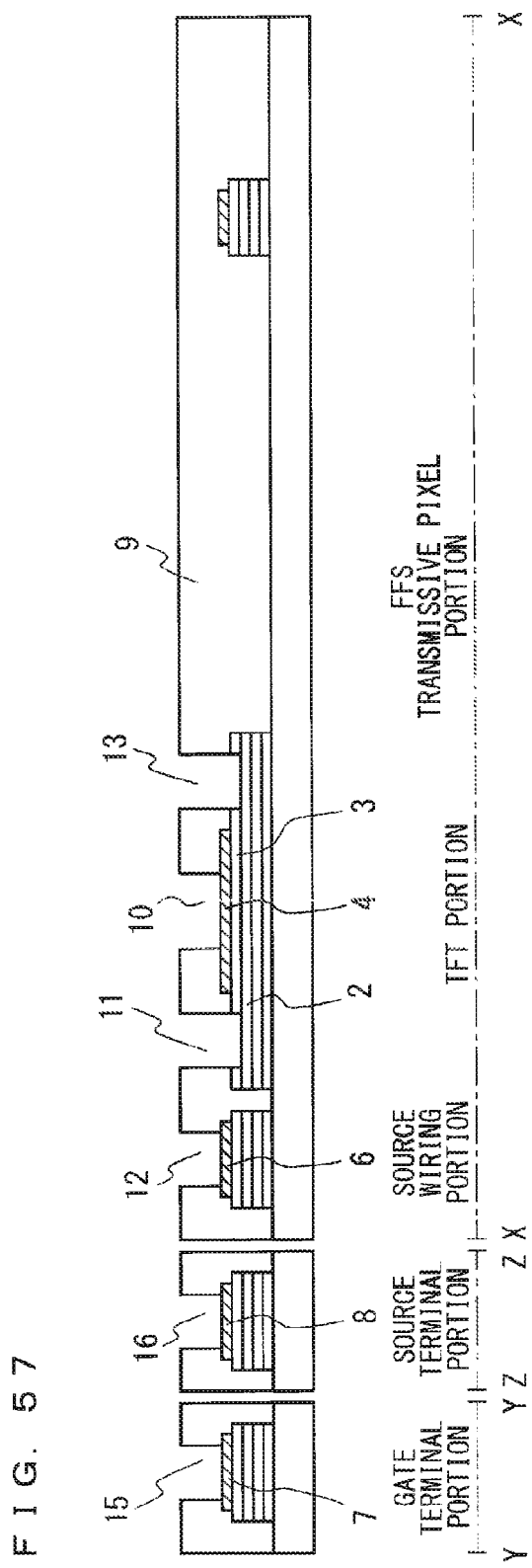
FIG. 57 is a cross-sectional view showing the method for manufacturing the TFT substrate according to the third preferred embodiment of the present invention.

At this time, the gate insulating film 3 is exposed through the bottom of the source-electrode-portion contact hole 11 and the drain (pixel)-electrode-portion contact hole 13. Then, only the exposed part of the gate insulating 3 is selectively etched using the planarization insulating film 9 as a mask, whereby the surface of the underlying semiconductor film 2 is exposed. Consequently, the source-electrode-portion contact hole 11 and the drain (pixel)-electrode-portion contact hole 13 that reach the semiconductor film 2 are completed. Thus, as shown in FIGS. 56 and 57, a plurality of contact holes that penetrate the planarization insulating film 9 in the thickness direction are obtained. The gate insulating film 3 composed of SiO can be etched by dry etching in which oxygen ($O_2$) gas and a gas containing fluorine such as $CHF_3$ and $CF_4$ are used. FIG. 56 is a plan view corresponding to FIG. 50 and FIG. 57 is a cross-sectional view corresponding to FIG. 51.

Next, a transparent conductive film is formed on the entire upper surface of the planarization insulating film 9 and a photoresist pattern is formed on the transparent conductive film in the fourth photolithography process. After that, the above-mentioned transparent conductive film is patterned using the photoresist pattern as a mask. Consequently, the gate wiring 17 connected to the gate electrode 4 through the gate-electrode-portion contact hole 10, the gate-terminal extraction electrode 23 connected to the gate terminal 7 through the gate-terminal-portion first contact hole 15, and the source-terminal extraction electrode 24 connected to the source terminal 8 through the source-terminal-portion first contact hole 16 are respectively formed.

At the same time, the source electrode 18 connected to the semiconductor film 2 through the source-electrode-portion contact hole 11 is formed. At this time, the source-electrode connecting wiring 19 is integrally formed with the source electrode 18. The source-electrode connecting wiring 19 is connected to the source wiring 6 through the source-wiring-portion contact hole 12.

Moreover, at the same time, the drain electrode 20 connected to the semiconductor film 2 through the drain (pixel)-electrode-portion contact hole 13 is also formed. At this time, the pixel electrode 21 that substantially covers the entire pixel region surrounded by two gate wirings 17 and two source wirings 6 is integrally formed with the drain electrode 20. The region of the semiconductor film 2 that is sandwiched between the source electrode 18 and the drain electrode 20 and is located below the pattern of the gate electrode 4 becomes the channel region of the TFT element A.

Figure 58:
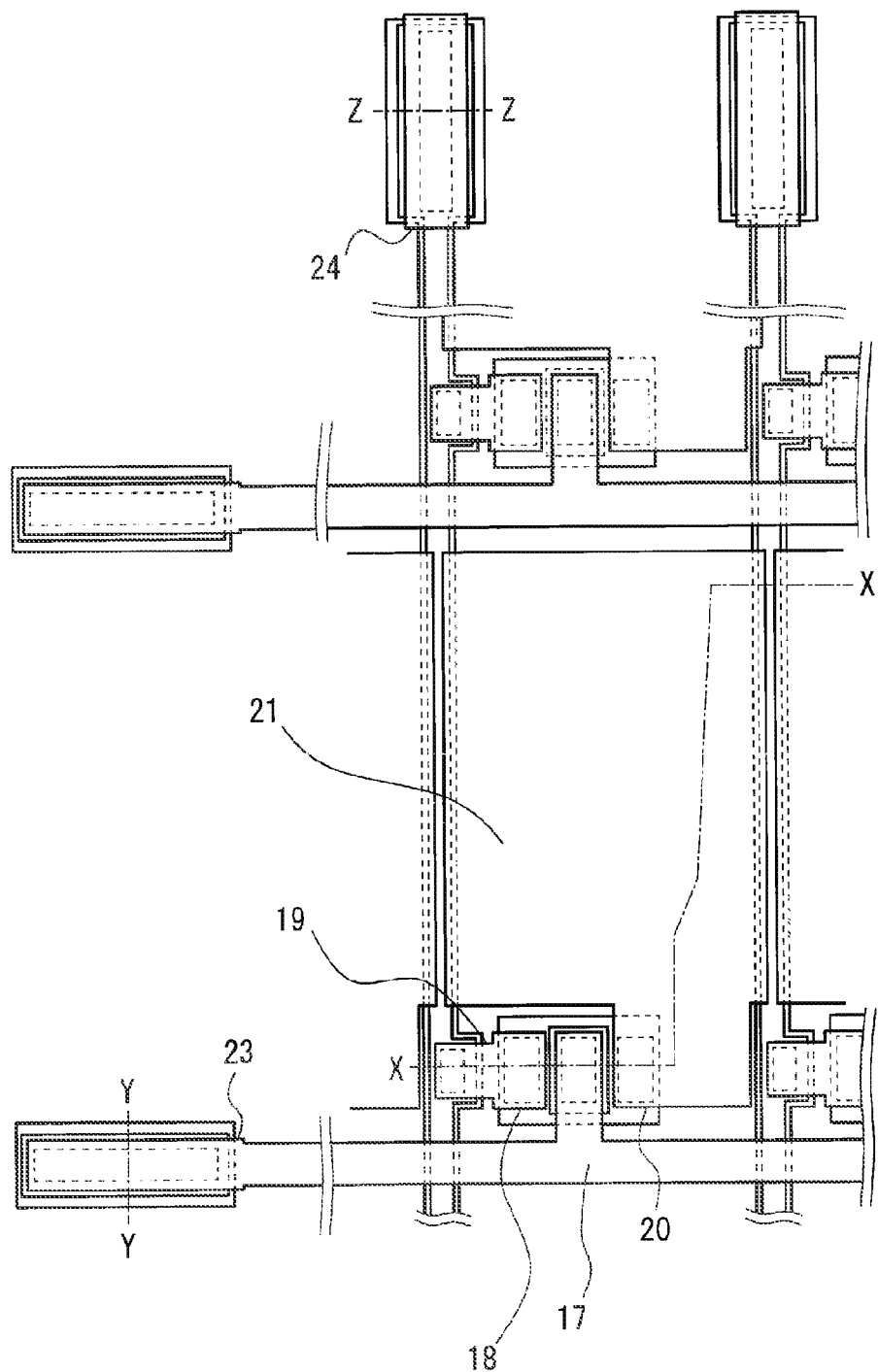
FIG. 58 is a plan view showing the method for manufacturing the TFT substrate according to the third preferred embodiment of the present invention.
Figure 59:
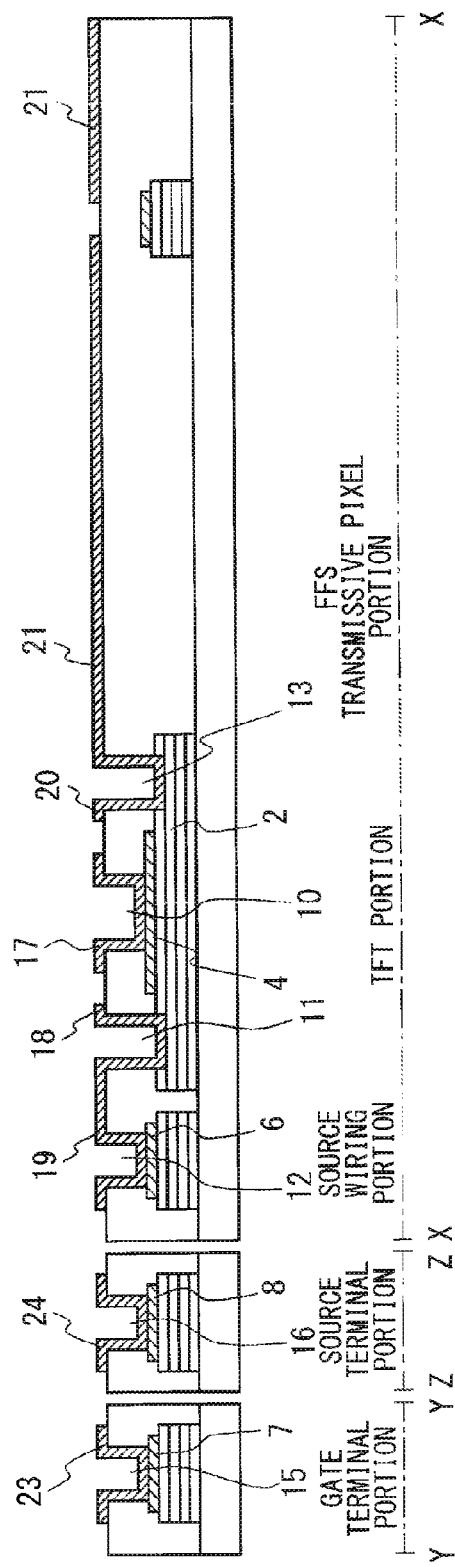
FIG. 59 is a cross-sectional view showing the method for manufacturing the TFT substrate according to the third preferred embodiment of the present invention.

More specifically, as the transparent conductive film, an InZnO film having a thickness of 100 nm is formed on the entire upper surface of the planarization insulating film 9 by the DC sputtering method in which an InZnO target containing indium oxide and zinc oxide is used. Then, the film is wet-etched with the oxalic-acid based solution using the photoresist pattern formed in the fourth photolithography process as a mask and is patterned into each of the above-mentioned electrodes and wirings. Consequently, as shown in FIGS. 58 and 59, the gate wiring 17, the source electrode 18, the source-electrode connecting wiring 19, the drain electrode 20, the pixel electrode 21, the gate-terminal extraction electrode 23, and the source-terminal extraction electrode 24 are obtained. FIG. 58 is a plan view corresponding to FIG. 50 and FIG. 59 is a cross-sectional view corresponding to FIG. 51.

Next, the interlayer insulating film 25 is formed to cover the entire upper surface of the transparent insulating substrate 1. More specifically, for example, a silicon nitride (SiN) film having a thickness of 200 to 400 nm is formed as the interlayer insulating film 25 by the plasma CVD method.

Figure 60:
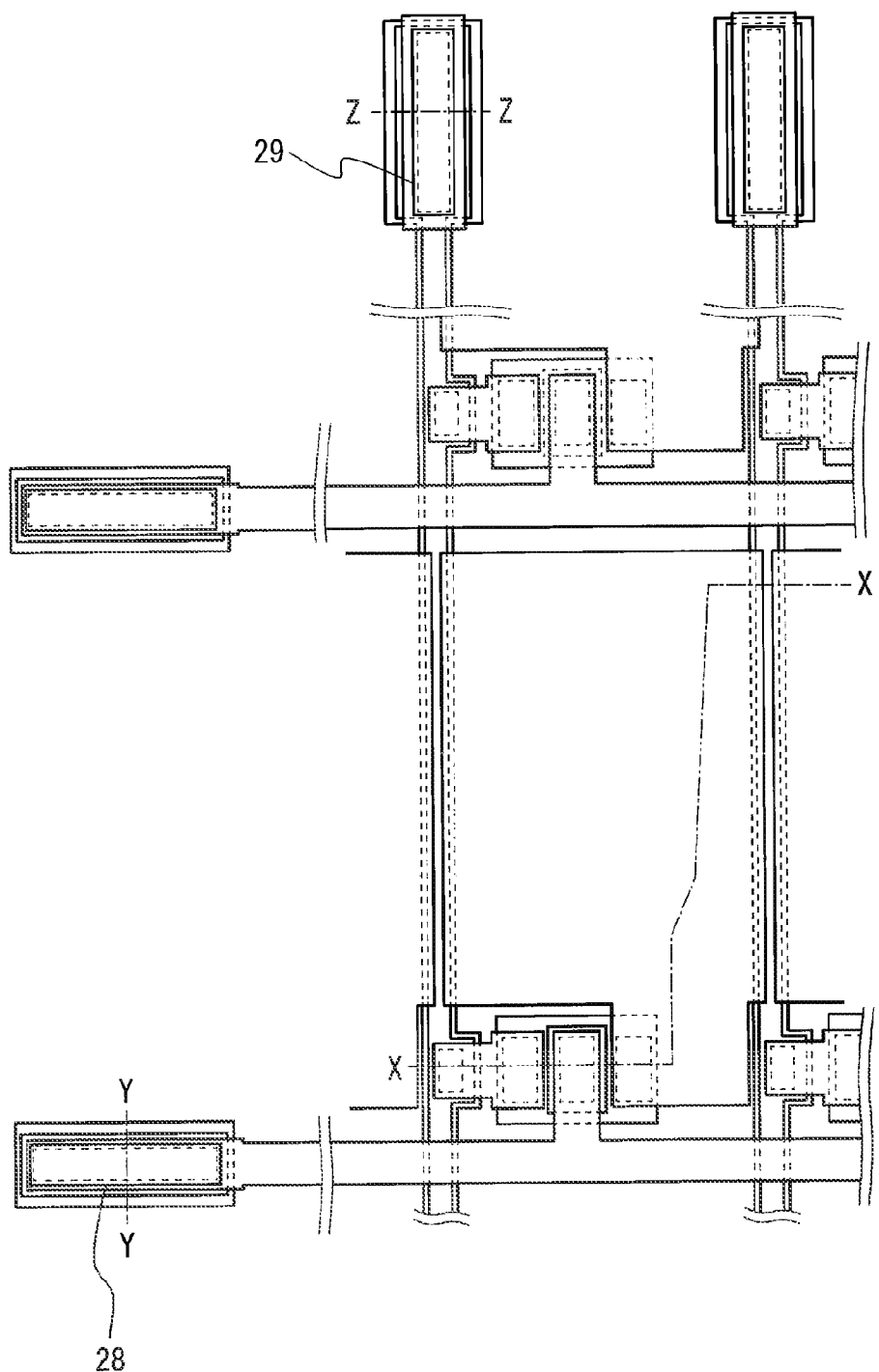
FIG. 60 is a plan view showing the method for manufacturing the TFT substrate according to the third preferred embodiment of the present invention.

Subsequently, a photoresist pattern is formed on the interlayer insulating film 25 in the fifth photolithography process. After that, the SiN film is etched using the photoresist pattern as a mask by dry etching in which $O_2$ gas and a gas containing fluorine such as $CF_4$ and $SF_6$ are used, and then, the photoresist pattern is removed. Consequently, as shown in FIGS. 60 and 61, the gate-terminal-portion second contact hole 28 that reaches the surface of the gate-terminal extraction electrode 23 and the source-terminal-portion second contact hole 29 that reaches the surface of the source-terminal extraction electrode 24 are obtained. FIG. 60 is a plan view corresponding to FIG. 50 and FIG. 61 is a cross-sectional view corresponding to FIG. 51.

Next, a transparent conductive film is formed on the entire upper surface of the interlayer insulating film 25 and a photoresist pattern is formed on the transparent conductive film in the sixth photolithography process. After that, the above-mentioned transparent conductive film is patterned using the photoresist pattern as a mask. Consequently, the counter slit electrode 31 having a comb-teeth shape in which the plurality of slits SL are provided across the entire surface thereof is formed. The counter slit electrode 31 is disposed to substantially cover the entire pixel region surrounded by two gate wirings 17 and two source wirings 6 such that the counter slit electrode 31 is opposed to the pixel electrode 21 that is formed in the layer below the counter slit electrode 31.

Here, the counter slit electrode 31 is formed into a pattern that is continuous to the counter slit electrodes 31 in the adjacent pixel regions astride the source wirings 6. The counter slit electrodes 31 are formed into a pattern that is continuous across the pixels in the entire image display region of the TFT substrate 300. Outside the image display region, the counter slit electrodes 31 are connected to the signal wirings (not shown) formed in the frame region.

At the same time, by using the above-mentioned conductive film, the gate terminal pad 32 and the source terminal pad 33 are formed. The gate terminal pad 32 is connected to the gate-terminal extraction electrode 23 through the gate-terminal-portion second contact hole 28 formed through the interlayer insulating film 25. The source terminal pad 33 is connected to the source-terminal extraction electrode 24 through the source-terminal-portion second contact hole 29 formed through the interlayer insulating film 25.

More specifically, as the transparent conductive film, an InZnO film having a thickness of 100 nm is formed on the entire upper surface of the interlayer insulating film 25 by the DC sputtering method in which an InZnO target containing indium oxide and zinc oxide is used. Then, the film is wet-etched with the oxalic-acid based solution using the photoresist pattern formed in the sixth photolithography process as a mask and is patterned into each of the above-mentioned electrodes and wirings. Consequently, the counter slit electrode 31, the gate terminal pad 32, and the source terminal pad 33 that are shown in FIGS. 50 and 51 are simultaneously obtained.

The counter slit electrode 31 is formed of the transparent conductive film, so that the transmitted display light in the pixel region is not blocked. This prevents the aperture ratio from lowering, whereby the aperture ratio can be kept high.

As described above, the TFT substrate 300 shown in FIGS. 50 and 51 can be obtained through the six photolithography processes.

On the surface of the completed TFT substrate 300, an alignment film and spacers are formed. A counter substrate including a color filter and an alignment film is prepared. Then, the TFT substrate 300 and the counter substrate are bonded together.

The TFT substrate 300 and the counter substrate are bonded together with a certain gap kept therebetween by the above-mentioned spacers. The liquid crystals are injected into the gap to be sealed therein. That is, the liquid crystal layer is sandwiched between the TFT substrate 300 and the counter substrate. On the outer surfaces of the TFT substrate 100 and the counter substrate, polarizing plates, phase difference plates, and a backlight unit are mainly disposed, thereby providing a FFS-mode liquid crystal display.

The above description has been given assuming that the oxide semiconductor composed of InGaZnO is used as the semiconductor film 2, which is not limited thereto. For example, an oxide semiconductor film based on InZnO, InGaO, InSnO, ZnSnO, InSnZnO, InGaZnSnO, InAlZnO, InHfZnO, InZrZnO, InMgZnO, InYZnO, or the like may be used.

Moreover, the above description is given assuming that the transparent conductive film composed of InZnO is used as the pixel electrode 21 and the counter slit electrode 31, which is not limited thereto. For example, an oxide-based transparent conductive film such as films based on InSnO (ITO), GaZnO, and ZnAlO may be used.

<Effects>

As described above, in the method for manufacturing the TFT substrate according to the third preferred embodiment, similarly to the first and second preferred embodiments, the TFT substrate having high mobility, high performance, and a high aperture ratio for use in a FFS-mode liquid crystal display can be manufactured through at least the six photolithography processes. In addition, the metal light-shielding film 36 is disposed in the layer below the semiconductor film 2. Therefore, in a case where amorphous silicon is used as the semiconductor film 2, the light leakage can be prevented. In a case where an oxide semiconductor is used as the semiconductor film 2, photodegradation can be prevented.

By applying the half-tone method described in the first modification of the first preferred embodiment, the TFT substrate 300 can also be manufactured through the five photolithography processes, allowing for a cost reduction. Therefore, a FFS-mode liquid crystal display can be manufactured with increased productivity and reduced cost. Moreover, if the gate wirings have the two-layer structure as in the second modification of the first preferred embodiment, not only breakages of the gate wirings but also the gate wiring resistance can be reduced. Thus, the substrate is applicable to a large panel.

Alternatively, if the gate wirings have the three-layer structure as in the third modification of the first preferred embodiment, breakages of the gate wirings can be significantly reduced, and not only that, the gate wiring resistance can be further reduced. Thus, the substrate can be easily applied to a large panel.

If the common electrodes 5 are further included in the respective pixels and are electrically connected to one another by the common-electrode connecting wiring 22 or the upper-layer common-electrode connecting wiring 35 as in the second preferred embodiment and the modification thereof, the common electrode resistance in each pixel throughout the entire image display region can be reduced. Thus, the substrate is applicable to a large panel.

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate comprising a matrix of a plurality of pixels, wherein each of said plurality of pixels includes:

a semiconductor film located on a plurality of portions of a substrate;

a thin film transistor that includes at least a gate insulating film and a gate electrode;

said gate insulating film being located on a first portion of said semiconductor film on said substrate and being formed of a first insulating film, said gate electrode being located on said gate insulating film and being formed of a first conductive film, a source wiring that is formed of said first conductive film and is formed on laminated films of said semiconductor film and said first insulating film;

a second insulating film covering said thin film transistor and said source wiring;

a source-electrode-portion contact hole and a drain-electrode-portion contact hole that penetrate said second insulating film in a thickness direction and penetrate said gate insulating film in the thickness direction to reach said first portion of said semiconductor film;

a gate-electrode-portion contact hole that penetrates said second insulating film in the thickness direction to reach said gate electrode;

a source-wiring-portion contact hole that penetrates said second insulating film in the thickness direction to reach said source wiring;

a source electrode connected to said semiconductor film through said source-electrode-portion contact hole, said source electrode being formed of a second conductive film;

a source-electrode connecting wiring that extends from said source electrode and is connected to said source wiring through said source-wiring-portion contact hole, said source-electrode connecting wiring being formed of said second conductive film;

a drain electrode connected to said semiconductor film through said drain-electrode-portion contact hole, said drain electrode being formed of said second conductive film;

a gate wiring connected to said gate electrode through said gate-electrode-portion contact hole, said gate wiring being formed of said second conductive film;

a pixel electrode that extends from said drain electrode and covers said second insulating film corresponding to a pixel region defined by said source wiring and said gate wiring, said pixel electrode being formed of said second conductive film;

a third insulating film that covers an upper surface of said substrate including said second insulating film; and a counter electrode located to be opposed to said pixel electrode via said third insulating film lying therebetween, said counter electrode being formed of a third conductive film, wherein said counter electrode has a plurality of slits provided across a surface thereof.

2. The thin film transistor substrate according to claim 1, wherein a planar pattern of said gate electrode is smaller than a planar pattern of said first portion of said semiconductor film on said substrate, said source-electrode-portion contact hole and said drain-electrode-portion contact hole are located to sandwich said gate-electrode-portion contact hole therebetween, and a region of said semiconductor film that is sandwiched between said source electrode and said drain electrode and located below said gate electrode is a channel region.

3. The thin film transistor according to claim 1, wherein each of said plurality of pixels further includes:

a gate-electrode-portion upper-layer contact hole that penetrates said third insulating film in the thickness direction to reach said gate wiring; and an upper-layer gate wiring connected to said gate wiring through said gate-electrode-portion upper-layer contact hole, said upper-layer gate wiring being formed of said third conductive film.

4. The thin film transistor substrate according to claim 1, wherein said thin film transistor substrate includes:

a gate terminal formed on laminated films of said semiconductor film and said first insulating film, said gate terminal being formed of said first conductive film;

a gate-terminal-portion first contact hole that penetrates said second insulating film in the thickness direction to reach said gate terminal;

a gate-terminal extraction electrode connected to said gate terminal through said gate-terminal-portion first contact hole, said gate-terminal extraction electrode being formed of said second conductive film;

a source terminal formed on laminated films of said semiconductor film and said first insulating film, said source terminal being formed of said first conductive film;

a source-terminal-portion first contact hole that penetrates said second insulating film in the thickness direction to reach said source terminal; and a source-terminal extraction electrode connected to said source terminal through said source-terminal-portion first contact hole, said source-terminal extraction electrode being formed of said second conductive film.

5. The thin film transistor substrate according to claim 4, wherein said thin film transistor substrate further includes:

a gate-terminal-portion second contact hole that penetrates said third insulating film in the thickness direction to reach said gate-terminal extraction electrode;

a gate terminal pad connected to said gate-terminal extraction electrode through said gate-terminal-portion second contact hole, said gate terminal pad being formed of said third conductive film;

a source-terminal-portion second contact hole that penetrates said third insulating film in the thickness direction to reach said source-terminal extraction electrode; and a source terminal pad connected to said source-terminal extraction electrode through said source-terminal-portion second contact hole, said source terminal pad being formed of said third conductive film.

6. The thin film transistor substrate according to claim 3, wherein each of said plurality of pixels further includes an uppermost-layer gate wiring connected to said upper-layer gate wiring, said uppermost-layer gate wiring being formed of a fourth conductive film.

7. The thin film transistor substrate according to claim 1, wherein each of said plurality of pixels further includes:

a common electrode formed of said semiconductor film that is located on a second portion of said substrate, said first insulating film that is located on said semiconductor film, and said first conductive film that is located on said first insulating film;

a counter-electrode-portion contact hole that penetrates said second and third insulating films on said common electrode in the thickness direction to reach said common electrode; and an upper-layer common-electrode connecting wiring connected to said common electrode through said counterelectrode-portion contact hole, said upper-layer common-electrode connecting wiring being formed of said third conductive film and being integral with said counter electrode.

8. The thin film transistor substrate according to claim 1, wherein each of said plurality of pixels further includes:
- a common electrode formed of said semiconductor film that is located on a second portion of said substrate, said first insulating film that is located on said semiconductor film, and said first conductive film that is located on said first insulating film;
- a common-electrode connection-portion contact hole that penetrates said second insulating film on said common electrode in the thickness direction to reach said common electrode;
- a common-electrode connecting wiring connected to said common electrode through said common-electrode connection-portion contact hole, said common-electrode connecting wiring being formed of said second conductive film;
- a counter-electrode-portion contact hole that penetrates said third insulating film in the thickness direction to reach said common-electrode connecting wiring; and
- an upper-layer common-electrode connecting wiring connected to said common-electrode connecting wiring through said counter-electrode-portion contact hole, said upper-layer common-electrode connecting wiring being formed of said third conductive film and being integral with said counter electrode.

9. The thin film transistor substrate according to claim 1, wherein each of said plurality of pixels further includes a metal light-shielding film and a fourth insulating film laminated on said substrate in the stated order under said semiconductor film.

10. The thin film transistor substrate according to claim 1, wherein said semiconductor film is formed of an oxide semiconductor.

11. The thin film transistor substrate according to claim 10, wherein said oxide semiconductor is formed of an InGaZnO-based oxide semiconductor containing indium oxide, gallium oxide, and zinc oxide.

* * * * *